US010334195B2

(12) United States Patent
Saeki et al.

(10) Patent No.: US 10,334,195 B2
(45) Date of Patent: Jun. 25, 2019

(54) A/D CONVERSION DEVICE, GRAY CODE GENERATION DEVICE, SIGNAL PROCESSING DEVICE, IMAGING ELEMENT, AND ELECTRONIC DEVICE

(71) Applicant: SONY CORPORATION, Tokyo (JP)

(72) Inventors: Takanori Saeki, Tokyo (JP); Tomohiro Takahashi, Tokyo (JP); Yuiti Takeda, Kanagawa (JP); Atsushi Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 125 days.

(21) Appl. No.: 15/025,378

(22) PCT Filed: Nov. 20, 2014

(86) PCT No.: PCT/JP2014/005841
§ 371 (c)(1),
(2) Date: Mar. 28, 2016

(87) PCT Pub. No.: WO2015/079663
PCT Pub. Date: Jun. 4, 2015

(65) Prior Publication Data
US 2016/0249004 A1 Aug. 25, 2016

(30) Foreign Application Priority Data

Nov. 27, 2013 (JP) .................................. 2013-244949
May 14, 2014 (JP) .................................. 2014-100185

(51) Int. Cl.
*H04N 5/3745* (2011.01)
*H03K 23/00* (2006.01)
(Continued)

(52) U.S. Cl.
CPC ....... *H04N 5/37455* (2013.01); *H03K 23/005* (2013.01); *H03L 7/08* (2013.01);
(Continued)

(58) Field of Classification Search
CPC ..... H04N 5/37455; H04N 5/378; H03M 1/12; H03M 1/123; H03M 1/56; H03L 7/08
See application file for complete search history.

(56) References Cited

U.S. PATENT DOCUMENTS 8,976,052 B2 * 3/2015 Kim ...................... H03K 23/58
341/155
2003/0085746 A1 5/2003 Tagami
(Continued)

FOREIGN PATENT DOCUMENTS

CN 102684698 A 9/2012
JP 2003-152512 A 5/2003
(Continued)

OTHER PUBLICATIONS

Takanori Saeki, Masafumi Mitsuishi, Hiroaki Iwaki, Mitsuaki Tagishi, "A 1.3-Cycle Lock Time, Non-PLL/DLL Clock Multiplier Based on Direct Clock Cycle Interpolation for 'Clock on Demand'", IEEE Journal of Solid-State Circuits, vol. 35, No. 11, Nov. 2000—10pages.
(Continued)

*Primary Examiner* — Lin Ye
*Assistant Examiner* — Chriss S Yoder, III
(74) *Attorney, Agent, or Firm* — Chip Law Group

(57) ABSTRACT

An A/D conversion device includes a phase-difference clock generation unit configured to use a plurality of phase interpolators to generate multi-phase clock signals, of which phases are shifted with respect to an input clock signal, from the input clock signal and a signal obtained by delaying the input clock signal; and an A/D conversion unit configured to perform A/D conversion on an input analog signal using the multi-phase clock signals generated by the phase-difference clock generation unit.

10 Claims, 31 Drawing Sheets

(51) Int. Cl.
*H03M 1/12* (2006.01)
*H03L 7/08* (2006.01)
*H04N 5/378* (2011.01)
*H03K 5/135* (2006.01)
*H03M 1/56* (2006.01)
*H03K 5/00* (2006.01)

(52) U.S. Cl.
CPC ............. *H03M 1/12* (2013.01); *H03M 1/123* (2013.01); *H04N 5/378* (2013.01); *H03K 5/135* (2013.01); *H03K 2005/00052* (2013.01); *H03M 1/56* (2013.01)

(56) References Cited

U.S. PATENT DOCUMENTS

2010/0225796 A1* 9/2010 Lim .................... H03M 1/0607 348/308

2011/0187907 A1* 8/2011 Takahashi ............. H01L 27/146 348/302
2012/0229319 A1* 9/2012 Takahashi ............. H03M 1/007 341/155

FOREIGN PATENT DOCUMENTS

| JP | 2008-092091 A | 4/2008 |
| JP | 2009-152682 A | 7/2009 |
| JP | 2011-234326 A | 11/2011 |

OTHER PUBLICATIONS

Office Action for JP Patent Application No. 2014-100185, dated Jan. 25, 2018, 06 pages of Office Action and 03 pages of English Translation.
Office Action for CN Patent Application No. 201480063496.5, dated Sep. 5, 2018, 08 pages of Office Action and 13 pages of English Translation.

* cited by examiner

FIG. 7

| | DELAY TIME FROM RISING EDGE TO EACH RISING EDGE OF SLCK (tPDqN) | SUBSEQUENT PHASE DIFFERENCE tPDq(N+1)−tPDqN |
|---|---|---|
| q0 | (0+tPD)/2+PI FIXED DELAY TIME | tCK/4 |
| q1 | (tPD+tCK/2)/2+PI FIXED DELAY TIME | tCK/4 |
| q2 | (tCK/2+(tCK/2+tPD))/2+PI FIXED DELAY TIME | tCK/4 |
| q3 | ((tCK/2+tPD)+tCK)/2+PI FIXED DELAY TIME | tCK/4 |

FIG. 27

| CLKA | 0 | OUT_A | 67.5 |
|---|---|---|---|
| CLKB | 45 | OUT_B | 112.5 |
| CLKC | 90 | OUT_C | 157.5 |
| CLKD | 135 | OUT_D | 202.5 |
| CLKA | 180 | OUT_E | 247.5 |
| CLKB | 225 | OUT_F | 292.5 |
| CLKC | 270 | OUT_G | 337.5 |
| CLKD | 315 | OUT_H | 382.5 |

FIG. 28A

| NODE NAME | RELATIVE VARIATION | NODE NAME | RELATIVE VARIATION |
|---|---|---|---|
| CLKA | t1 | A | (t1+t5)/2 |
| CLKB | t2 | B | (t2+t6)/2 |
| CLKC | t3 | C | (t3+t7)/2 |
| CLKD | t4 | D | (t4+t8)/2 |
| $\overline{CLKA}$ | t5 | E | (t5+t1)/2 |
| $\overline{CLKB}$ | t6 | F | (t6+t2)/2 |
| $\overline{CLKC}$ | t7 | G | (t7+t3)/2 |
| $\overline{CLKD}$ | t8 | H | (t8+t4)/2 |

FIG. 28B

| NODE NAME | RELATIVE VARIATION | NODE NAME | RELATIVE VARIATION |
|---|---|---|---|
| I | (t1+t5+t7+t3)/4 | OUT_A | (t1+t2+t3+t4+t5+t6+t7+t8)/8 |
| J | (t2+t6+t8+t4)/4 | OUT_B | (t1+t2+t3+t4+t5+t6+t7+t8)/8 |
| K | (t3+t7+t5+t1)/4 | OUT_C | (t1+t2+t3+t4+t5+t6+t7+t8)/8 |
| L | (t4+t8+t6+t2)/4 | OUT_D | (t1+t2+t3+t4+t5+t6+t7+t8)/8 |
| M | (t5+t1+t7+t3)/4 | OUT_E | (t1+t2+t3+t4+t5+t6+t7+t8)/8 |
| N | (t6+t2+t8+t4)/4 | OUT_F | (t1+t2+t3+t4+t5+t6+t7+t8)/8 |
| O | (t7+t3+t1+t5)/4 | OUT_G | (t1+t2+t3+t4+t5+t6+t7+t8)/8 |
| P | (t8+t4+t2+t6)/4 | OUT_H | (t1+t2+t3+t4+t5+t6+t7+t8)/8 |

A/D CONVERSION DEVICE, GRAY CODE GENERATION DEVICE, SIGNAL PROCESSING DEVICE, IMAGING ELEMENT, AND ELECTRONIC DEVICE

CROSS REFERENCE TO RELATED APPLICATIONS

This application claims the benefit of Japanese Priority Patent Application JP 2013-244949 filed Nov. 27, 2013, and Japanese Priority Patent Application JP 2014-100185 filed May 14, 2014, the entire contents of each of which are incorporated herein by reference.

TECHNICAL FIELD

The present technology relates to an A/D conversion device, a gray code generation device, a signal processing device, an imaging element, and an electronic device, and more particularly, to an A/D conversion device, a gray code generation device, a signal processing device, an imaging element, and an electronic device configured to achieve high speed, high resolution, or both thereof more easily.

BACKGROUND ART

In the past, in imaging elements, methods of using gray code counters in A/D conversion of pixel signals obtained in pixel arrays have been suggested (for example, see PTL 1). A solid-state imaging element disclosed in PTL 1 is configured such that a reference clock is distributed from a PLL (Phase Locked Loop) to a gray code counter and a gray code is distributed from the gray code counter to an A/D converter of each column.

CITATION LIST

Patent Literature

[PTL 1]
Japanese Unexamined Patent Application Publication No. 2011-234326

SUMMARY

Technical Problem

In the configuration disclosed in PTL 1, however, the frequency of the reference clock distributed to all of the A/D converters is the highest in a chip. Thus, in order to achieve high speed or high resolution, the frequency of the reference clock has to be increased. However, since the reference clock has to be distributed to all of the columns, the increase in the frequency is not easy. Therefore, it is difficult to achieve the high speed or the high resolution.

The present technology is devised in view of such circumstances and it is desirable to achieve high speed, high resolution, or both thereof more easily.

Solution to Problem

According to an embodiment of the present technology, there is provided an A/D conversion device including: a phase-difference clock generation unit configured to use a plurality of phase interpolators to generate multi-phase clock signals, of which phases are shifted with respect to an input clock signal, from the clock signal and a signal obtained by delaying the clock signal; and an A/D conversion unit configured to perform A/D conversion on an input analog signal using the multi-phase clock signals generated by the phase-difference clock generation unit.

The phase-difference clock generation unit may include one delay circuit and four phase interpolators and generates 4-phase clock signals from the input clock signal.

The phase interpolator may output an output signal at a timing delayed by a delay time of the phase interpolator from an intermediate timing of a phase difference of two input signals.

The A/D conversion unit may include a counter configured to count the number of periods of the clock signal and output a count value as a high-order bit, a comparison unit configured to compare a reference voltage of a ramp waveform and an input voltage, and a time quantization unit configured to acquire phase information by simultaneously latching the multi-phase clock signals generated by the phase-difference clock generation unit using an inversion of an output of the comparison unit as a trigger, decode values of the phase information, and output obtained digital values as low-order bits with higher resolution than a period of the clock signal.

According to an embodiment of the present technology, there is provided an imaging element including: a pixel array configured such that unit pixels that each include a photoelectric conversion element photoelectrically converting incident light are arranged; a phase-difference clock generation unit configured to use a plurality of phase interpolators to generate multi-phase clock signals, of which phases are shifted with respect to an input clock signal, from the clock signal and a signal obtained by delaying the clock signal; and an A/D conversion unit configured to perform A/D conversion on an analog signal output from the unit pixel of the pixel array using the multi-phase clock signals generated by the phase-difference clock generation unit.

The A/D conversion unit may be installed at each column or partial region of the unit pixels of the pixel array and may perform the A/D conversion on an analog signal output from the unit pixel of the column or the partial region corresponding to the A/D conversion unit, using the multi-phase clock signal generated by the phase-difference clock generation unit.

The phase-difference clock generation unit may be installed at intervals of a predetermined number of columns or partial regions. The A/D conversion unit may perform the A/D conversion using the multi-phase clock signal generated by the phase-difference clock generation unit corresponding to the column or the partial region corresponding to the A/D conversion unit.

According to an embodiment of the present technology, there is provided an electronic device including: an imaging unit configured to image a subject; and an image processing unit configured to perform image processing on image data obtained through the imaging by the imaging unit. The imaging unit includes a pixel array in which unit pixels that each include a photoelectric conversion element photoelectrically converting incident light are arranged, a phase-difference clock generation unit configured to use a plurality of phase interpolators to generate multi-phase clock signals, of which phases are shifted with respect to an input clock signal, from the clock signal and a signal obtained by delaying the clock signal, and an A/D conversion unit configured to perform A/D conversion on an analog signal output from the unit pixel of the pixel array using the multi-phase clock signals generated by the phase-difference clock generation unit.

According to another embodiment of the present technology, there is provided a gray code generation device including: a phase-difference clock generation unit configured to use a plurality of phase interpolators to generate multi-phase clock signals, of which phases are shifted with respect to an input clock signal, from the clock signal and a signal obtained by delaying the clock signal; and a gray code generation unit configured to use a plurality of phase interpolators and logic gates to generate gray codes from the multi-phase clock signals generated by the phase-difference clock generation unit.

The gray code generation unit may include a first gray code generation unit configured to generate a high-order gray code from one of the multi-phase clock signals generated by the phase-difference clock generation unit, and a second gray code generation unit configured to generate a low-order gray code from remainder of the multi-phase clock signals generated by the phase-difference clock generation unit.

According to another embodiment of the present technology, there is provided an A/D conversion device including: a phase-difference clock generation unit configured to use a plurality of phase interpolators to generate multi-phase clock signals, of which phases are shifted wish respect to an input clock signal, from the clock signal and a signal obtained by delaying the clock signal; a gray code generation unit configured to use a plurality of phase interpolators and logic gates to generate gray codes from the multi-phase clock signals generated by the phase-difference clock generation unit; and an A/D conversion unit configured to perform A/D conversion on an input analog signal using the gray codes generated by the gray code generation unit.

The A/D conversion unit may include a counter configured to count the number of periods of the clock signal and output a count value as a high-order bit, a comparison unit configured to compare a reference voltage of a ramp waveform and an input voltage, and a latch configured to simultaneously latch, the gray codes generated by the gray code generation unit using an inversion of an output of the comparison unit as a trigger, convert the gray codes into binary values, and output obtained digital values as low-order bits.

According to another embodiment of the present technology, there is provided an imaging element including: a pixel array configured such that unit pixels that each include a photoelectric conversion element photoelectrically converting incident light are arranged; a phase-difference clock generation unit configured to use a plurality of phase interpolators to generate multi-phase clock signals, of which phases are shifted with respect to an input clock signal, from the clock signal and a signal obtained by delaying the clock signal; a gray code generation and configured to use a plurality of phase interpolators and logic gates to generate gray codes from the multi-phase clock signals generated by the phase-difference clock generation unit; and an A/D conversion unit configured to perform A/D conversion on an analog signal output from the unit pixel of the pixel array using the gray codes generated by the gray code generation unit.

The A/D conversion unit may be installed at each column or each partial region of the unit pixels of the pixel array and may perform the A/D conversion on an analog signal output from the unit pixel of the column or the partial region corresponding to the A/D conversion unit, using the gray code generated by the gray code generation unit.

The gray code generation unit may be installed at intervals of a predetermined number of columns or partial regions. The A/D conversion unit may perform the A/D conversion using the gray code generated by the gray code generation unit corresponding to the column or the partial region corresponding to the A/D conversion unit.

According to another embodiment of the present technology, there is provided an electronic device including: an imaging unit configured to image a subject; and an image processing unit configured to perform image processing on image data obtained through the imaging by the imaging unit. The imaging unit includes a pixel array in which unit pixels that each include a photoelectric conversion element photoelectrically converting incident light are arranged, a phase-difference clock generation unit configured to use a plurality of phase interpolators to generate multi-phase clock signals, of which phases are shifted with respect to an input clock signal, from the clock signal and a signal obtained by delaying the clock signal, a gray code generation unit configured to use a plurality of phase interpolators and logic gates to generate gray codes from the multi-phase clock signals generated by the phase-difference clock generation unit, and an A/D conversion unit configured to perform A/D conversion on an analog signal output from the unit pixel of the pixel array using the gray code generated by the gray code generation unit.

According to still another embodiment of the present technology, there is provided an A/D conversion device including: a phase-difference clock generation unit configured to generate multi-phase clock signals formed from a plurality of clock signals of which phases are mutually shifted; a phase correction unit configured to use a plurality of phase interpolators to correct phase differences between clock signals of the multi-phase clock signals generated by the phase-difference clock generation unit; and an A/D conversion unit configured to perform A/D conversion on an input analog signal using the multi-phase clock signals corrected by the phase correction unit.

According to still another embodiment of the present technology, there is provided an imaging element including: a pixel array configured such that unit pixels that each include a photoelectric conversion element photoelectrically converting incident light are arranged; a phase-difference clock generation unit configured to generate multi-phase clock signals formed from a plurality of clock signals of which phases are mutually shifted; a phase correction unit configured to use a plurality of phase interpolators to correct phase differences between clock signals of the multi-phase clock signals generated by the phase-difference clock generation unit; and an A/D conversion unit configured to perform A/D conversion on an analog signal output from the unit pixel of the pixel array using the multi-phase clock signals corrected by the phase correction unit.

According to still another embodiment of the present technology, there is provided an electronic device including: an imaging unit configured to image a subject; and an image processing unit configured to perform image processing on image data obtained through the imaging by the imaging unit. The imaging unit includes a pixel array in which unit pixels that each include a photoelectric conversion element photoelectrically converting incident light are arranged, a phase-difference clock generation unit configured to generate multi-phase clock signals formed from a plurality of clock signals of which phases are mutually shifted, a phase correction unit configured to use a plurality of phase interpolators to correct phase differences between clock signals of the multi-phase clock signals generated by the phase-difference clock generation unit, and an A/D conversion unit configured to perform A/D conversion on an analog signal output from the unit pixel of the pixel array using the multi-phase clock signals corrected by the phase correction unit.

According to still another embodiment of the present technology, there is provided a signal processing device including a phase correction unit configured to use a plurality of phase interpolators to correct phase differences between clock signals of multi-phase clock signals formed from a plurality of clock signals of which phases are mutually shifted.

According to an embodiment of the present technology, in an A/D conversion device, a plurality of phase interpolators are used to generate multi-phase clock signals, of which phases are shifted with respect to an input clock signal, from the clock signal and a signal obtained by delaying the clock signal, and A/D conversion is performed on an input analog signal using the generated multi-phase clock signals.

According to an embodiment of the present technology, in an imaging element, a plurality of phase interpolators are used to generate multi-phase clock signals, of which phases are shifted with respect to an input clock signal, from the clock signal and a signal obtained by delaying the clock signal, and A/D conversion is performed on an analog signal output from each unit pixel of a pixel array, in which the unit pixels that each include a photoelectric conversion element photoelectrically converting incident light are arranged, using the generated multi-phase clock signals.

According to an embodiment of the present technology, in an electronic device, a plurality of phase interpolators are used to generate multi-phase clock signals, of which phases are shifted with respect to an input clock signal, from the clock signal and a signal obtained by delaying the clock signal, A/D conversion is performed on an analog signal output from a unit pixel of a pixel array, in which the unit pixels that each include a photoelectric conversion element photoelectrically converting incident light are arranged, using the generated multi-phase clock signals, and obtained image data is subjected to image processing.

According to another embodiment of the present technology, in a gray code generation device, a plurality of phase interpolators are used to generate multi-phase clock signals, of which phases are shifted with respect to an input clock signal from the clock signal and a signal obtained by delaying the clock signal, and a plurality of phase interpolators and logic gates are used to generate gray codes from the generated multi-phase clock signals.

According to another embodiment of the present technology, in an A/D conversion device, a plurality of phase interpolators are used to generate multi-phase clock signals, of which phases are shifted with respect to an input clock signal, from the clock signal and a signal obtained by delaying the clock signal, a plurality of phase interpolators and logic gates are used to generate gray codes from the generated multi-phase clock signals, and A/D conversion is performed on an input analog signal using the generated gray codes.

According to another embodiment of the present technology, in an imaging element, a plurality of phase interpolators are used to generate multi-phase clock signals, of which phases are shifted with respect to an input clock signal, from the clock signal and a signal obtained by delaying the clock signal, a plurality of phase interpolators and logic gates are used to generate gray codes from the generated multi-phase clock signals, and A/D conversion is performed on an analog signal output from a unit pixel of the pixel array, in which the unit pixels that each include a photoelectric conversion element photoelectrically converting incident light are arranged, using the generated gray codes.

According to another embodiment of the present technology, in an electronic device, a plurality of phase interpolators are used to generate multi-phase clock signals, of which phases are shifted with respect to an input clock signal, from the clock signal and a signal obtained by delaying the clock signal, a plurality of phase interpolators and logic gates are used to generate gray codes from the generated multi-phase clock signals, A/D conversion is performed on an analog signal output from a unit pixel of the pixel array, in which the unit pixels that each include a photoelectric conversion element photoelectrically converting incident light are arranged, using the generated gray code, and obtained image data is subjected to image processing.

According to still another embodiment of the present technology, in an A/D conversion device, multi-phase clock signals formed from a plurality of clock signals of which phases are mutually shifted are generated, a plurality of phase interpolators are used to correct phase differences between clock signals of the generated multi-phase clock signals, and A/D conversion is performed on an input analog signal using the corrected multi-phase clock signals.

According to still another embodiment of the present technology, in an imaging element, multi-phase clock signals formed from a plurality of clock signals of which phases are mutually shifted are generated, a plurality of phase interpolators are used to correct phase differences between clock signals of the generated multi-phase clock signals, and A/D conversion is performed on an analog signal output from the unit pixel of the pixel array, in which the unit pixels that each include a photoelectric conversion element photoelectrically converting incident light are arranged, using the corrected multi-phase clock signals.

According to still another embodiment of the present technology, in an electronic device, multi-phase clock signals formed from a plurality of clock signals of which phases are mutually shifted are generated, a plurality of phase interpolators are used to correct phase differences between clock signals of the generated multi phase clock signals, A/D conversion is performed on an analog signal output from the unit pixel of the pixel array, in which the pixel units that each include a photoelectric conversion element photoelectrically converting incident light are arranged, and obtained by imaging a subject using the corrected multi-phase clock signals, and obtained image data is subjected to image processing.

According to still another embodiment of the present technology, in a signal processing device, a plurality of phase interpolators are used to correct phase differences between clock signals of multi-phase clock signals formed from a plurality of clock signals of which phases are mutually shifted.

According to still another embodiment of the present technology, there is provided an analog to digital (A/D) conversion, which includes a phase-difference clock generation unit configured to use a plurality of phase interpolators to generate multi-phase clock signals, of which phases are shifted with respect to an input clock signal, from the input clock signal and a signal obtained by delaying the input clock signal; and an A/D conversion unit configured to convert an input analog signal using the multi-phase clock signals generated by the phase-difference clock generation unit.

According to still another embodiment of the present technology, there is provided an electronic device comprising: a pixel array including a plurality of unit pixels, wherein each unit pixel of the plurality of unit pixels includes a photoelectric conversion element configured to photoelectrically convert incident light; a phase-difference clock generation unit configured to use a plurality of phase interpolators to generate multi-phase clock signals, of which phases are shifted with respect to an input clock signal, from the input clock signal and a signal obtained by delaying the input clock signal; and an analog to digital (A/D) conversion unit configured to convert an analog signal output from the unit pixel of the pixel array using the multi-phase clock signals generated by the phase-difference clock generation unit.

According to still another embodiment of the present technology, there is provided an electronic device comprising: an imaging unit configured to image a subject; and an image processing unit configured to perform image processing on image data obtained by the imaging unit, wherein the imaging unit includes: a pixel array including a plurality of unit pixels, wherein each unit pixel of the plurality of unit pixels includes a photoelectric conversion element configured to photoelectrically convert incident light; a phase-difference clock generation unit configured to use a plurality of phase interpolators to generate multi-phase clock signals, of which phases are shifted with respect to an input clock signal, from the input clock signal and a signal obtained by delaying the input clock signal, and an analog to digital (A/D) conversion unit configured to convert an analog signal output from the unit pixel of the pixel array using the multi-phase clock signals generated by the phase-difference clock generation unit.

According to still another embodiment of the present technology, there is provided a gray code generation device comprising:

a phase-difference clock generation unit configured to use a plurality of phase interpolators to generate multi-phase clock signals, of which phases are shifted with respect to an input clock signal, from the input clock signal and a signal obtained by delaying the input clock signal; and a gray code generation unit configured to use a plurality of phase interpolators and logic gates to generate gray codes from the multi-phase clock signals generated by the phase-difference clock generation unit.

According to still another embodiment of the present technology, there is provided an analog to digital (A/D) conversion device comprising: a phase-difference clock generation unit configured to use a plurality of phase interpolators to generate multi-phase clock signals, of which phases are shifted with respect to an input clock signal, from the input clock signal and a signal obtained by delaying the input clock signal; a gray code generation unit configured to use a plurality of phase interpolators and logic gates to generate gray codes from the multi-phase clock signals generated by the phase-difference clock generation unit; and an A/D conversion unit configured to convert an input analog signal using the gray codes generated by the gray code generation unit.

According to still another embodiment of the present technology, there is provided an imaging element including: a pixel array including a plurality of unit pixels, wherein each unit pixel of the plurality of unit pixels includes a photoelectric conversion element configured to photoelectrically convert incident light; a phase-difference clock generation unit configured to use a plurality of phase interpolators to generate multi-phase clock signals, of which phases are shifted with respect to an input clock signal, from the input clock signal and a signal obtained by delaying the input clock signal;

a gray code generation unit configured to use a plurality of phase interpolators and logic gates to generate gray codes from the multi-phase clock signals generated by the phase-difference clock generation unit; and an analog to digital (A/D) conversion unit configured to convert an analog signal output from the unit pixel of the pixel array using the gray codes generated by the gray code generation unit.

According to still another embodiment of the present technology, there is provided an analog to digital (A/D) conversion device comprising: a phase-difference clock generation unit configured to generate multi-phase clock signals formed from a plurality of clock signals of which phases are mutually shifted; a phase correction unit configured to use a plurality of phase interpolators to correct phase differences between clock signals of the multi-phase clock signals generated by the phase-difference clock generation unit; and an A/D conversion unit configured to convert an input analog signal using the multi-phase clock signals corrected by the phase correction unit.

According to still another embodiment of the present technology, there is provided an imaging element comprising: a pixel array including a plurality of unit pixels, wherein each unit pixel of the plurality of unit pixels includes a photoelectric conversion element configured to photoelectrically convert incident light; a phase-difference clock generation unit configured to generate multi-phase clock signals based on a plurality of clock signals of which phases are mutually shifted; a phase correction unit configured to use a plurality of phase interpolators to correct phase differences between clock signals of the multi-phase clock signals generated by the phase-difference clock generation unit; and an A/D conversion unit configured to convert an analog signal output from the unit pixel of the pixel array using the multi-phase clock signals corrected by the phase correction unit.

According to still another embodiment of the present technology, there is provided an imaging unit configured to image a subject; and an image processing unit configured to perform image processing on image data obtained through the imaging of the subject by the imaging unit, wherein the imaging unit includes:

a pixel array including a plurality of unit pixels, wherein each unit pixel of the plurality of unit pixels includes a photoelectric conversion element configured to photoelectrically converting incident light; a phase-difference clock generation unit configured to generate multi-phase clock signals based on a plurality of clock signals of which phases are mutually shifted; a phase correction unit configured to use a plurality of phase interpolators to correct phase differences between, clock signals of the multi-phase clock signals generated by the phase-difference clock generation unit; and an analog to digital (A/D) conversion unit configured to convert an analog signal output from the unit pixel of the pixel array using the multi-phase clock signals corrected by the phase correction unit.

According to still another embodiment of the present technology, there is provided a phase correction unit configured to use a plurality of phase interpolators to correct phase differences between clock signals of multi-phase clock signals formed from a plurality of clock signals, wherein the plurality of clock signals include clock signals having phases which are mutually shifted.

Advantageous Effects of Invention

According to the embodiments of the present technology, a signal can be processed. According to the embodiments of the present technology, it is possible to achieve high speed, high resolution, or both thereof more easily.

BRIEF DESCRIPTION OF DRAWINGS

FIG. 7 is a diagram illustrating a delay time and a phase difference of each output signal of the 4-phase clock generation circuit.

FIG. 27 is a diagram illustrating examples of phases of input/output terminals of the phase correction circuit.

FIG. 28A is a diagram illustrating an example of a relative dispersion of the phase of each node of the phase correction circuit.

FIG. 28B is a diagram illustrating an example of a relative dispersion of the phase of each node of the phase correction circuit.

DESCRIPTION OF EMBODIMENTS

Hereinafter, modes (hereinafter referred to as embodiments) for carrying out the present disclosure will be described. The description will be made in the following order.

1. A/D Conversion of Imaging Element
2. First Embodiment (4-phase Clock Generation Circuit)
3. Second Embodiment (High-resolution Gray Code Generation Circuit-1)
4. Third Embodiment (A/D Conversion Circuit-1)
5. Fourth Embodiment (Imaging Element-1)
6. Fifth Embodiment (A/D Conversion Circuit-2)
7. Sixth Embodiment (Imaging Element-2)
8. Seventh Embodiment (A/D Conversion Circuit-3)
9. Eighth Embodiment (A/D Converter Using Multi-clock Signals)
10. Ninth Embodiment (Image Sensor-1)
11. Tenth Embodiment (Imaging Device)

1. A/D Conversion of Imaging Element

In a general image sensor, a charge accumulated in a light reception portion (for example, a photodiode) of a unit pixel is read as a signal voltage (pixel signal) and is subjected to analog/digital conversion (A/D conversion). As a method of the A/D conversion, for example, there has been suggested a method of performing digital conversion by comparing with a signal voltage while varying a reference voltage and acquiring an accordance timing.

Figure 1:
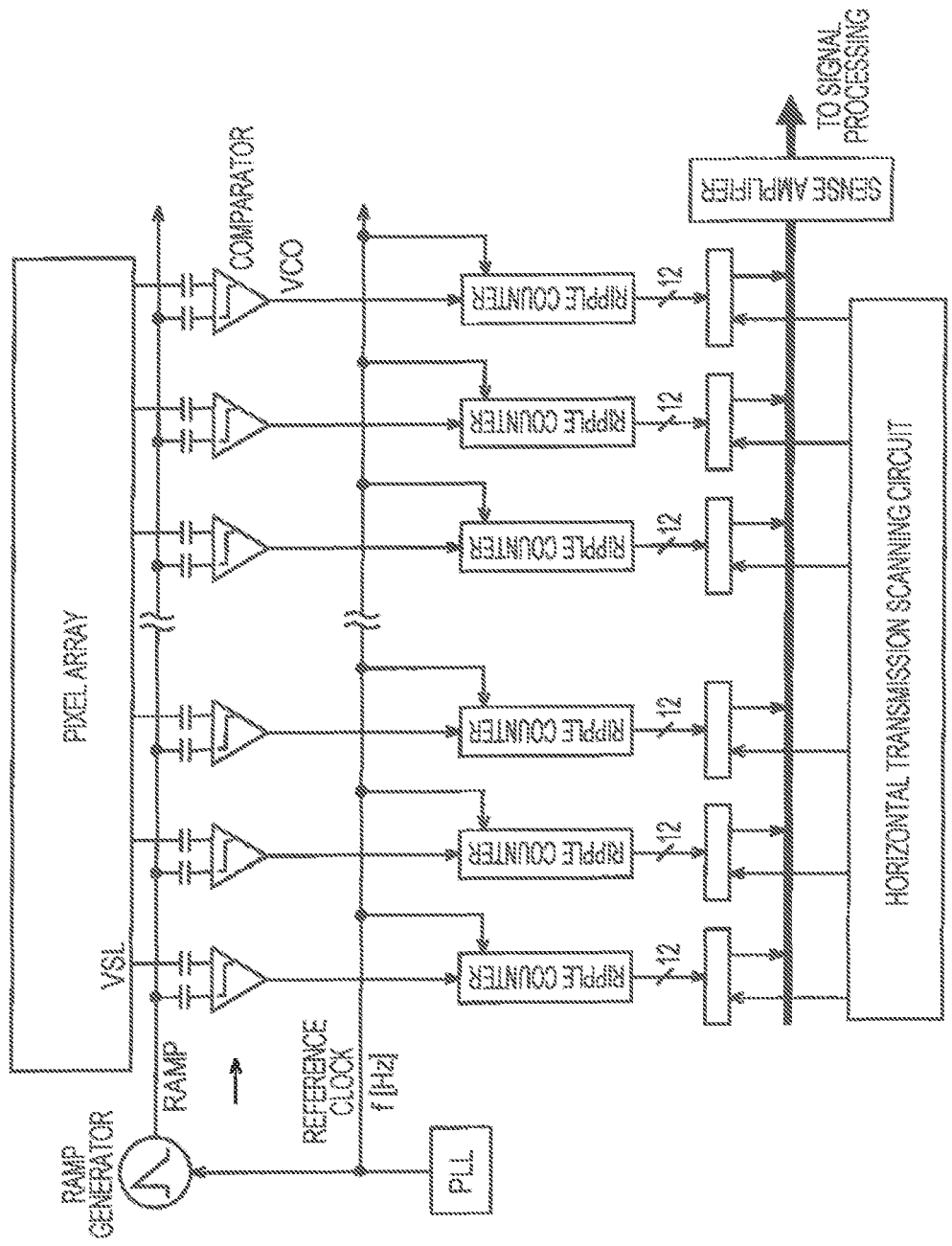
FIG. 1 is a diagram illustrating an example of a main configuration of an imaging element.

Japanese Unexamined Patent Application Publication No. 2005-323331 (hereinafter referred to as PTL 2) suggests a configuration in which integral type A/D converters are arranged in parallel in columns in an image sensor. An example of an integral parallel-column type column A/D converter is illustrated in FIG. 1. In the integral type A/D converter, a reference voltage RAMP with a ramp waveform of which a voltage value is linearly changed over time is compared with as input voltage VSL by a comparator and a comparison result is output as VCO. A variation in voltage is converted into a digital value by starting or stopping an operation of a ripple counter at a timing at which the VCO varies and counting a count period. A clock is distributed from a PLL (Phase Locked Loop) and a ramp wave is distributed from a ramp generator to all of the columns.

In general, it is preferable that an A/D converter have high resolution if other performances are the same. Further, it is preferable that an A/D converter operate at high speed if other performances are the same.

Figure 2:
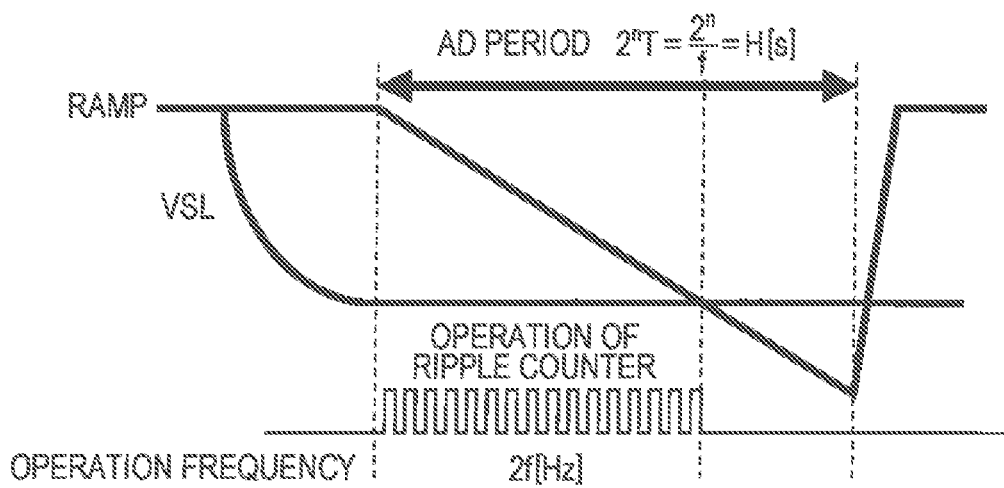
FIG. 2 is a diagram for describing an example of a situation of an operation of a ripple counter.

For example, in order to increase a resolution of the integral type A/D converter disclosed in PTL 2, a count number of the ripple counter may be raised. For example, in order to increase, by 1 bit, the resolution of the integral type A/D converter that performs A/D conversion during a period H [s] using a clock signal with a frequency f [Hz], the count number of the counter may be doubled. In order to double the counter number, as illustrated in FIG. 2, the frequency of the clock signal has to be raised to 2f [Hz] to be doubled when a conversion period H [s] is maintained. Since it is necessary to distribute the clock signal to all of the columns, loads of the columns connected to the clock signal are large and it is not easy to realize high frequency. For this reason, it is difficult to realize high resolution of the integral type A/D converter disclosed in PTL 2.

High speed of an operation of an A/D converter is realized by raising the frequency of a clock signal or increasing the resolution of the A/D converter. However, as described above, both of the raising of the frequency and the increasing of the resolution are not easy. That is, it is difficult to achieve high speed of the integral type A/D converter disclosed in PTL 2.

Figure 3:
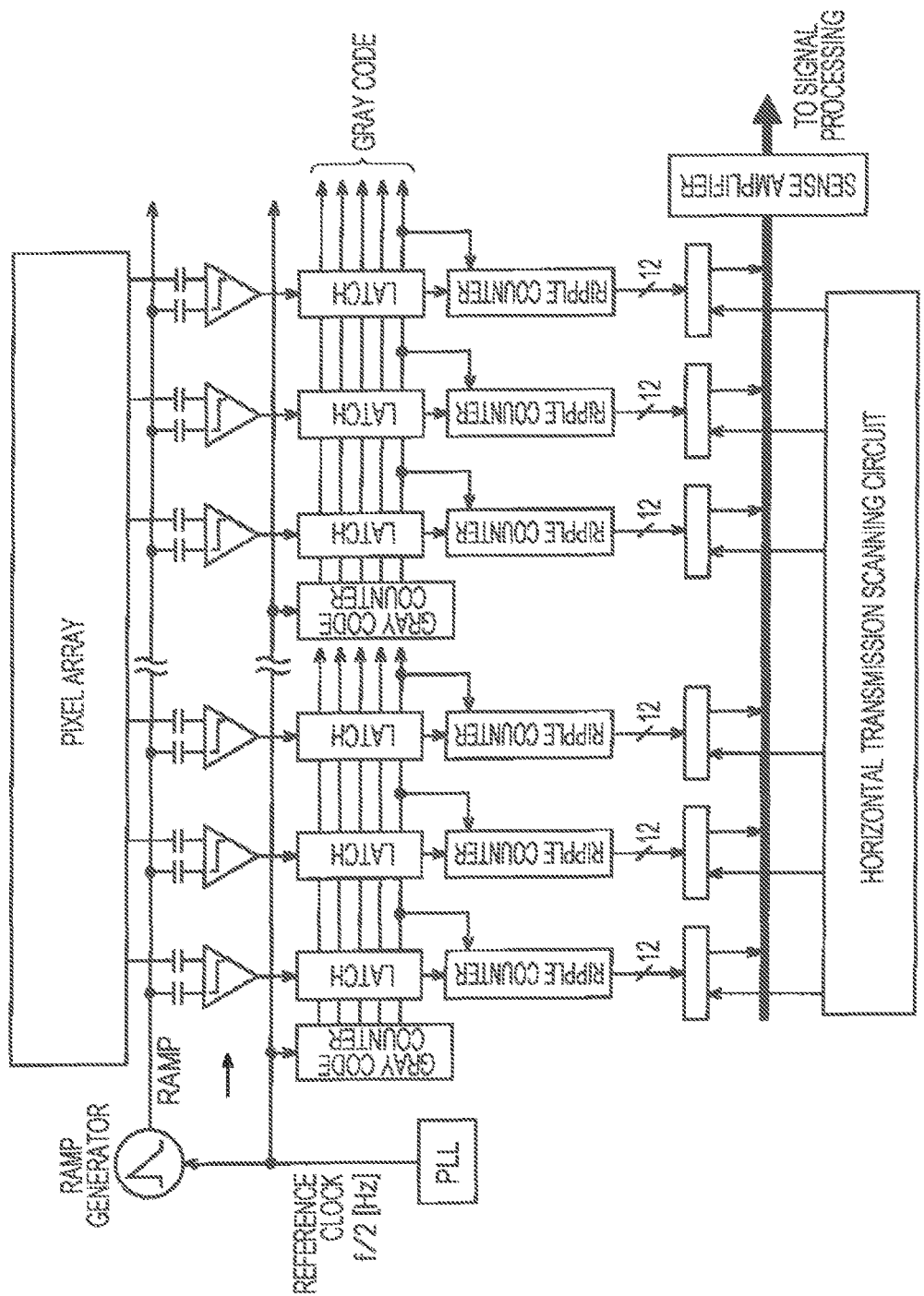
FIG. 3 is a diagram illustrating an example of a main configuration of an imaging element.

Meanwhile, PTL 1 suggests an A/D converter for the purpose of low power consumption. An example of the integral parallel-column type column A/D converter is illustrated in FIG. 3. As illustrated in FIG. 3, the integral type A/D converter disclosed in PTL 1 is configured such that a reference clock signal is distributed from a PLL to gray code counters and a gray code is distributed from the gray code counter to each column. In this configuration, since the gray code counter is disposed, in each of given aggregated column groups, loads on wirings distributing the reference clock signal are considerably reduced and the gray code is used, and thus the same degree of resolution can be obtained with the reference frequency f/2 [Hz].

However, even in this case, the reference clock signal distributed to the entire A/D converter has the highest frequency in the chip. For this reason, in the integral type A/D converter disclosed in PTL 1, it is also difficult to achieve high speed or high resolution as in the case of the integral, type A/D converter disclosed in PTL 2.

Meanwhile, Japanese Unexamined Patent Application Publication No. 2008-92091 (hereinafter referred to as PTL 3) suggests a method of obtaining phase information by causing a ring oscillator to generate clock signals with different phases and latching the clock signals with a signal of a comparison result so that a resolution is increased.

Figure 4:
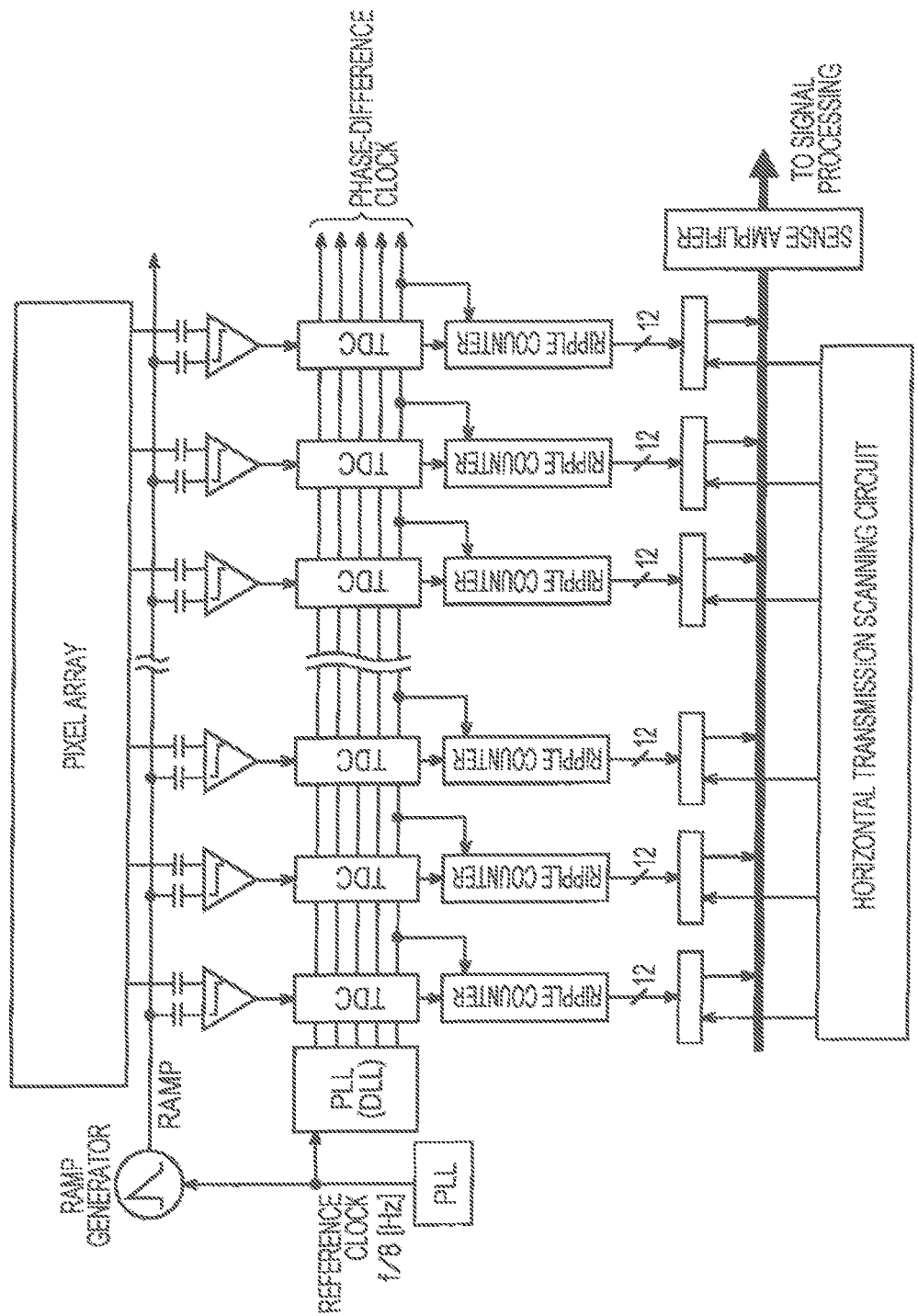
FIG. 4 is a diagram illustrating an example of a main configuration of an imaging element.

An example of an integral parallel-column type column A/D converter following this method is illustrated in FIG. 4. As illustrated in FIG. 4, the integral type A/D converter disclosed in PTL 3 creates clock signals with different phase by inserting a reference clock signal into a ring oscillator. A PLL is used in the ring oscillator. Then, the clock signals with the different phases are distributed to A/D converters of columns.

In this method, since a time quantizer (TDC (Time-to-Digital Converter)) that focuses on a phase difference is used to perform A/D conversion, it is possible to lower the frequency of the reference clock signal. For example, in a case in which the TDC performs A/D conversion on low-order 3 bits using four clock signals with a phase difference of 45 degree, the integral type A/D converter disclosed in PTL 3 can obtain the same degree of resolution as that of the A/D converter in FIG. 1 when, a reference clock input to the PLL has f/8 [Hz].

However, since a ring oscillator such as a PLL is configured as an analog circuit including a feedback, an area thereof is large and it is difficult to arrange the ring oscillator at each of the given aggregated column groups. Thus, a phase-difference clock signal is distributed to all of the columns, and thus it is difficult to maintain a phase difference due to clock skew or the like and it is difficult to achieve high speed or high resolution.

Accordingly, high speed or high resolution is designed to be achieved more easily while suppressing high frequency of a clock signal by using a plurality of phase interpolators to generate multi-phase clock signals, of which phases are shifted with respect to a clock signal, from an input clock signal and signals obtained by delaying the clock signal.

Hereinafter, more specific description will be made.

2. First Embodiment

<4-Phase Clock Generation Circuit>

Figure 5:
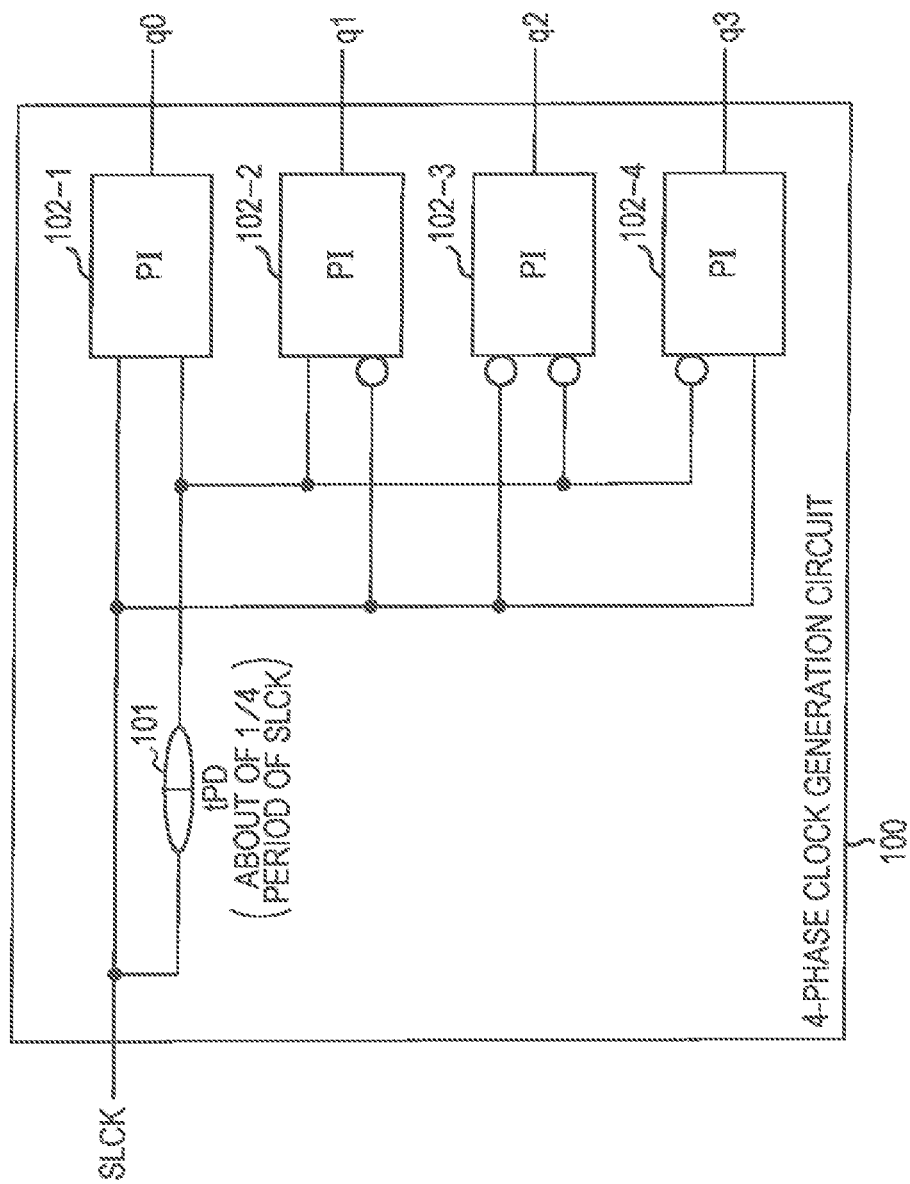
FIG. 5 is a diagram illustrating an example of a main configuration of a 4-phase clock generation circuit.

FIG. 5 is a diagram illustrating an example of a main configuration of a 4-phase clock generation circuit which is an example of a phase-difference clock generation circuit to which the present technology is applied. The phase-difference clock generation circuit is a circuit that generates phase-difference clock signals (also referred to as multi-phase clock signals) configured by a plurality of clock signals of which phases are mutually shifted by shifting the phase of an input clock signal. A 4-phase clock generation circuit 100 illustrated in FIG. 5 generates 4-phase clock signals formed from four clock signals of which phases are each shifted by a ¼ period, from an input clock signal SLCK in the same way.

As illustrated in FIG. 5, the 4-phase clock generation circuit 100 includes a delay circuit 101 and a phase interpolator (PI) 102-1 to a phase interpolator (PI) 102-4. The delay circuit 101 delays the input clock signal SLCK by a predetermined delay time tPD and outputs the delayed clock signal. Any delay time tPD can be used. For example, the delay time tPD may be about a ¼ period of the clock signal SLCK. The delay circuit 101 supplies the delayed clock signals SLCK to the phase interpolator (PI) 102-1 to the phase interpolator (PI) 102-4.

The phase interpolator (PI) 102-1 to the phase interpolator (PI) 102-4 are the same circuits. Hereinafter, when it is not necessary to distinguish the phase interpolator (PI) 102-1 to the phase interpolator (PI) 102-4 from each other for description, the phase interpolator (PI) 102-1 to the phase interpolator (PI) 102-4 are simply referred to as the phase interpolators 102. The phase interpolator 102 is a circuit with two inputs and one output and outputs a signal at a timing delayed by a predetermined delay time from an intermediate timing of a phase difference between both of input signals. Details of the phase interpolators 102 will be described below.

As illustrated in FIG. 5, the clock signal SLCK and a signal obtained by delaying the clock signal SLCK by about a ¼ period are input to the phase interpolator (PI) 102-1. The phase interpolator (PI) 102-1 generates a clock signal q0 which is one of the 4-phase clock signals from these signals and outputs the generated clock signal to the outside of the 4-phase clock generation circuit 100. A signal inverted from the clock signal SLCK and a signal obtained by delaying the clock signal SLCK by about a ¼ period are input to the phase interpolator (PI) 102-2. The phase interpolator (PI) 102-2 generates a clock signal q1 which is one of the 4-phase clock signals from these signals and outputs the generated clock signal to the outside of the 4-phase clock generation circuit 100. A signal inverted from the clock signal SLCK and a signal inverted from a signal obtained by delaying the clock signal SLCK by about a ¼ period are input to the phase interpolator (PI) 102-3. The phase interpolator (PI) 102-3 generates a clock signal q2 which is one of the 4-phase clock signals from these signals and outputs the generated clock signal to the outside of the 4-phase clock generation circuit 100. The clock signal SLCK and a signal inverted from a signal obtained by delaying the clock signal SLCK by about a ¼ period are input to the phase interpolator (PI) 102-4. The phase interpolator (PI) 102-4 generates a clock signal q3 which is one of the 4-phase clock signals from these signals and outputs the generated clock signal to the outside of the 4-phase clock generation circuit 100.

That is, the phase interpolators 102 generate the 4-phase clock signals, of which phases are each shifted by a ¼ period, from the clock signals SLCK and the signals obtained by delaying the clock signal SLCK by about a ¼ period and output the 4-phase clock signals.

Figure 6:
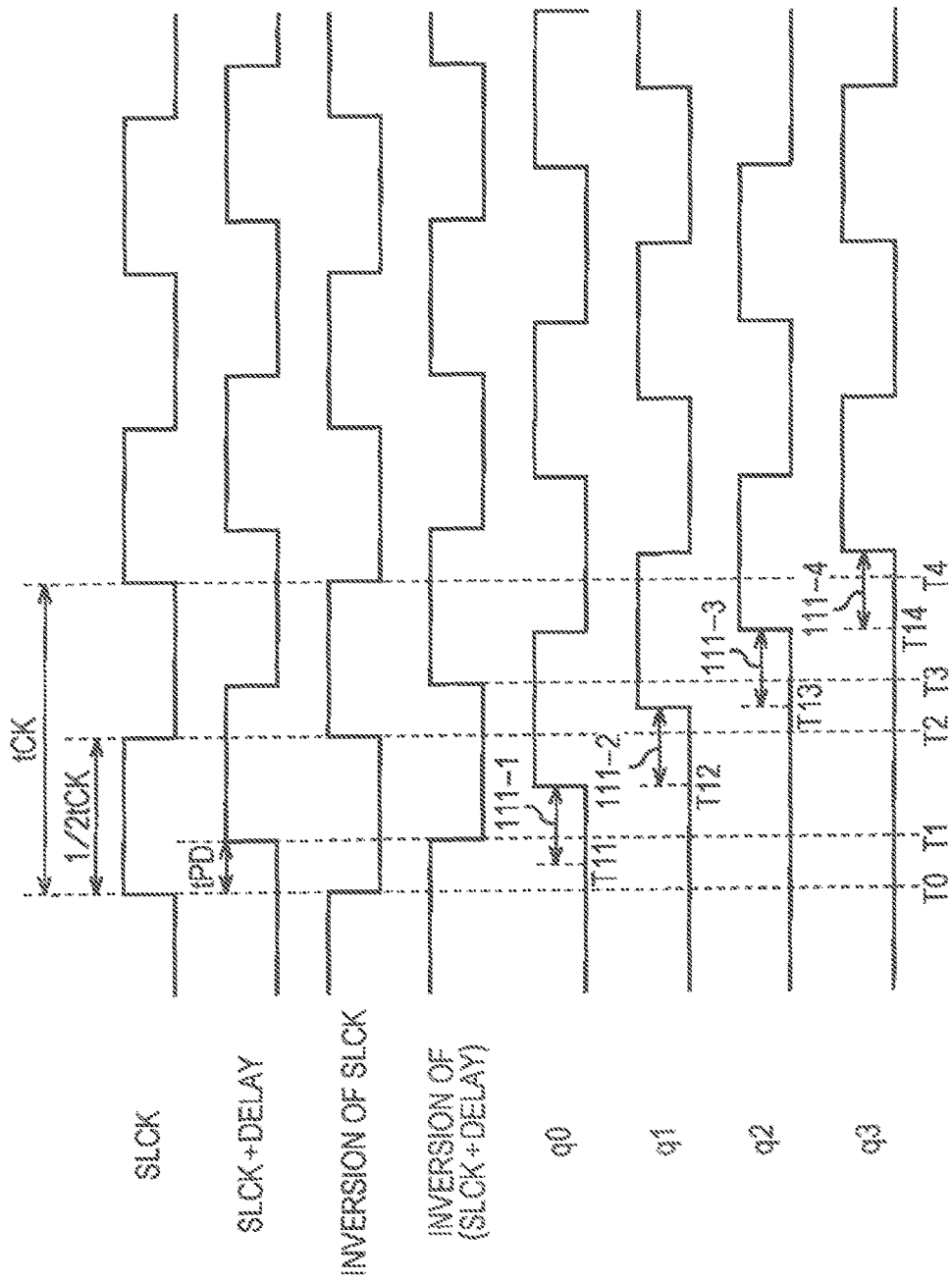
FIG. 6 is a timing chart for describing an example of a situation of an operation of the 4-phase clock generation circuit.

FIG. 6 is a timing chart illustrating an example of a situation of an operation of the 4-phase clock generation circuit 100. As illustrated in FIG. 6, the phase interpolator (PI) 102-1 generates the clock signal q0 which has the same period as the clock signal SLCK and has a rising edge at a timing delayed by only a fixed delay time of the phase interpolator (PI) 102-1 indicated by a bidirectional arrow 111-1 from an intermediate timing (T11) between a tuning (T0) of a rising edge of the clock signal SLCK and a timing (T1) of a rising edge of the clock signal SLCK (SLCK+delay) delayed by only the delay time tPD, and then outputs the generated clock signal.

Likewise, the phase interpolator (PI) 102-2 generates the clock signal q1 which has the same period as the clock signal SLCK and has a rising edge at a timing delayed by only a fixed delay time of the phase interpolator (PI) 102-2 indicated by a bidirectional arrow 111-2 from an intermediate timing (T12) between the timing (T1) of the rising edge of the clock signal SLCK (SLCK+delay) delayed by only the delay time tPD and a timing (T2) of a rising edge (that is, a falling edge of the clock signal SLCK) of the signal inverted from the clock signal SLCK, and then outputs the generated clock signal.

Likewise, the phase interpolator (PI) 102-3 generates the clock signal q2 which has the same period as the clock signal SLCK and has a rising edge at a timing delayed by only a fixed delay time of the phase interpolator (PI) 102-3 indicated by a bidirectional arrow 111-3 from an intermediate timing (T13) between, the timing (T2) of the rising edge (that is, the falling edge of the clock signal SLCK) of the signal inverted from the clock signal SLCK and a timing (T3) of a rising edge (that is, a falling edge of the clock signal SLCK (SLCK+delay) delayed by only the delay time tPD) of the signal inverted from the clock signal SLCK (SLCK+delay) delayed by only the delay time tPD, and then outputs the generated clock signal.

Likewise, the phase interpolator (PI) 102-4 generates the clock signal q3 which has the same period as the clock signal SLCK and has a rising edge at a timing delayed by only a fixed delay time of the phase interpolator (PI) 102-4 indicated by a bidirectional arrow 111-4 from an intermediate timing (T14) between the timing (T3) of the rising edge (that is, the falling edge of the clock signal SLCK (SLCK+delay) delayed by only the delay time tPD) of the signal inverted from the clock signal SLCK (SLCK+delay) delayed by only the delay time tPD and a timing (T4) of a rising edge of the clock signal SLCK, and then outputs the generated clock signal.

That is, the delay times of the clock signal q0 to the clock signal q3, which are 4-phase clock signals, with respect to the clock signal SLCK are illustrated in the table of FIG. 7. Thus, as illustrated in the table of FIG. 7 the mutual phase difference among the clock signals q0 to the clock signal q3 is the ¼ period (tCK/4) of the clock signal SLCK. That is, the 4-phase clock generation circuit 100 can generate accurate 4-phase clock signals.

[Operation Principle of Phase Interpolators]

Figure 8:
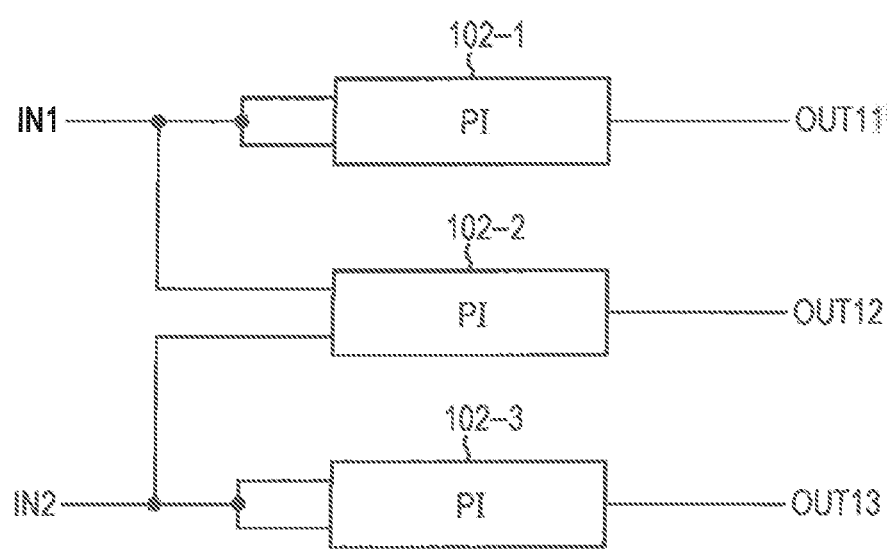
FIG. 8 is a diagram for describing an example of a situation of an operation of a phase interpolator.
Figure 9:
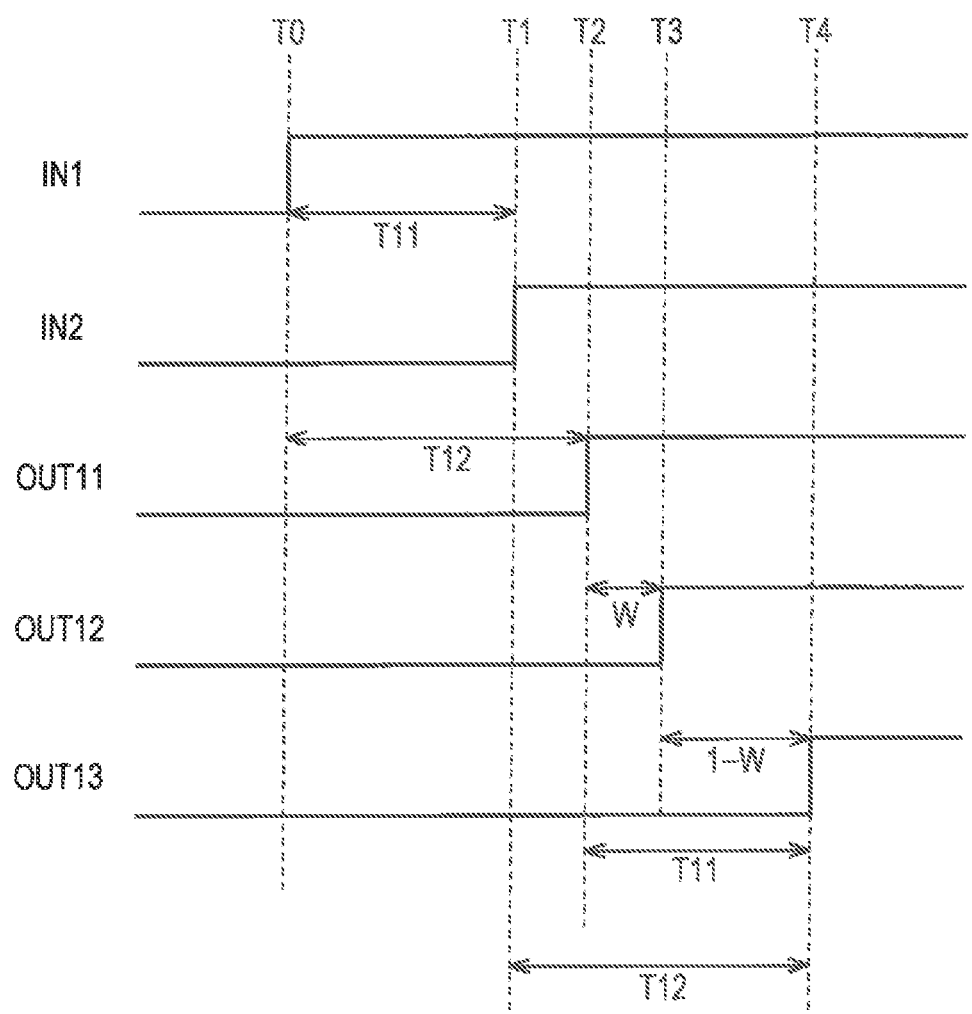
FIG. 9 is a timing charge for describing an example of the situation of the operation of the phase interpolator.

Next, an operation principle of the phase interpolators 102 will be described with reference to FIGS. 8 and 9. As described above, the phase interpolator 102 has a circuit configuration of two inputs and one output. When there is a phase difference between the two inputs, a signal is output at an intermediate timing of the phase difference. For example, a signal IN1 is assumed to be input to both of the input terminals of the phase interpolator (PI) 102-1, as in the example of FIG. 8. The signal IN1 is assumed to be input to one of the input terminals of the phase interpolator (PI) 102-2 and a signal IN2 is assumed to be input to the other input terminal. The signal IN2 is assumed to be input to both of the input terminals of the phase interpolator (PI) 102-3. A delay time is assumed to occur by a bidirectional arrow T11 between the signal IN1 and the signal IN2, as illustrated in FIG. 9 and a fixed delay time indicated by a bidirectional arrow T12 is assumed to occur in the phase interpolators 102.

Since only the signal IN1 is input to the phase interpolator (PI) 102-1, the phase interpolator (PI) 102-1 outputs a signal OUT11 delayed by the bidirectional arrow T12 from the signal IN1. That is, when a rising edge of the signal IN1 occurs at a time T0, a rising edge of the signal OUT11 occurs at a time T2 at which the signal OUT11 is delayed by the bidirectional arrow T12 from the time T0.

Since only the signal IN2 is input to the phase interpolator (PI) 102-3, the phase interpolator (PI) 102-3 outputs a signal OUT13 delayed by the bidirectional arrow T12 from the signal IN2. That is, when a rising edge of the signal IN2 occurs at a time T1, a rising edge of the signal OUT13 occurs at a time T4 at which the signal OUT13 is delayed by the bidirectional arrow T12 from the time T1.

On the other hand, since both of the signal IN1 and the signal IN2 are input to the phase interpolator (PI) 102-2, the phase interpolator (PI) 102-2 outputs a signal OUT12 delayed by the bidirectional arrow T12 from the intermediate timing of the phase difference between the signal IN1 and the signal IN2. That is, when a rising edge of the signal IN1 is assumed to occur at the time T0 and a rising edge of the signal IN2 is assumed to occur at the time T1, a rising edge of the signal OUT12 occurs at a time T3 at which the signal is delayed by the bidirectional arrow T12 from the intermediate time of the time T0 and the time T1.

Any intermediate timing can be set according to the configuration of the phase interpolators 102.

[Configuration of Phase Interpolator]

Figure 10:
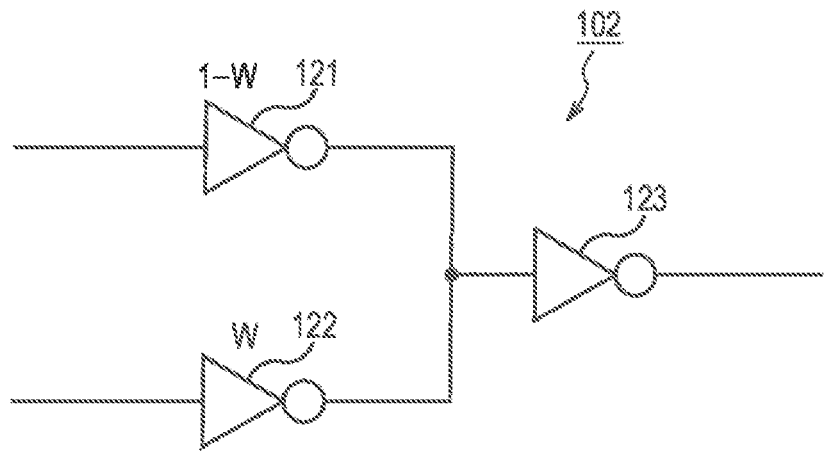
FIG. 10 is a diagram illustrating an example of a main configuration of the phase interpolator.
Figure 11:
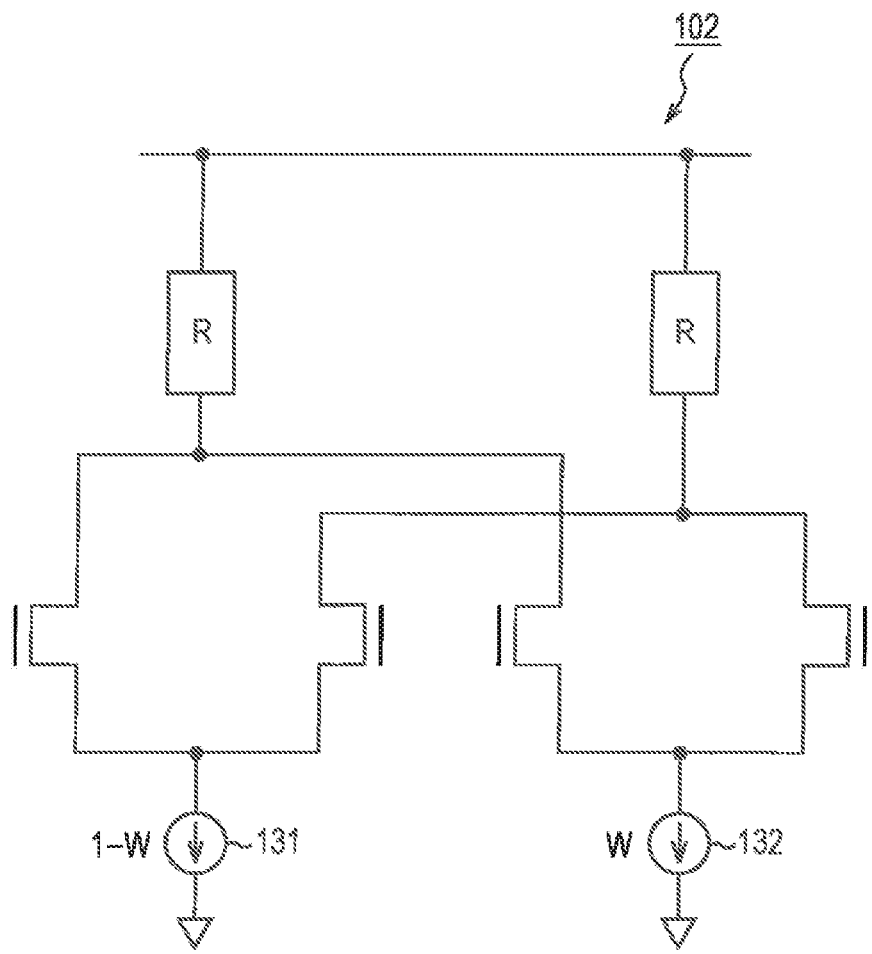
FIG. 11 is a diagram illustrating an example of a main configuration of the phase interpolator.

An example of the configuration of the phase interpolator 102 is illustrated in FIGS. 10 and 11. The phase interpolator 102 having a configuration illustrated in FIG. 10 is also referred to as a CMOS phase interpolator (PI). In this case, the phase interpolator 102 includes three inverters and outputs of two inverters (inverters 121 and 122) are short-circuited to be input to the remaining inverter (an inverter 123). When a driving capability of an input transistor is 1-W:W on the assumption that W is a weighting coefficient, an output timing becomes W:1-W as in the signal OUT12 of FIG. 9.

The phase interpolator 102 having a configuration illustrated in FIG. 11 is also referred to as a CML phase interpolator (PI). In this case, the phase interpolator 102 includes two differential circuits and shares a load resistor R. When a driving capability of an input transistor is 1-W:W on the assumption that W is a weighting coefficient, as in the CMOS phase interpolator (PI) in the example of FIG. 10, an output timing becomes W:1-W, as in the signal OUT12 of FIG. 9. The driving capability is determined by a current value of a current source 131 and a current value of a current source 132.

A weighting coefficient W=0.5 is set in the phase interpolator (PI) 102-1 to the phase interpolator (PI) 102-4 of the 4-phase clock generation circuit 100 (see FIG. 5). That is, an output timing becomes a timing of 1:1 (a bisected timing of the phase difference between two inputs).

[Phase-Difference Clock Generation Circuit]

When a phase-difference clock signal (multi-phase clock signal) is generated, a PLL or the like is normally used. Since a PLL is a passive element forming a filter or the like with an analog circuit asking for a feedback, the area thereof is large. On the other hand, the above-described phase interpolator 102 can be realized by three inverters. Accordingly, the 4-phase clock generation circuit 100 can be realized with a simple configuration compared to a PLL. Therefore, by using the 4-phase clock generation circuit 100, it is possible to further reduce a circuit size (area). Accordingly, it is possible to improve the degree of freedom of circuit arrangement. Further, since the 4-phase clock generation circuit 100 does not use a PLL, it is possible to reduce power consumption further than when a PLL is used.

The example (4-phase clock generation circuit 100) in which the 4-phase clock signals are generated has been described, but any number of phases of the generated phase-difference clock signal can be used. For example, by changing the number or combination of the phase interpolators 102 of the phase-difference clock generation circuit from the example (4-phase clock generation circuit 100) in FIG. 5, it is possible to generate 8-phase clock signals of which phases are each shifted by a ⅛ period or 16-phase clock signals of which phases are each shifted by a 1/16 period. Likewise, by changing the number of the phase interpolators 102 of the phase-difference clock generation circuit, a combination thereof, and the weighting coefficient W thereof from the example (4-phase clock generation circuit 100) in FIG. 5, it is also possible to generate 3-phase clock signals of which phases are each shifted by a ⅓ period or 5-phase clock signals of which phases are each shifted by a ⅕ period.

3. Second Embodiment

[High-Resolution Gray Code Generation Circuit-1]

Figure 12:
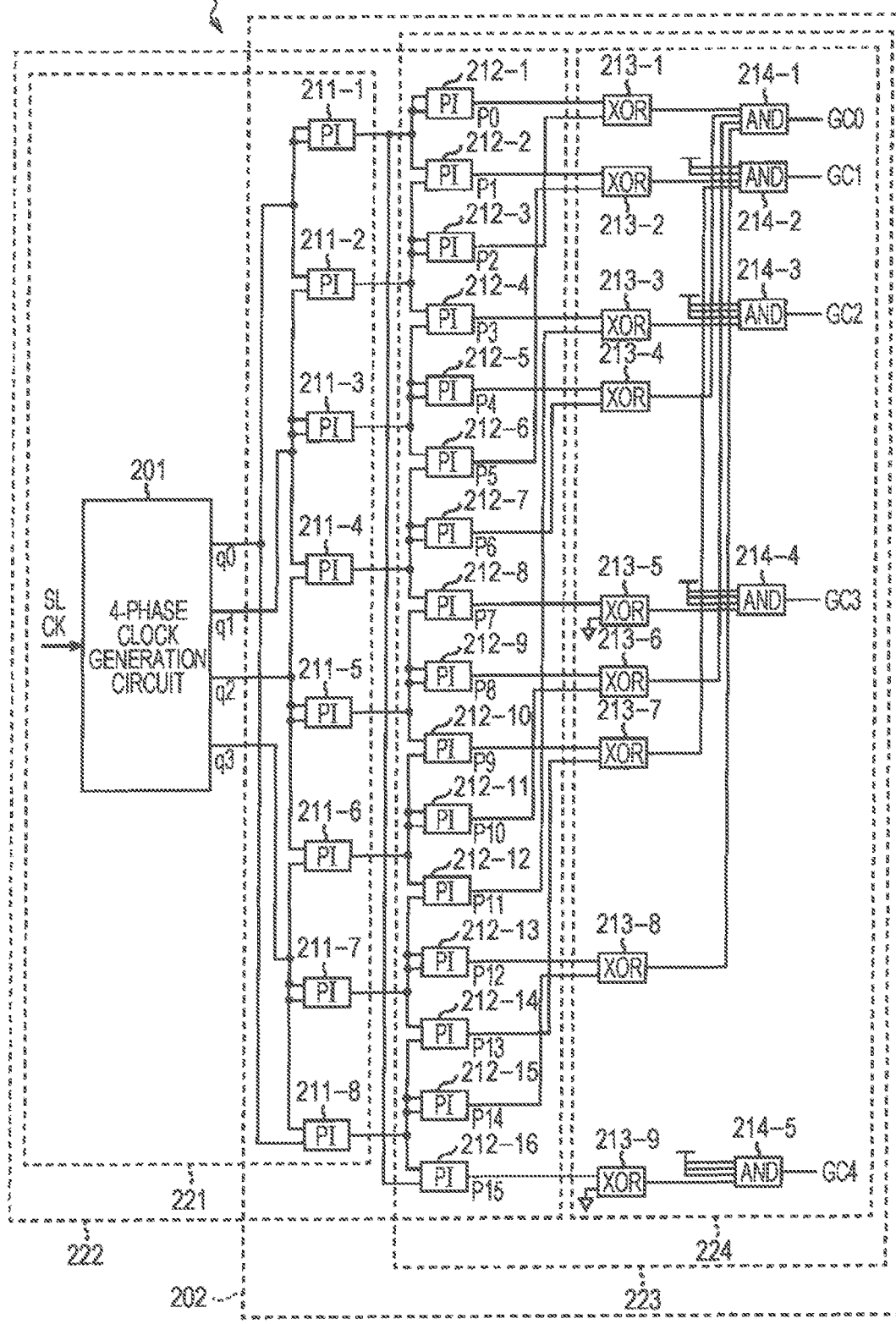
FIG. 12 is a diagram illustrating an example of a main configuration of a high-resolution gray code generation circuit.

FIG. 12 is a diagram illustrating an example of a main configuration of a high-resolution gray code generation circuit which is an example of a gray code generation device to which the present technology is applied. The gray code generation device is a device that generates a gray code (also referred to as an alternating binary code) from an input clock signal. The gray code is a code in which a Hamming distance between previous and subsequent adjacent codes is normally 1. A high-resolution gray code generation circuit 200 illustrated in FIG. 12 likewise generates 5-bit gray codes from an input clock signal SLCK.

As illustrated in FIG. 12, the high-resolution gray code generation circuit 200 includes a 4-phase clock generation circuit 201 and a gray code generation circuit 202. The 4-phase clock generation circuit 201 is a circuit that has the same configuration as the 4-phase clock generation circuit 100 (see FIG. 5) described in the first embodiment and performs the same process. The 4-phase clock generation circuit 201 generates 4-phase clock signals (a clock signal q0, a clock signal q1, a clock signal q2, and a clock signal q3) from the input clock signal SLCK and supplies the 4-phase clock signals to the gray code generation circuit 202.

The gray code generation circuit 202 includes a plurality of phase interpolators and logic gates and uses the phase interpolators and the logic gates to generate 5-bit gray codes from the 4-phase clock signals (the clock signal q0, the clock signal q1, the clock signal q2, and the clock signal q3) generated in the 4-phase clock generation circuit 201 and output the 5-bit gray codes.

As illustrated in FIG. 12, the gray code generation circuit 202 includes a phase interpolator (PI) 211-1 to a phase interpolator (PI) 211-8, a phase interpolator (PI) 212-1 to a phase interpolator (PI) 212-16, au XOR 213-1 to an XOR 213-9, and an AND 214-1 to an AND 214-5.

The phase interpolator (PI) 211-1 to the phase interpolator (PI) 211-8 are circuits that each have the same configuration as the phase interpolator 102 (see FIG. 5) described in the first embodiment and perform the same process.

The clock signal q0 output from the 4-phase clock generation circuit 201 is input to both of the input terminals of the phase interpolator (PI) 211-1. The phase interpolator (PI) 211-1 outputs a signal delayed by a fixed delay time of the phase interpolator (PI) 211-1 from the signals. The clock signals q0 and q1 output from the 4-phase clock generation circuit 201 are input to the phase interpolator (PI) 211-2. The phase interpolator (PI) 211-2 outputs a signal delayed by a fixed delay then of the phase interpolator (PI) 211-2 from an intermediate timing of the signals from the signals.

The clock signal q1 output from the 4-phase clock generation circuit 201 is input to both of the input terminals of the phase interpolator (PI) 211-3. The phase interpolator (PI) 211-3 outputs a signal delayed by a fixed delay time of the phase interpolator (PI) 211-3 from the signals. The clock signals q1 and q2 output from the 4-phase clock generation circuit 201 are input to the phase interpolator (PI) 211-4. The phase interpolator (PI) 211-4 outputs a signal delayed by a fixed delay time of the phase interpolator (PI) 211-4 from an intermediate timing of the signals from the signals.

The clock signal q2 output from the 4-phase clock generation circuit 201 is input to both of the input terminals of the phase interpolator (PI) 211-5. The phase interpolator (PI) 211-5 outputs a signal delayed by a fixed delay time of the phase interpolator (PI) 211-5 from the signals. The clock signals q2 and q3 output from the 4-phase clock generation circuit 201 are input to the phase interpolator (PI) 211-6. The phase interpolator (PI) 211-6 outputs a signal delayed by a fixed delay time of the phase interpolator (PI) 211-6 from an intermediate timing of the signals from the signals.

The clock signal q3 output from the 4-phase clock generation circuit 201 is input to both of the input terminals of the phase interpolator (PI) 211-7. The phase interpolator (PI) 211-7 outputs a signal delayed by a fixed delay time of the phase interpolator (PI) 211-7 from the signals. The clock signals q3 and q0 output from the 4-phase clock generation circuit 201 are input to the phase interpolator (PI) 211-8. The phase interpolator (PI) 211-8 outputs a signal delayed by a fixed delay time of the phase interpolator (PI) 211-8 from an intermediate timing of the signals from the signals.

Hereinafter, when it is not necessary to distinguish the phase interpolator (PI) 211-1 to the phase interpolator (PI) 211-8 from each other, the phase interpolator (PI) 211-1 to the phase interpolator (PI) 211-8 are simply referred to as the phase interpolators 211.

The phase interpolator (PI) 212-1 to the phase interpolator (PI) 212-16 are circuits that each have the same configuration as the phase interpolator 102 (see FIG. 5) described in the first embodiment and perform the same process.

The output of the phase interpolator (PI) 211-1 is input to both of the input terminals of the phase interpolator (PI) 212-1. The phase interpolator (PI) 212-1 outputs a signal P0 delayed by a fixed delay time of the phase interpolator (PI) 212-1 from the signals. The output of the phase interpolator (PI) 211-1 and the output of the phase interpolator (PI) 211-2 are input to the phase interpolator (PI) 212-2. The phase interpolator (PI) 212-2 outputs a signal P1 delayed by a fixed delay time of the phase interpolator (PI) 212-2 from an intermediate timing of the signals from the signals.

The output of the phase interpolator (PI) 211-2 is input to both of the input terminals of the phase interpolator (PI) 212-3. The phase interpolator (PI) 212-3 outputs a signal P2 delayed by a fixed delay time of the phase interpolator (PI) 212-3 from the signals. The output of the phase interpolator (PI) 211-2 and the output of the phase interpolator (PI) 211-3 are input to the phase interpolator (PI) 212-4. The phase interpolator (PI) 212-4 outputs a signal P3 delayed by a fixed delay time of the phase interpolator (PI) 212-4 from an intermediate timing of the signals from the signals.

The output of the phase interpolator (PI) 211-3 is input to both of the input terminals of the phase interpolator (PI) 212-5. The phase interpolator (PI) 212-5 outputs a signal P4 delayed by a fixed delay time of the phase interpolator (PI) 212-5 from the signals. The output of the phase interpolator (PI) 211-3 and the output of the phase interpolator (PI) 211-4 are input to the phase interpolator (PI) 212-6. The phase interpolator (PI) 212-6 outputs a signal P5 delayed by a fixed delay time of the phase interpolator (PI) 212-6 from an intermediate timing of the signals from the signals.

The output of the phase interpolator (PI) 211-4 is input to both of the input terminals of the phase interpolator (PI) 212-7. The phase interpolator (PI) 212-7 outputs a signal P6 delayed by a fixed delay time of the phase interpolator (PI) 212-7 from the signals. The output of the phase interpolator (PI) 211-4 and the output of the phase interpolator (PI) 211-5 are input to the phase interpolator (PI) 212-8. The phase interpolator (PI) 212-8 outputs a signal P7 delayed by a fixed delay time of the phase interpolator (PI) 212-8 from an intermediate timing of the signals from the signals.

The output of the phase interpolator (PI) 211-5 is input to both of the input terminals of the phase interpolator (PI) 212-9. The phase in interpolator (PI) 212-9 outputs a signal P8 delayed by a fixed delay time of the phase interpolator (PI) 212-9 from the signals. The output of the phase interpolator (PI) 211-5 and the output of the phase interpolator (PI) 211-6 are input to the phase interpolator (PI) 212-10. The phase interpolator (PI) 212-10 outputs a signal P9 delayed by a fixed delay time of the phase interpolator (PI) 212-10 from an intermediate timing of the signals from the signals.

The output of the phase interpolator (PI) 211-6 is input to both of the input terminals of the phase interpolator (PI) 212-11. The phase interpolator (PI) 212-11 outputs a signal P10 delayed by a fixed delay time of the phase interpolator (PI) 212-11 from the signals. The output of the phase interpolator (PI) 211-6 and the output of the phase interpolator (PI) 211-7 are input to the phase interpolator (PI) 212-12. The phase interpolator (PI) 212-12 outputs a signal P11 delayed by a fixed delay time of the phase interpolator (PI) 212-12 from an intermediate timing of the signals from the signals.

The output of the phase interpolator (PI) 211-7 is input to both of the input terminals of the phase interpolator (PI) 212-13. The phase interpolator (PI) 212-13 outputs a signal P12 delayed by a feed delay time of the phase interpolator (PI) 212-13 from the signals. The output of the phase interpolator (PI) 211-7 and the output of the phase interpolator (PI) 211-8 are input to the phase interpolator (PI) 212-14. The phase interpolator (PI) 212-14 outputs a signal P13 delayed by a fixed delay time of the phase interpolator (PI) 212-14 from an intermediate timing of the signals from the signals.

The output of the phase interpolator (PI) 211-8 is input to both of the input terminals of the phase interpolator (PI) 212-15. The phase interpolator (PI) 212-15 outputs a signal P14 delayed by a fixed delay time of the phase interpolator (PI) 212-15 from the signals. The output of the phase interpolator (PI) 211-8 and the output of the phase interpolator (PI) 211-1 are input to the phase interpolator (PI) 212-16. The phase interpolator (PI) 212-16 outputs a signal P15 delayed by a fixed delay time of the phase interpolator (PI) 212-16 from an intermediate timing of the signals from the signals.

Figure 13:
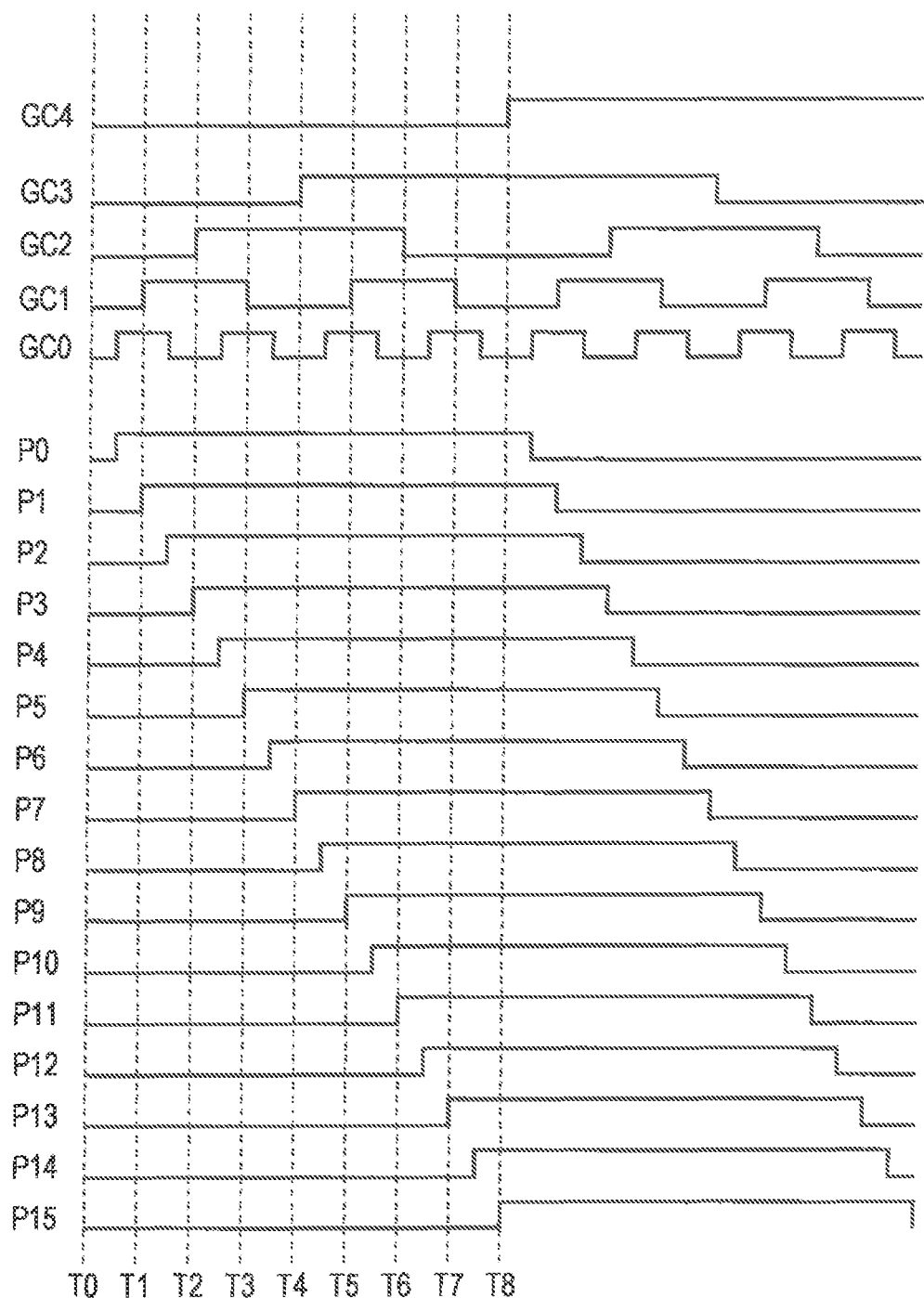
FIG. 13 is a timing chart illustrating an example of a situation of an operation of the high-resolution gray code generation circuit.

That is, as illustrated in FIG. 13, the phase interpolator (PI) 212-1 to the phase interpolator (PI) 212-16 can generate the signal P0 to the signal P15 (that is, 16-phase clock signals) of which phases are each shifted by a $\frac{1}{16}$ period. Hereinafter, when it is not necessary to distinguish the phase interpolator (PI) 212-1 to the phase interpolator (PI) 212-16 from each other, the phase interpolator (PI) 212-1 to the phase interpolator (PI) 212-16 are simply referred to as the phase interpolators 212.

The XOR 213-1 to the XOR 213-9 are circuits that each have two inputs and one output and perform an exclusive OR operation. The XOR 213-1 obtains an exclusive OR of the signals P0 and P2 and outputs the operation result. The XOR 213-2 obtains an exclusive OR of the signals P1 and P5 and outputs the operation result. The XOR 213-3 obtains an exclusive OR of the signals P3 and P11 and outputs the operation result. The XOR 213-4 obtains an exclusive OR of the signals P4 and P6 and outputs the operation result. The XOR 213-5 obtains an exclusive OR of the signal P7 and a constant potential (L) and outputs the operation result. The XOR 213-6 obtains an exclusive OR of the signals P8 and P10 and outputs the operation result. The XOR 213-7 obtains an exclusive OR of the signals P9 and P13 and outputs the operation result. The XOR 213-8 obtains an exclusive OR of the signal P12 and P14 and outputs the operation result. The XOR 213-9 obtains an exclusive OR of the signal P15 and the constant potential (L) and outputs the operation result. When it is not necessary to distinguish the XOR213-1 to the XOR 213-9 from each other, the XOR 213-1 to the XOR 213-9 are simply referred to as the XORs 213.

The AN D 214-1 to the AND 214-5 are circuits that each have four inputs and one output and perform a logical AND operation. The AND 214-1 obtains a logical AND of the output of the XOR 213-1, the output of the XOR 213-4, the output of the XOR 213-6, and the output of the XOR 213-8 and outputs the operation result as a least significant bit GC0 of the gray code. The AND 214-2 obtains a logical AND of a constant potential (H), a constant potential (H), the output of the XOR 213-2, and the output of the XOR 213-7 and outputs the operation result as a second bit GC1 from the low order of the gray code. The AND 214-3 obtains a logical AND of a constant potential (H), a constant potential (H), a constant potential (H), and the output of the XOR 213-3 and outputs the operation result as a third bit GC2 from the low order of the gray code. The AND 214-4 obtains a logical AND of a constant potential (H), a constant potential (H), a constant potential (H), and the output of the XOR 213-5 and outputs the operation result as a fourth bit GC3 from the low order of the gray code. The AND 214-5 obtains a logical AND of a constant potential (H), a constant potential (H), a constant potential (H), and the output of the XOR 213-9 and outputs the operation result as a most significant bit GC4 of the gray code.

The AND 214-1 to the AND 214-5 generate the 5-bit gray codes (GC0 to GC4), as illustrated in FIG. 13. When it is not necessary to distinguish the AND 214-1 to the AND 214-5 from each other, the AND 214-1 to the AND 214-5 are simply referred to as the ANDs 214.

As described above, the high-resolution gray code generation circuit 200 uses the phase-difference clock generation circuit to which the present disclosure is applied to generate the 4-phase clock signals from the clock signals SLCK and uses the gray code generation circuit 202 to convert the 4-phase clock signals into the gray codes. Accordingly, as illustrated in FIG. 13, the high-resolution gray code generation circuit 200 can generate the gray codes (that is, high-resolution gray codes) (GC0 to GC3) with a higher frequency component than the signals P0 to P15 with the same frequency as the clock signal SLCK.

When the gray code is generated from the clock signal SLCK, the frequency of the clock signal SLCK has to be raised to generate a higher-resolution gray code. However, in the case of a general circuit, since the clock signal SLCK is used in other circuits, there is a concern that design may be difficult. Further, even when the frequency of the clock signal SLCK is raised, there is a concern that power consumption may be considerably increased. A method of generating a high-frequency clock signal dedicated for the high-resolution gray code generation circuit 200 from the clock signal SLCK can be considered. However, in this case, a PLL is generally used. For this reason, there is a concern that a circuit size or power consumption may be increased.

In contrast, the high-resolution gray code generation circuit 200 can generate the high-resolution gray codes using the phase interpolators and the logic circuits without the raising of the frequency of the clock signal SLCK and use of a PLL or the like. That is, the high-resolution gray code generation circuit 200 can achieve the high resolution of the generated gray codes more easily. The high-resolution gray code generation circuit 200 can reduce the power consumption than when a PLL is used, since no PLL is used. The high-resolution gray code generation circuit 200 can be realized with a simpler configuration than when a PLL is used, and thus the circuit size (area) can be further reduced. Accordingly, the high-resolution gray code generation circuit 200 can improve the degree of freedom of circuit arrangement further than when a PLL is used.

The case in which the 4-phase clock generation circuit 201 is used has been described in FIG. 12. However, the high-resolution gray code generation circuit 200 can use a multi-phase clock generation circuit that generates clock signals with any number of phases to generate the gray codes. For example, in FIG. 12, an 8-phase clock generation circuit 221 including the 4-phase clock generation circuit 201 and the phase interpolators 211 generate 8-phase clock signals. That is, the high-resolution gray code generation circuit 200 may include the 8-phase clock generation circuit 221 and a gray code generation circuit 223 including the phase interpolators 212, the XORs 213, and the ANDs 214. For example, in FIG. 12, a 16-phase clock generation circuit 222 including the 4-phase clock generation circuit 201, the phase interpolators 211, and the phase interpolators 212 generates 16-phase clock signals. That is, the high-resolution gray code generation, circuit 200 may include the 16-phase clock generation circuit 222 and a gray code generation circuit 224 including the XORs 213 and the ANDs 214.

Any configuration of the phase interpolators and the logic circuits of the gray code generation circuit 202 (also including the gray code generation circuit 223 and the gray code generation circuit 224) can be realized and the present technology is not limited to the example of FIG. 12. For example, NAND gates performing a NOT-AMD operation may be used instead of the XORs 213.

Any number of bits of the gray codes generated by high-resolution gray code generation circuit 200 can be used and the present technology is not limited to five bits in the example of FIG. 12. For example, the high-resolution gray code generation circuit 200 may generate gray codes of 6 bits or more or may generate gray codes of 4 bits or less. In this case, the configurations of the phase interpolators and the logic circuits in the gray code generation circuit 202 may be properly set so that gray codes of a desired number of bits can be generated from the 4-phase clock signals generated by the 4-phase clock generation circuit 201 from the clock signals SLCK.

[High-Resolution Gray Code Generation Circuit-2]

Figure 14:
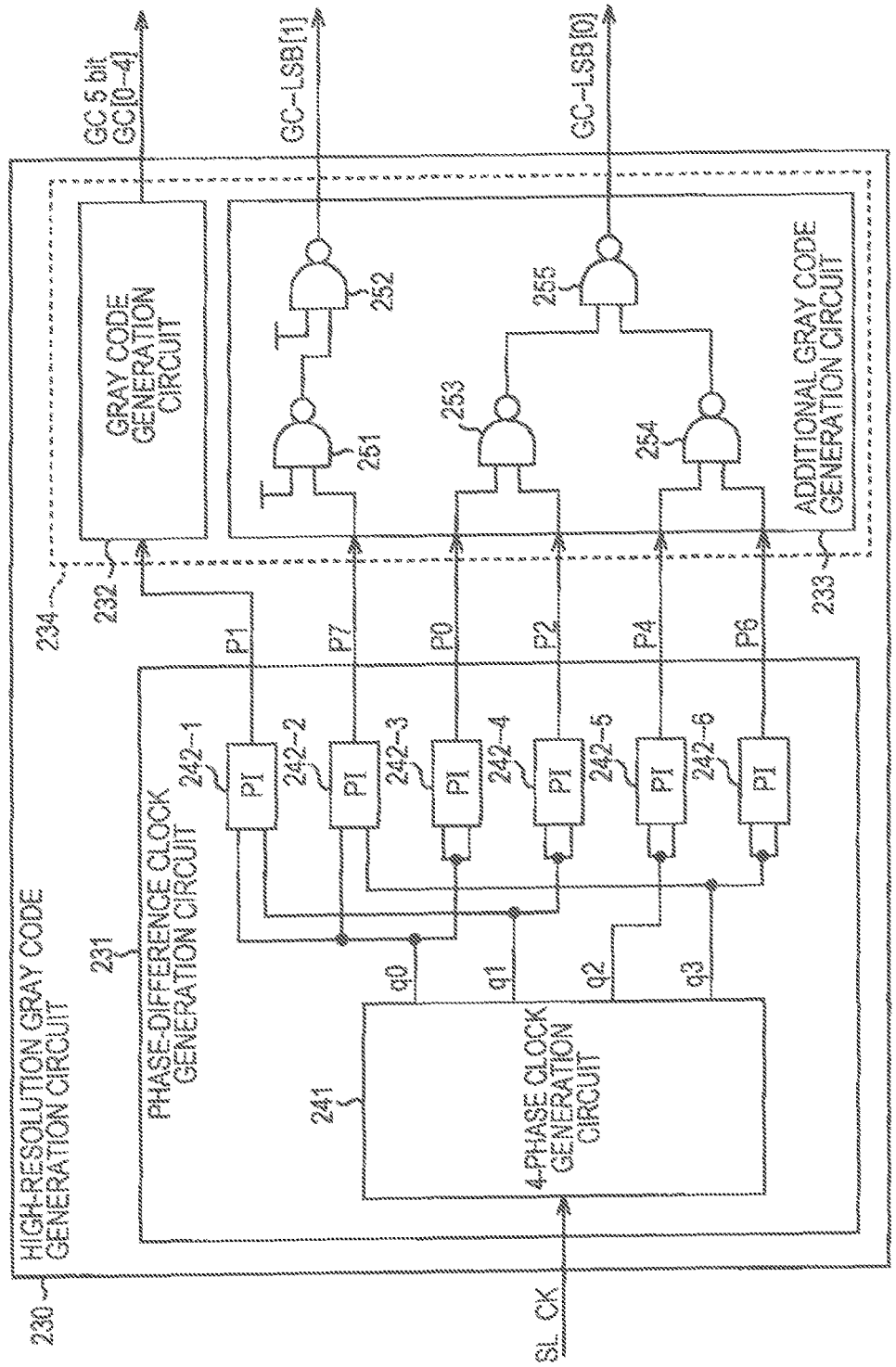
FIG. 14 is a diagram illustrating another example of the configuration of the high-resolution gray code generation circuit.

FIG. 14 is a diagram illustrating an example of a main configuration of a high-resolution gray code generation circuit which is an example of the gray code generation device to which the present technology is applied. A high-resolution gray code generation circuit 230 illustrated in FIG. 14 generates gray codes (that is, high-resolution gray codes) with a higher frequency component than the frequency of an input clock signal SLCK from the clock signal SLCK.

As illustrated in FIG. 14, the high-resolution gray code generation circuit 230 includes a phase-difference clock generation circuit 231 and a gray code generation circuit 234.

Figure 15:
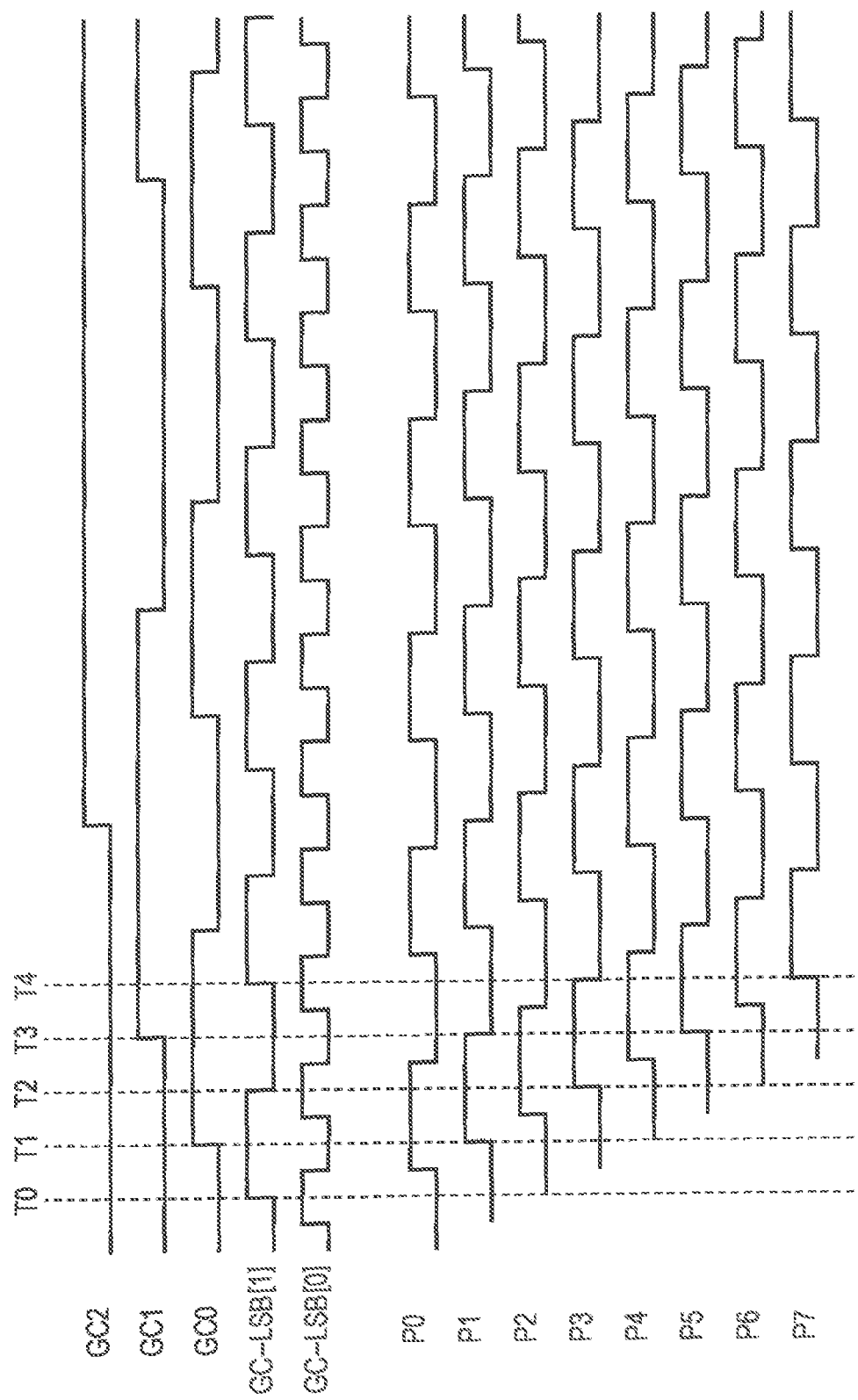
FIG. 15 is a timing chart illustrating another example of a situation of an operation of the high-resolution gray code generation circuit.

The phase-difference clock generation circuit 231 is an example of the phase-difference clock generation circuit to which the present technology is applied and generates some of the 8-phase clock signals of which phases are each shifted by a ⅛ period from the input clock signal SLCK. More specifically, the phase-difference clock generation circuit 231 generates a signal P0, a signal P1, a signal P2, a signal P4, a signal P6, and a signal P7 among signals P0 to signals P7 of which the phases are each shifted by the ⅛ period, as illustrated in FIG. 15.

As illustrated in FIG. 14, the phase-difference clock generation circuit 231 includes a 4-phase clock generation circuit 241 and a phase interpolator (PI) 242-1 to a phase interpolator (PI) 242-6.

The 4-phase clock generation circuit 241 is a circuit that has the same configuration as the 4-phase clock generation circuit 100 (see FIG. 5) described in the first embodiment and performs the same process. The 4-phase clock generation circuit 241 generates 4-phase clock signals (a clock signal q0, a clock signal q1, a clock signal q2, and a clock signal q3) from the input clock signal SLCK and supplies the 4-phase clock signals to the phase interpolator (PI) 242-1 to the phase interpolator (PI) 242-6.

The phase interpolator (PI) 242-1 to the phase interpolator (PI) 242-6 are circuits that have the same configuration as the phase interpolators 102 (see FIG. 5) described in the first embodiment and perform the same process.

The clock signals q0 and q1 output from the 4-phase clock generation circuit 241 are input to the phase interpolator (PI) 242-1. The phase interpolator (PI) 242-1 outputs a signal P1 delayed by a fixed delay time of the phase interpolator (PI)

242-1 from an intermediate timing of the signals from, the signals. The clock signals q3 and q0 output from the 4-phase clock generation circuit 241 are input to the phase interpolator (PI) 242-2. The phase interpolator (PI) 242-2 outputs a signal P7 delayed by a fixed delay time of the phase interpolator (PI) 242-2 from an intermediate timing of the signals from the signals. The clock signal q0 output from the 4-phase clock generation circuit 241 is input to both of the input terminals of the phase interpolator (PI) 242-3. The phase interpolator (PI) 242-3 outputs a signal p0 delayed by a fixed delay time of the phase interpolator (PI) 242-3 from the signals.

The clock signal q1 output from the 4-phase clock generation circuit 241 is input to both of the input terminals of the phase interpolator (PI) 242-4. The phase interpolator (PI) 242-4 outputs a signal P2 delayed by a fixed delay time of the phase interpolator (PI) 242-4 from the signals. The clock signal q2 output from the 4-phase clock generation circuit 241 is input to both of the input terminals of the phase interpolator (PI) 242-5. The phase interpolator (PI) 242-5 outputs a signal P4 delayed by a fixed delay time of the phase interpolator (PI) 242-5 from the signals. The clock signal q3 output from the 4-phase clock generation circuit 241 is input to both of the input terminals of the phase interpolator (PI) 242-6. The phase interpolator (PI) 242-6 outputs a signal P6 delayed by a fixed delay time of the phase interpolator (PI) 242-6 from the signals.

Hereinafter, when it is not necessary to distinguish the phase interpolator (PI) 242-1 to the phase interpolator (PI) 242-6 from each other, the phase interpolator (PI) 242-1 to the phase interpolator (PI) 242-6 are simply referred to as the phase interpolators 242. As illustrated in FIG. 15, the signals P0 to P7 have the same period while the phases thereof are different from each other (are the same as the clock signals SLCK).

The gray code generation circuit 234 generates high-resolution gray codes from the multi-phase clock signals (the signal P0, the signal P1, the signal P2, the signal P4, the signal P6, and the signal P7) generated in the phase-difference clock generation circuit 231 and outputs the high-resolution gray codes. As illustrated in FIG. 14, the gray code generation circuit 234 includes a gray code generation circuit 232 and an additional gray code generation circuit 233.

The gray code generation circuit 232 generates 5-bit gray codes (GC [0 to 4]) from the signal P1 and outputs the 5-bit gray codes. Low-order 3 bits (GC0 to GC2) of the gray codes are illustrated in FIG. 15. The signal P1 has a different phase from that of the clock signal SLCK while the period thereof is not changed. That is, the gray code generation circuit 232 can be realized by a general gray code generation circuit that generates gray codes from the clock signal SLCK. Accordingly, the gray code generation circuit 232 has any configuration. For example, the gray code counter described in PTL 1 illustrated in FIG. 3 may be used.

The additional gray code generation circuit 233 generates 2-bit gray codes (GC-LSB[0] and GC-LSB[1]) lower than the gray codes (GC[0 to 4]) generated by the gray code generation circuit 232 from the signals P7, P0, P2, P4 and P6 and outputs the gray codes. Examples of the gray codes (GC-LSB[0] and GC-LSB[1]) are illustrated in FIG. 15. That is, the additional gray code generation circuit 233 generates gray codes (that is, high-resolution gray codes) with a higher frequency component than the frequency of the clock signal SLCK input to the high-resolution gray code generation circuit 230.

As illustrated in FIG. 14, the additional gray code generation circuit 233 includes five NAND gates (a NAND 251 to a NAND 255). Each of the NAND 251 to the NAND 255 is a circuit that has two inputs and one output and performs a NOT-AND operation. The NAND 251 obtains a NOT-AND of a constant potential (H) and the signal P7 and outputs the operation result. The NAND 252 obtains a NOT-AND of a constant potential (H) and the output of the NAND 251 and outputs the operation result as the second bit GC-LSB[1] from the low order of the gray code. The NAND 253 obtains a NOT-AND of the signal P0 and the signal P2 and outputs the operation result. The NAND 254 obtains a NOT-AND of the signal P4 and the signal P6 and outputs the operation result. The NAND 255 obtains a NOT-AND of the output of the NAND 253 and the output of the NAND 254 and outputs the operation result as the least significant bit GC-LSB[0] of the gray code.

As described above, the high-resolution gray code generation circuit 230 uses the phase-difference clock generation circuit to which the present technology is applied to generate some of the 8-phase clock signals from the clock signals SLCK, and uses the gray code generation circuit 234 to convert some of the 8-phase clock signals into the gray codes. Accordingly, the high-resolution gray code generation circuit 230 can generate the gray codes (that is, the high-resolution gray codes) (GC-LSB[1] and GC-LSB[1]) with the higher frequency component than that of the signals P0 to P7 with the same frequency as that of the clock signal SLCK, as illustrated in FIG. 15.

The high resolution gray code generation circuit 230 can generate the high-resolution gray codes using the phase in interpolators and the logic circuits without the raising of the frequency of the clock signal SLCK and use of a PLL or the like. That is, the high-resolution gray code generation circuit 230 can achieve the high resolution of the generated gray codes more easily. The high-resolution gray code generation circuit 230 can reduce the power consumption than when a PLL is used, since so PLL is used. Thus, the circuit size (area) can be further reduced.

As illustrated in FIG. 14, the high-resolution gray code generation circuit 230 uses the phase-difference clock generation circuit to which the present technology is applied to generate some of the 8-phase clock signals. Thus, since the additional gray code generation circuit 233 including the NAND gates is merely added to the general gray code generation circuit 232, it is possible to realize the high resolution of the gray codes. That is, the high-resolution gray code generation circuit 230 can be designed easily, and thus an increase in development cost can be suppressed.

Any number of bits of the gray codes generated by the high-resolution gray code generation circuit 230 can be used. The configuration of the phase interpolators or the like in the phase-difference clock generation circuit 231 or the configuration of the logic circuits in the additional gray code generation circuit 233 may be properly set according to the number of bits of the low-order bits (the gray codes with the higher frequency component than the frequency of the clock signal SLCK) of the generated gray codes.

4. Third Embodiment

[A/D Conversion Circuit-1]

The present technology can also be applied to a circuit or a device in addition to the gray code generation circuit described in the second embodiment. For example, the high-resolution gray code generation circuit described in the second embodiment may be applied to an A/D conversion device.

Figure 16:
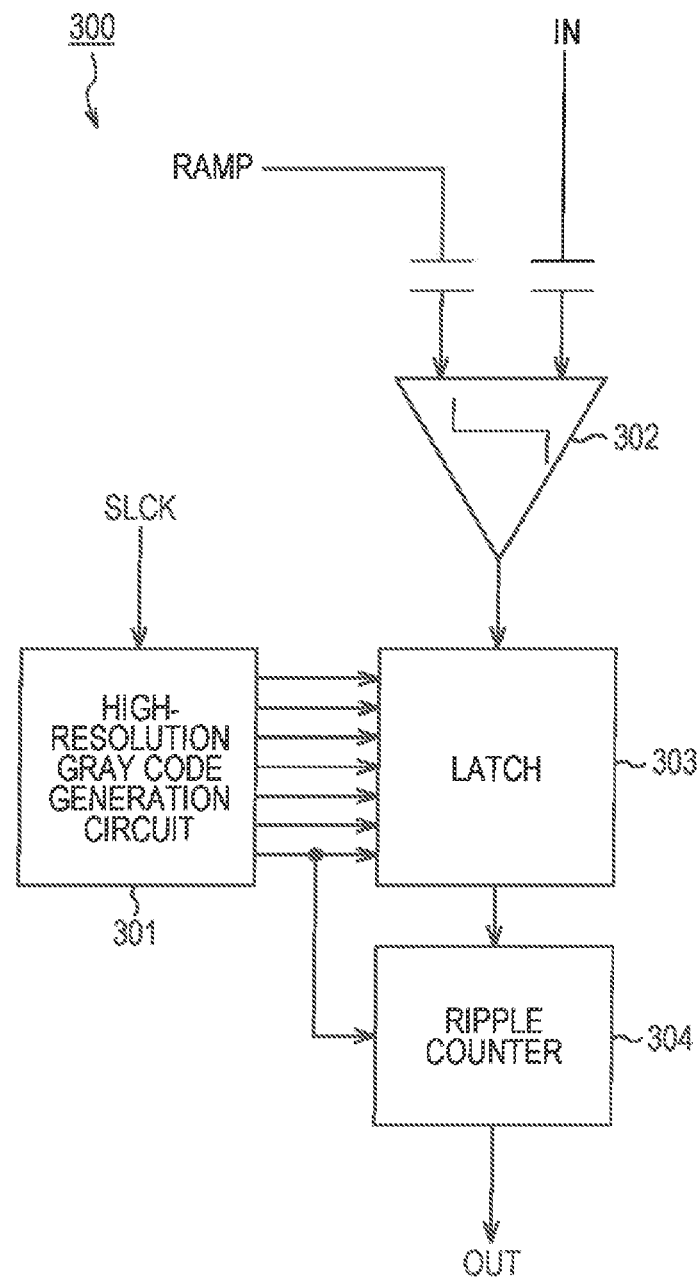
FIG. 16 is a diagram illustrating an example of a main configuration of an A/D conversion circuit.

FIG. 16 is a diagram illustrating an example of a main configuration of an A/D conversion circuit which is an example of an A/D conversion device to which the present technology is applied. The A/D conversion circuit is a circuit that converts an input analog signal into a digital signal indicating its signal level. An A/D conversion circuit 300 illustrated in FIG. 16 compares the signal level of an input analog signal IN and the signal level of a reference voltage RAMP of a ramp wave of which a signal level is linearly changed over time. The A/D conversion circuit 300 measures the duration of a time until the comparison result is changed and outputs a measured value (digital value) as the signal level of the input analog signal IN. That is, the A/D conversion circuit 300 is an integral type A/D conversion circuit.

As illustrated in FIG. 16, the A/D conversion circuit 300 includes a high-resolution gray code generation circuit 301, a comparison circuit 302, a latch 303, and a ripple counter 304.

The high-resolution gray code generation circuit 301 generates gray code (that is, high-resolution gray codes) with a higher frequency component than the frequency of an input clock signal SLCK from the clock signal SLCK. For example, the high-resolution gray code generation circuit 301 generates 7-bit gray codes including two bits of the higher frequency component higher than the frequency of the clock signal SLCK from the clock signal SLCK. The high-resolution gray code generation circuit 301 supplies the generated gray codes to the latch 303.

The high-resolution gray code generation circuit 301 is a circuit that has the same configuration as the high-resolution gray code generation circuit 200 (see FIG. 12) or the high-resolution gray code generation circuit 230 (see FIG. 14) described in the second embodiment and performs the same process. That is, the gray code generation device to which the present technology is applied is applied to the high-resolution gray code generation circuit 301.

The comparison circuit 302 compares the signal level of the input analog signal IN with the signal level of the reference voltage RAMP of the ramp wave and supplies the comparison result to the latch 303.

The latch 303 obtains and latches the gray codes supplied from the high-resolution gray code generation circuit 301 at a timing at which the comparison result of the comparison circuit 302 is changed. The latch 303 supplies the latched gray code as a low-order bit of a digital value indicating the signal level of the input analog signal IN to the ripple counter 304.

The ripple counter 304 is formed as, for example, an up-down counter, counts timings of falling of the most significant bit of the gray code, and sets the count value as a high-order bit of a digital value indicating the signal level of the input analog signal IN. The ripple counter 304 sets the high-order bit and the low-order bit supplied from the latch 303 as digital values indicating the signal level of the input analog signal IN and outputs the digital values.

As described above, the A/D conversion circuit 300 uses the gray code generation device to which the present technology is applied to generate the high-resolution gray codes and performs the A/D conversion using the gray codes. Accordingly, the A/D conversion circuit 300 can raise the resolution of the A/D conversion without the raising of the frequency of the clock signal SLCK and use of a PLL or the like further than when the A/D conversion is performed using the count value of the clock signal SLCK. That is, the A/D conversion circuit 300 can realize the high resolution of the A/D conversion more easily.

In other words, the A/D conversion circuit 300 can operate at a higher speed with respect to the clock signal SLCK. That is, the A/D conversion circuit 300 can achieve the high speed of the A/D conversion without the raising of the frequency of the clock signal SLCK and use of a PLL or the like further than when the A/D conversion is performed using the count value of the clock signal SLCK. That is, the A/D conversion circuit 300 can realize the high speed of the A/D conversion more easily.

The A/D conversion circuit 300 can realize both of high resolution and high speed of the A/D conversion of the clock signal SLCK more easily without the raising of the frequency of the clock signal SLCK and use of a PLL or the like. That is, the A/D conversion circuit 300 can achieve the high speed of the A/D conversion, or the high resolution, or both of the high, speed and the high resolution more easily.

The A/D conversion circuit 300 can operate at a higher speed with respect to the clock signal SLCK. Therefore, by setting the resolution and the processing speed of the A/D conversion to be the same as those of the case in which the clock signal SLCK is counted, it is possible to reduce the frequency of the clock signal SLCK further than when the A/D conversion is performed using the count value of the clock signal SLCK. That is, the A/D conversion circuit 300 can reduce power consumption further than when the clock signal SLCK is counted.

Since the gray code generation device to which the present technology is applied is used, the A/D conversion circuit 300 can perform the A/D conversion using the high-resolution gray codes using the phase interpolators and the logic circuit without using a PLL or the like. Accordingly, the A/D conversion circuit 300 can perform the A/D conversion with a simpler configuration than when a PLL is used to generate the high-resolution gray code, and thus the circuit size (area) can be further reduced. Accordingly, the A/D conversion circuit 300 can improve the degree of freedom of circuit arrangement. Since the A/D conversion circuit 300 does not use a PLL, it is possible to reduce power consumption further than when a PLL is used.

5. Fourth Embodiment

[Imaging Element-1]

In the present technology, for example, the gray code generation circuit described in the second embodiment may be applied to an imaging element.

Figure 17:
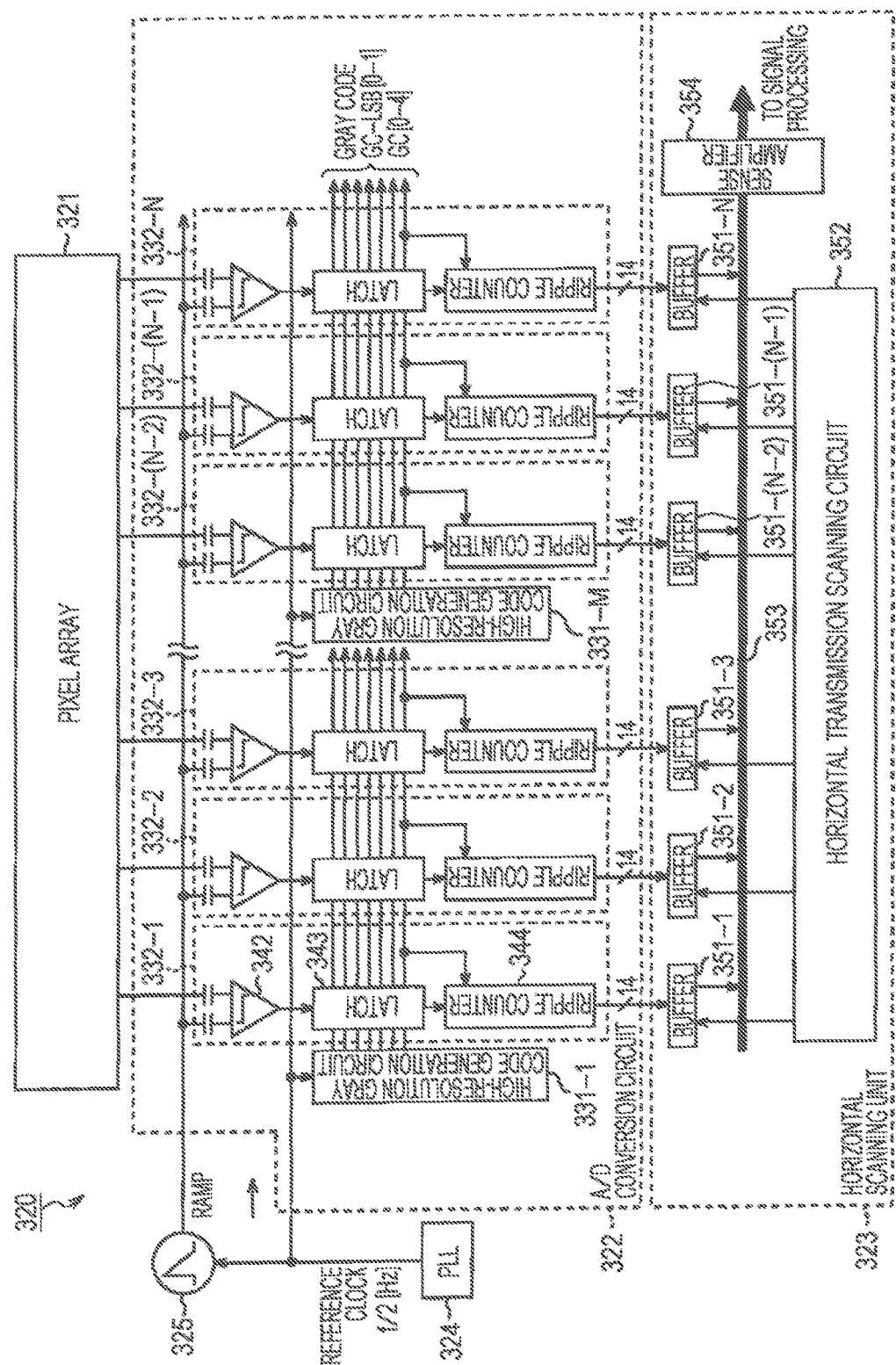
FIG. 17 is a diagram illustrating an example of a main configuration of an imaging element.

FIG. 17 is a diagram illustrating an example of a main configuration of an imaging element to which the present technology is applied. An imaging element 320 illustrated in FIG. 17 is an element that images a subject and obtains digital data of a captured image. As illustrated in FIG. 17, the imaging element 320 includes a pixel array 321, an A/D conversion circuit 322, a horizontal scanning unit 323, a PLL 324, and a ramp generation circuit 325.

The pixel array 321 is an array in which a plurality of unit pixels that each include a photoelectric conversion element photoelectrically converting incident light are arranged. A pixel signal read from each unit pixel is transmitted to the A/D conversion circuit 322 via a vertical signal line connecting pixel columns. Each unit pixel is connected to a column selection line (not illustrated) connecting pixel rows and an operation of each unit pixel is controlled by a row scanning circuit (not illustrated) via the row selection line.

The A/D conversion circuit 322 performs A/D conversion on the pixel signal supplied for each column of the unit pixels of the pixel array 321. The A/D conversion circuit 322 includes a high-resolution gray code generation circuit 331-1 to a high-resolution gray code generation circuit 331-M and a column A/D conversion circuit 332-1 to a column A/D conversion circuit 332-N.

The high-resolution gray code generation circuit 331-1 to the high-resolution gray code generation circuit 331-M have the same configuration and perform the same process. Hereinafter, when it is not necessary to distinguish the high-resolution gray code generation circuit 331-1 to the high-resolution gray code generation circuit 331-M from each other, the high-resolution gray code generation circuit 331-1 to the high-resolution gray code generation circuit 331-M are simply referred to as the high-resolution gray code generation circuits 331. The column A/D conversion circuit 332-1 to the column A/D conversion circuit 332-N have the same configuration and perform the same process. Hereinafter, when it is not necessary to distinguish the column A/D conversion circuit 332-1 to the column A/D conversion circuit 332-N from each other, the column A/D conversion circuit 332-1 to the column A/D conversion circuit 332-N are simply referred to as the column A/D conversion circuits 332.

The high-resolution gray code generation circuits 331 each generate a gray code (that is, a high-resolution gray code) with a higher frequency component than the frequency of an input reference clock (f/2) from the reference clock (f/2). The high-resolution gray code generation circuit 331 is installed for each predetermined number of rows (N/M rows) of the unit pixels of the pixel array 321. That is, the A/D conversion circuit 322 includes M high-resolution gray code generation circuits 331. The high-resolution gray code generation circuit 331 supplies the generated gray code to the column A/D conversion circuit 332 (the latch 343 of the column A/D conversion circuit 332) corresponding to the column corresponding to the high-resolution gray code generation circuit 331.

The high-resolution gray code generation circuit 331 is a circuit that has the same configuration as the high-resolution gray code generation circuit 200 (see FIG. 12) or the high-resolution gray code generation circuit 230 (see FIG. 14) described in the second embodiment and performs the same process.

The column A/D conversion circuit 332 is installed at each column of the unit pixels of the pixel array 321. That is, the A/D conversion circuit 322 includes N column A/D conversion circuits 332. The column A/D conversion circuit 332 performs the A/D conversion on the pixel signal (analog signal) supplied from the unit pixel of the column corresponding to the column A/D conversion circuit 332, outputs digital data indicating a signal level of each pixel signal, and supplies the digital data to the horizontal scanning unit 323 (a buffer 351 of the horizontal scanning unit 323).

The column A/D conversion circuit 332 is a circuit that has the same configuration as the A/D conversion circuit 300 (see FIG. 16) described in the third embodiment, excluding the high-resolution gray code generation circuit 301 thereof and performs the same process. That is, as illustrated in FIG. 17, the column A/D conversion circuit 332 includes comparison circuits 342, latches 343, and ripple counters 344.

The comparison circuit 342 is a circuit that has the same configuration as the comparison circuit 302 (see FIG. 16) described in the third embodiment and performs the same process. That is, the comparison circuit 342 compares a signal level of the pixel signal of the column corresponding to the comparison circuit 342 with a signal level of a reference voltage RAMP of a ramp wave supplied from the ramp generation circuit 325 and supplies the comparison result to the latch 343.

The latch 343 is a circuit that has the same configuration as the latch 303 (see FIG. 16) described in the third embodiment and performs the same process. That is, the latch 343 obtains and latches the gray code supplied from the high-resolution gray code generation circuit 331 corresponding to the latch 343 at a timing at which the comparison result of the comparison circuit 342 is changed. The latch 343 supplies the latched gray code as a low-order bit of the digital value indicating the signal level of the pixel signal of the column corresponding to the latch 343 to the ripple counter 344.

The ripple counter 344 is a circuit that has the same configuration as the ripple counter 304 (see FIG. 16) described in the third embodiment and performs the same process. That is, the ripple counter 344 is formed as, for example, an up-down counter, counts timings of falling of the most significant bit of the gray code, and sets the count value as a high-order bit of the digital value indicating the signal level of the pixel signal. The ripple counter 344 sets the high-order bit and the low-order bit supplied from the latch 343 as digital values indicating the signal level of the column corresponding to the ripple counter 344 and outputs the digital values.

That is, each column A/D conversion circuit 332 has the same configuration as the A/D conversion circuit 300 (see FIG. 16) described in the third embodiment and performs the same process by adding the high-resolution gray code generation circuit 331 corresponding to the column A/D conversion circuit 332. That is, in the imaging element 320, the A/D conversion device to which the present technology is applied is applied as the column A/D conversion circuits 332 and the high-resolution gray code generation circuits 331.

The horizontal scanning unit 323 sequentially outputs the digital data of the pixel signals of the respective columns of the unit pixels of the pixel array 321 supplied from the A/D conversion circuits 322 to the outside of the imaging element 320. As illustrated in FIG. 17, the horizontal scanning unit 323 includes a buffer 351-1 to a buffer 351-N, a horizontal transmission scanning circuit 352, a transmission bus 353, and a sense amplifier 354.

The buffer 351-1 to the buffer 351-N have the same configuration and perform the sane process. Hereinafter, when it is not necessary to distinguish the buffer 351-1 to the buffer 351-N from each other, the buffer 351-1 to the buffer 351-N are simply referred to as the buffers 351.

The buffer 351 is installed at each column of the unit pixels of the pixel array and temporarily retains the digital data output from the column A/D conversion circuit 332 corresponding to the buffer 351. For example, the buffer 351-1 retains the digital data output from the column A/D conversion circuit 332-1. For example, the buffer 351-N retains the digital data output from the column A/D conversion circuit 332-N. The buffers 351 output the retained data to the transmission bus 353 under the control of the horizontal transmission scanning circuit 352.

The horizontal transmission scanning circuit 352 controls an output timing of the digital data retained in each buffer 351, i.e., a transmission timing of the digital data of each column. That is, each buffer 351 outputs the retained data to the transmission bus 353 at a timing designated by the horizontal transmission scanning circuit 352. The digital data of the respective columns are sequentially transmitted under the control of the horizontal transmission scanning circuit 352.

The transmission bus 353 sequentially transmits the digital data output from the respective buffers 351 to the sense amplifiers 354. The sense amplifier 354 amplifies the digital data of each column supplied via the transmission bus 353 and outputs the amplified digital data to the outside of the imaging element 320 (for example, a rear-stage processing unit performing signal processing or the like). The PLL 324 generates a reference clock with a frequency of f/2 [Hz]. The PLL 324 supplies the generated reference clock (f/2) to the A/D conversion circuit 322 (each high-resolution gray code generation circuit 331) and the ramp generation circuit 325. The ramp generation circuit 325 generates a reference voltage RAMP of a ramp waveform of which a voltage value is linearly changed over time, using the reference clock (f/2) supplied from the PLL 324. The ramp generation circuit 325 supplies the generated reference voltage RAMP to the A/D conversion circuit 322 (the comparison circuit 342 of each column A/D conversion circuit 332 of the A/D conversion circuit 322).

[Configuration of Unit Pixel]

Figure 18:
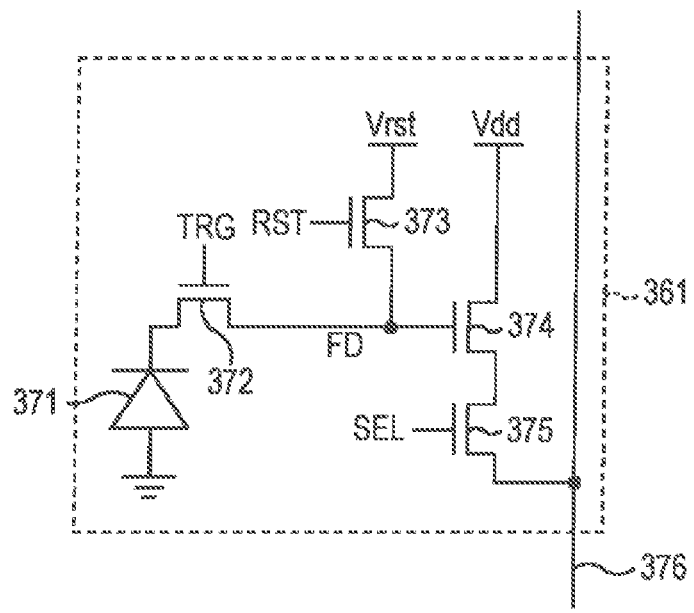
FIG. 18 is a diagram illustrating an example of a main configuration of a unit pixel.

FIG. 18 is a diagram illustrating an example of the configuration of the unit pixel of the pixel array 321 in FIG. 17. As illustrated in FIG. 18, a unit pixel 361 includes four transistors, e.g., a read transistor 372, a reset transistor 373, an amplification transistor 374, and a select transistor 375, in addition to, for example, a photodiode 371 which is a photoelectric conversion portion (light reception portion).

Here, for example, N-channel MOS (Metal Oxide Semiconductor) transistors are used as the four transistors (the read transistor 372 to the select transistor 375). However, the conductive combination of the read transistor 372, the reset transistor 373, the amplification transistor 374, and the select transistor 375 exemplified here is merely an example and the present technology is not limited to this combination.

In the unit pixel 361, for example, three driving wirings (not illustrated), i.e., a transmission line, a reset line, and a select line, are installed as column select lines commonly for each pixel of the same pixel row. One end of each of the transmission line, the reset line, and the select line is connected to an output end corresponding to each pixel row of a row scanning circuit (not illustrated) in units of pixel rows, and thus the transmission line, the reset line, and the select line transmit a transmission pulse TRG, a reset pulse RST, and a select pulse SEL which are driving signals for driving the unit pixel.

An anode electrode of the photodiode 371 is connected to a negative-side power source (for example, ground), and thus the photodiode 371 photoelectrically converts received light into light charge (here, photoelectrons) of a charge amount according to an amount of the light and stores the light charge. A cathode electrode of the photodiode 371 is electrically connected to a gate electrode of the amplification transistor 374 via the read transistor 372. A node electrically connected to the gate electrode of the amplification transistor 374 is referred to as an FD (Floating Diffusion).

The read transistor 372 is connected between the cathode electrode of the photodiode 371 and the gate electrode (that is, the FD) of the amplification transistor 374. The transmission pulse TRF which is active (hereinafter also referred to as "High active") at a high-level (for example, a Vdd level) is provided to the gate electrode of the read transistor 372 via the transmission line. Thus, the read transistor 372 enters an ON state and transmits the light charge photoelectrically converted by the photodiode 371 to the floating diffusion (FD).

A drain electrode and a source electrode of the reset transistor 373 are connected to a pixel power source Vrst and the floating diffusion (FD), respectively. The High active reset pulse RST is provided to the gate electrode of the reset transistor 373 via the reset line. Thus, the reset transistor 373 enters an ON state and resets the floating diffusion (FD) by discarding the charge of the floating diffusion (FD) to the pixel power source Vrst.

A gate electrode and a drain electrode of the amplification transistor 374 are connected to the floating diffusion (FD) and a pixel power source Vdd, respectively. The amplification transistor 374 outputs the potential of the floating diffusion (FD) after the reset by the reset transistor 373 as a reset signal (reset level). The amplification transistor 374 outputs the potential of the floating diffusion (FD) after transmission of the signal charge by the read transistor 372 as an optical accumulation signal (signal level).

For example, a drain electrode and a source electrode of the select transistor 375 are connected to the source electrode of the amplification transistor 374 and a vertical signal line 376, respectively. A High active select pulse SEL is provided to the gate electrode of the select transistor 375 via the select line. Thus, the select transistor 375 enters an ON state and relays a signal output from the amplification transistor 374 to the vertical signal line 376 by setting the state of the unit pixel as a select state.

The select transistor 375 can also have a circuit configuration connected between the pixel power source Vdd and the drain of the amplification transistor 374.

The unit pixel is not limited to the unit pixel having the pixel configuration formed by the four transistors with the above-described configuration. For example, a pixel configuration formed by three transistors combining the amplification transistor 374 and the select transistor 375 may be used and any configuration of the pixel circuit can be adopted.

[Application of the Present Technology to Imaging Element-1]

Referring back to FIG. 17, the imaging element 320 having the above-described configuration uses the A/D conversion device to which the present technology is applied to perform the A/D conversion on the pixel signal of each column of the unit pixels of the pixel array 321. Accordingly, the imaging element 320 can raise the resolution of the A/D conversion further than when the A/D conversion is performed using the count value of the reference clock, without the raising of the frequency (f/2 [Hz]) of the reference clock and use of a PLL or the like for generating the clock signal with a higher frequency than the reference clock. That is, the imaging element 320 can realize the high resolution of the A/D conversion more easily. Accordingly, for example, the imaging element 320 can increase a bit depth of a captured image (image data) more easily. That is, the imaging element 320 can achieve the high resolution of a captured image more easily.

In other words, the imaging element 320 can operate at a higher speed with respect to the reference clock. That is, the imaging element 320 can achieve the high speed of the A/D conversion further than when the A/D conversion is performed using the count value of the reference clock, without the raising of the frequency (f/2 [Hz]) of the reference clock and use of a PLL or the like for generating the clock signal with a higher frequency than the reference clock. That is, the imaging element 320 can realize the high speed of the A/D conversion more easily. Accordingly, for example, the imaging element 320 can increase a frame rate of a captured image more easily. That is, the imaging element 320 can achieve high quality of a captured image more easily.

Further, the imaging element 320 can also realize both of the high resolution and the high speed of the A/D conversion more easily without the raising of the frequency (f/2 [Hz]) of the reference clock and use of a PLL or the like for generating the clock signal with a higher frequency than the reference clock. That is, the imaging element 320 can also achieve both of the increase in the bit depth of a captured image and an increase in the frame rate more easily without the raising of frequency (f/2 [Hz]) of the reference clock and use of a PLL or the like for generating the clock signal with a higher frequency than the reference clock. That is, the imaging element 320 can realize the high speed or the high resolution of the A/D conversion or both of the high speed and the high resolution more easily. Accordingly, for example, the imaging element 320 can achieve the increase in the bit depth of a captured image, an increase in the frame rate, or both of the increase in the bit depth and the increase in the frame rate more easily.

Since the imaging element 320 uses the A/D conversion device to which the present technology is applied, the imaging element 320 can perform the A/D conversion using the high-resolution gray codes without use of a PLL or the like by the phase interpolators and the logic circuits. Accordingly, the imaging element 320 can perform, the A/D conversion with a simpler configuration than when the high-resolution gray codes are generated using the PLL, and thus the circuit size (area) can be farther reduced. Accordingly, the imaging element 320 can improve the degree of freedom of circuit arrangement. Since the imaging element 320 does not use a PLL, it is possible to reduce power consumption further than when a PLL is used.

As illustrated in FIG. 17, the imaging element 320 includes the high-resolution gray code generation circuit 331 for each predetermined number of columns, and thus the high-resolution gray codes can be generated at positions close to the column A/D conversion circuits 332 using the gray codes. Therefore, skew adjustment of the reference clock can be performed easily, and the degree of freedom of design is improved. That is, the imaging element 320 can achieve the high speed or the high resolution of the A/D conversion or both of the high speed and the high resolution more easily.

Figure 19:
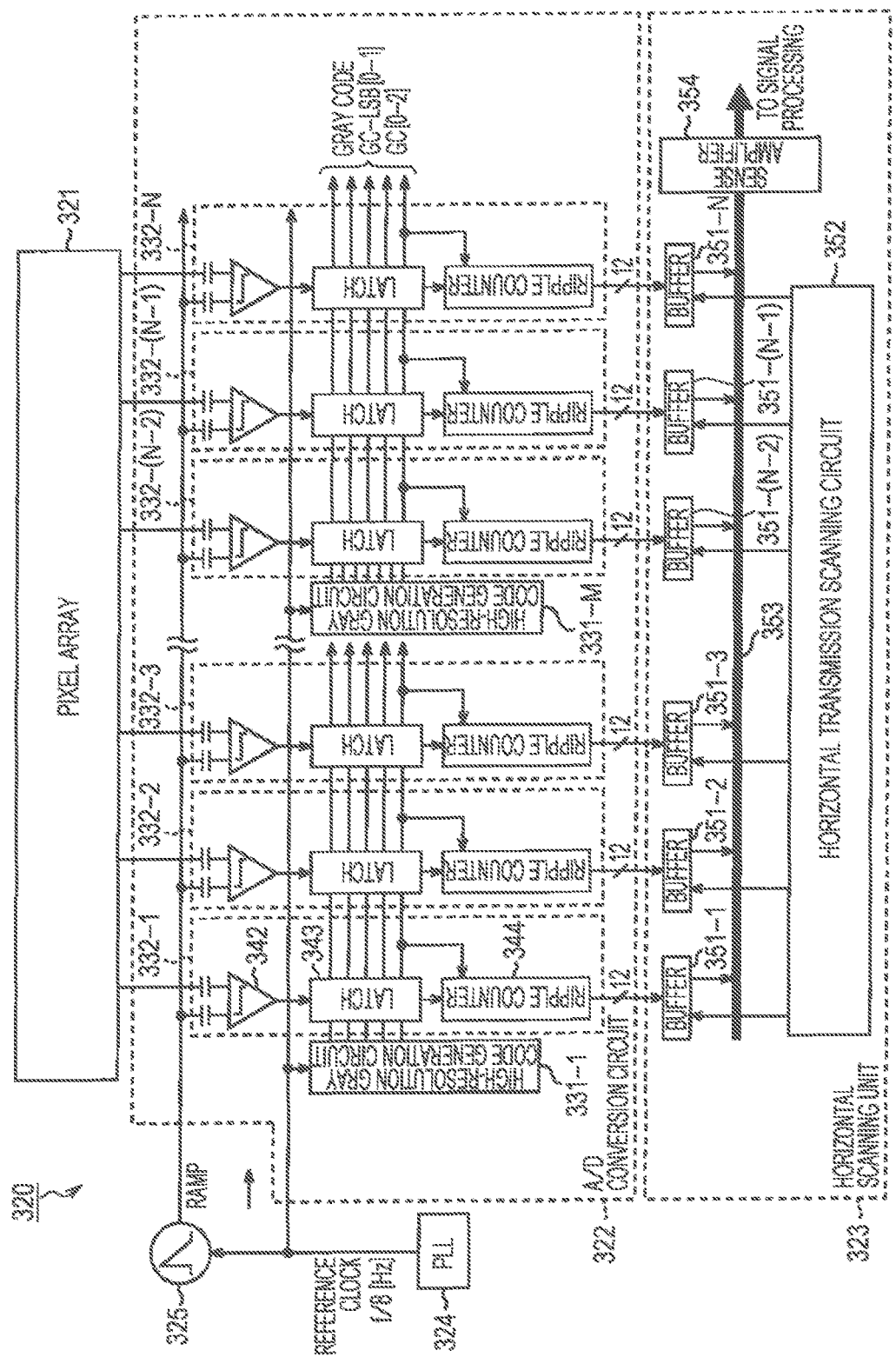
FIG. 19 is a diagram illustrating an example of a main configuration of an imaging element.

Since the column A/D conversion circuit 332 can operate at a higher speed with respect to the reference clock, the imaging element 320 can reduce the frequency of the reference clock signal (for example, to f/8 [Hz]) as in an example illustrated in FIG. 19, by setting the resolution and the processing speed of the A/D conversion to be the same as the resolution and the processing speed of the case in which the A/D conversion is performed using the count value of the reference clock. By doing so, the imaging element 320 can reduce power consumption further than in the case of the example of FIG. 17.

6. Fifth Embodiment

[A/D Conversion Circuit-2]
The phase-difference clock generation circuit to which the present technology is applied can also be applied to the gray code generation device. For example, the phase difference clock generation circuit to which the present technology is applied may be applied to an A/D conversion device.

Figure 20:
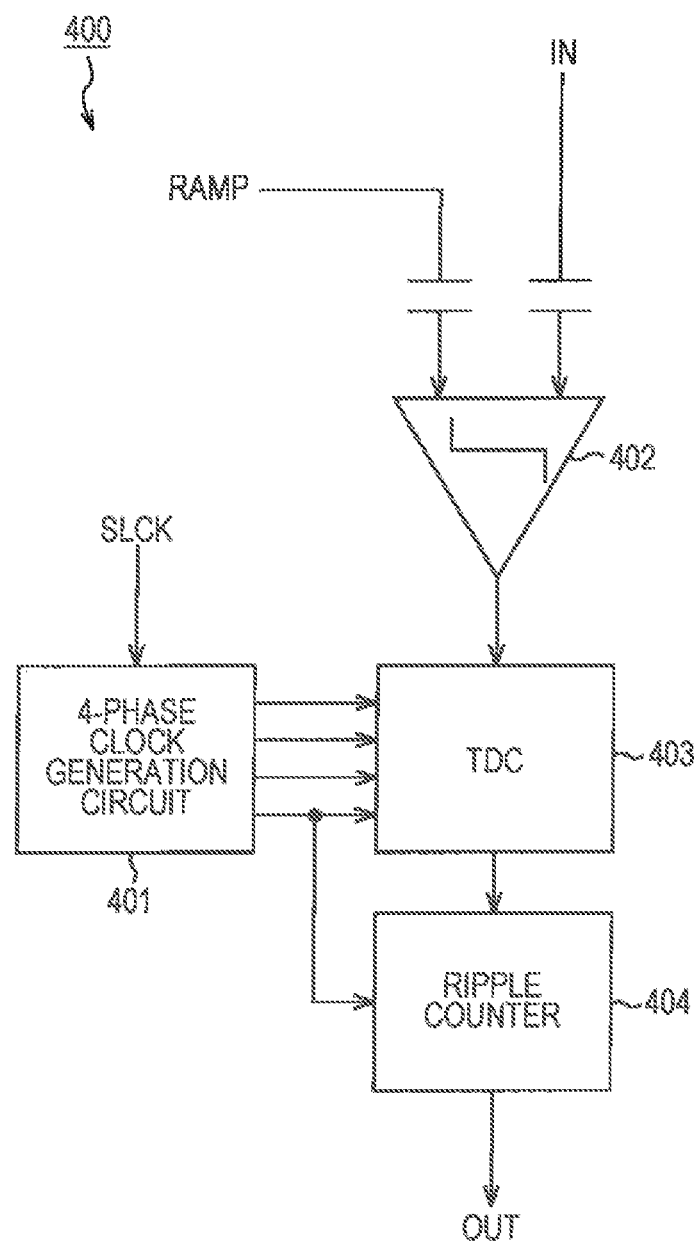
FIG. 20 is a diagram illustrating an example of a main configuration of an A/D conversion circuit.

FIG. 20 is a diagram illustrating an example of a main configuration of an A/D conversion circuit which is an example of the A/D conversion device to which the present technology is applied. An A/D conversion circuit 400 illustrated in FIG. 20 is an integral type A/D conversion circuit that performs basically the same A/D conversion as the A/D conversion circuit 300 (see FIG. 16). That is, the A/D conversion circuit 400 compares a signal level of an input analog signal IN with a signal level of a reference voltage RAMP of a ramp wave of which a signal level is linearly changed over time. The A/D conversion circuit 400 measures the duration of a time until the comparison result is changed and outputs a measured value (digital value) as the signal level of the input analog signal IN.

As illustrated in FIG. 20, the A/D conversion circuit 400 includes a 4-phase clock generation circuit 401, a comparison circuit 402, a TDC 403, and a ripple counter 404.

The 4-phase clock generation circuit 401 is a circuit that has the same configuration as the 4-phase clock generation circuit 100 (see FIG. 5) described in the first embodiment and performs the same process. That is, the 4-phase clock generation circuit 401 generates 4-phase clock signals from an input clock signal SLCK and supplies the 4-phase clock signals to the TDC 403.

The comparison circuit 402 is a circuit that has the same configuration as the comparison circuit 302 (see FIG. 16) and performs the same process. That is, the comparison circuit 402 compares the signal level of the input analog signal IN with the signal level of the reference voltage RAMP of the ramp wave and supplies the comparison result to the TDC 403.

The TDC (Time-to-Digital Converter) 403 is a time quantizer, obtains and latches the 4-phase clock signals supplied from the 4-phase clock generation circuit 401 at a timing at which the comparison result of the comparison circuit 402 is changed, obtains low-order bits of digital values indicating the signal level of the input analog signal IN by decoding the 4-phase clock signals, and supplies the low-order bits to the ripple counter 404.

The ripple counter 404 is a circuit that has the same configuration as the ripple counter 304 (see FIG. 16) and performs the same process. That is, the ripple counter 404 is formed as, for example, an up-down counter, counts timings of falling of one of the 4-phase clock signals, and sets the count value as a high-order bit of a digital value indicating the signal level of the input analog signal IN. The ripple counter 404 sets the high-order bit and the low-order bits supplied from the TDC 403 as digital values indicating the signal level of the input analog signal IN and outputs the digital values.

As described above, the A/D conversion circuit 400 uses the phase-difference clock generation circuit to which the present technology is applied to generate the phase-difference clock signals (multi-phase clock signals) and performs the A/D conversion using the phase-difference clock signals (multi-phase clock signals). Accordingly the A/D conversion circuit 400 can raise the resolution of the A/D conversion further than when the A/D conversion is performed using the count value of the clock signal SLCK, without the raising of the frequency of the clock signal SLCK and use of a PLL or the like, as in the case of the A/D conversion circuit 300 using the gray code generation device to which the present technology is applied. That is, the A/D conversion circuit 400 can realize the high resolution of the A/D conversion more easily.

In other words, the A/D conversion circuit 400 can operate at a higher speed with respect to the clock signal SLCK, as in the case of the A/D conversion circuit 300 using the gray code generation device to which the present technology is applied. That is, the A/D conversion circuit 400 can achieve the higher speed of the A/D conversion than when the A/D conversion is performed using the count value of the clock signal SLCK without the raising of the frequency of the clock signal SLCK and use of a PLL or the like. That is, the A/D conversion circuit 400 can realize the high speed of the A/D conversion more easily.

The A/D conversion circuit 400 can also realize both of the high resolution and the high speed of the A/D conversion more easily, without the raising of the frequency of the clock signal SLCK and use of a PLL or the like, as in the case of the A/D conversion circuit 300 using the gray code generation device to which the present technology is applied. That is, the A/D conversion circuit 400 can achieve the high speed or the high resolution of the A/D conversion or both of the high speed and the high resolution more easily.

Since the A/D conversion circuit 400 can operate at a higher speed with respect to the clock signal SLCK, the A/D conversion circuit 400 can reduce the frequency of the clock signal SLCK further than when the A/D conversion is performed using the count value of the clock signal SLCK, by setting the resolution and the processing speed of the A/D conversion to be the same as the resolution and the processing speed of the case in which the clock signal SLCK is counted. That is, the A/D conversion circuit 400 can reduce power consumption further than in the case in which the clock signal SLCK is counted.

Since the A/D conversion circuit 400 uses the phase-difference clock generation circuit to which the present technology is applied, the A/D conversion circuit 400 can perform the A/D conversion using the phase-difference clock signals (multi-phase clock signals) without use of a PLL or the like by the phase interpolators and the logic circuits. Accordingly, the A/D conversion circuit 400 can perform the A/D conversion with a simpler configuration than when the clock signals with the high frequency are generated from the clock signal SLCK using the PLL, and thus the circuit size (area) can be further reduced. Accordingly, the A/D conversion circuit 400 can improve the degree of freedom of circuit arrangement. Since the A/D conversion circuit 400 does not use a PLL, it is possible to reduce power consumption further than when a PLL is used.

As described above, the case in which the A/D conversion circuit 400 performs the A/D conversion using the 4-phase clock signals has been described. However, the A/D conversion circuit 400 can perform the A/D conversion using phase-difference clock signals (multi-phase clock signals) of any number of phases. That is, the phase-difference clock generation circuit which generates phase-difference clock signals (multi-phase clock signals) of any number of phases and to which the present technology is applied may be applied instead of the 4-phase clock generation circuit 401 in FIG. 20.

7. Sixth Embodiment

[Imaging Element-2]

In the present technology, for example, the A/D conversion circuit described in the fifth embodiment may be applied to an imaging element.

Figure 21:
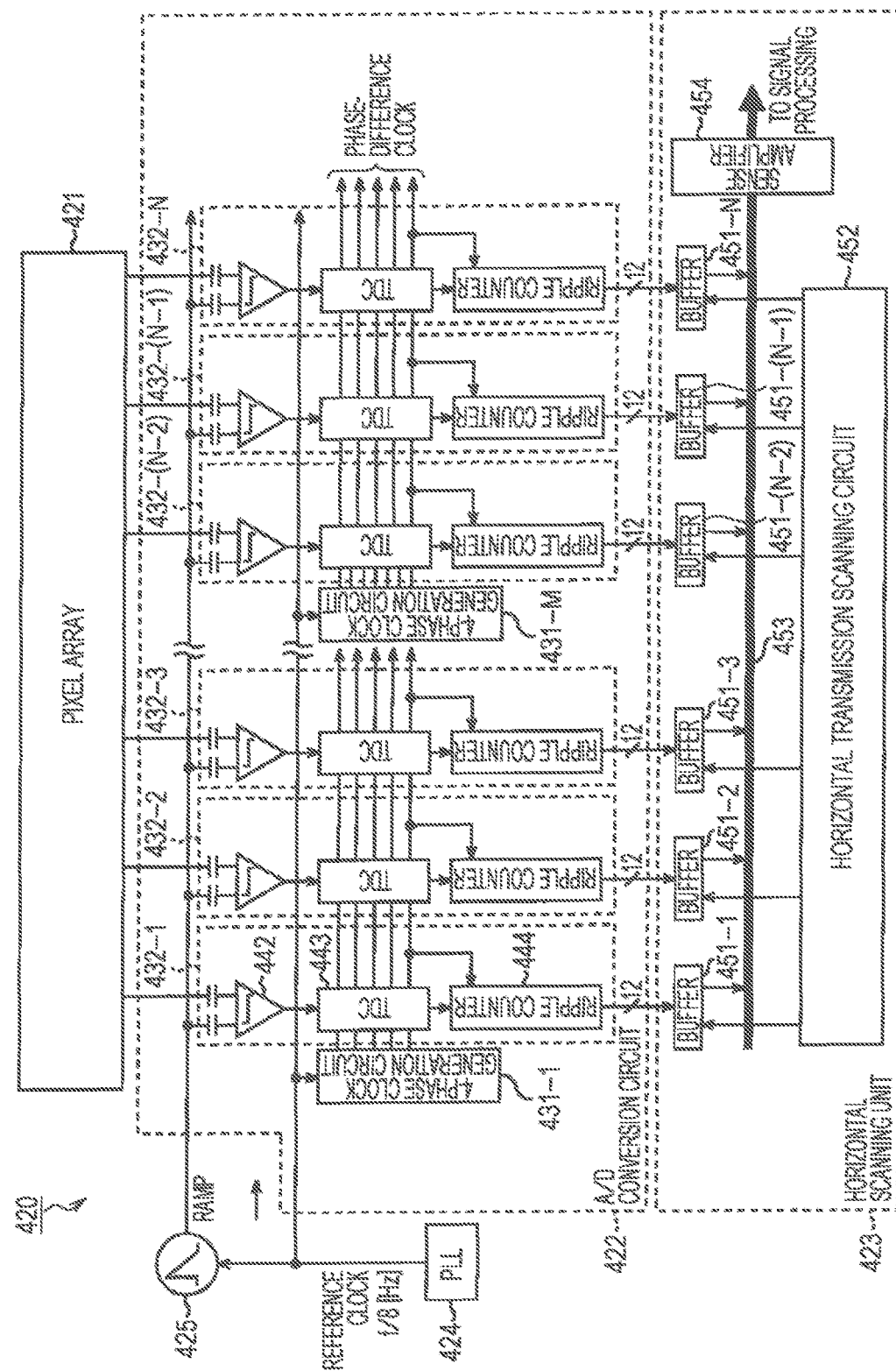
FIG. 21 is a diagram illustrating an example of a main configuration of an imaging element.

FIG. 21 is a diagram illustrating an example of a main configuration of an imaging element to which the present technology is applied. An imaging element 420 illustrated in FIG. 21 is an element that images a subject and obtains digital data of a captured image, has basically the same configuration as the imaging element (see FIG. 17), and performs the same process. As illustrated in FIG. 21, the imaging element 420 includes a pixel array 421, an A/D conversion circuit 422, a horizontal scanning unit 423, a PLL 424, and a ramp generation circuit 425.

The pixel array 421 has basically the same configuration as the pixel array 321 (see FIG. 17) and performs the same process. That is, in the pixel array 421, a plurality of unit pixels that each include a photoelectric conversion element photoelectrically converting incident light are arranged. A pixel signal read from each unit pixel is transmitted to the A/D conversion circuit 422 via a vertical signal line connecting pixel columns. Each unit pixel is connected to a column selection line (not illustrated) connecting pixel rows and an operation of each unit pixel is controlled by a row scanning circuit (not illustrated) via the row selection line.

The A/D conversion circuit 422 performs A/D conversion on the pixel signal supplied for each column of the unit pixels of the pixel array 421. The A/D conversion circuit 422 includes a 4-phase clock generation circuit 431-1 to a 4-phase clock generation circuit 431-M and a column A/D conversion circuit 432-1 to a column A/D conversion circuit 432-N.

The 4-phase clock generation circuit 431-1 to the 4-phase clock generation circuit 431-M have the same configuration and perform the same process. Hereinafter, when it is not necessary to distinguish the 4-phase clock generation circuit 431-1 to the 4-phase clock generation circuit 431-M from each other, the 4-phase clock generation circuit 431-1 to the 4-phase clock generation circuit 431-M are simply referred to as the 4-phase clock generation circuit 431. The column A/D conversion circuit 432-1 to the column A/D conversion circuit 432-N have the same configuration and perform the same process. Hereinafter, when it is not necessary to distinguish the column A/D conversion circuit 432-1 to the column A/D conversion circuit 432-N from each other, the column A/D conversion circuit 432-1 to the column A/D conversion circuit 432-N are simply referred to as the column A/D conversion circuits 432.

The 4-phase clock generation circuits 431 each generate a 4-phase clock signal from an input reference clock (f/8). The 4-phase clock generation circuit 431 is installed for each predetermined number of rows (N/M row) of the unit pixels of the pixel array 321. That is, the A/D conversion circuit 422 includes M 4-phase clock generation circuits 431. The 4-phase clock generation circuit 431 supplies the generated 4-phase clock signal to the column A/D conversion circuit 432 (a TDC 443 of the column A/D conversion circuit 432) corresponding to the column corresponding to the 4-phase clock generation circuit 431.

The 4-phase clock generation circuit 431 is a circuit that has the same configuration as the 4-phase clock generation circuit 100 (see FIG. 5) described in the first embodiment and performs the same process.

The column A/D conversion circuit 432 is installed at each column of the unit pixels of the pixel array 421. That is, the A/D conversion circuit 422 includes N column A/D conversion circuits 432. The column A/D conversion circuit 432 performs the A/D conversion on the pixel signal (analog signal) supplied from the unit pixel of the column corresponding to the column A/D conversion circuit 432, outputs digital data indicating a signal level of each pixel signal, and supplies the digital data to the horizontal scanning unit 423 (a buffer 451 of the horizontal scanning unit 423).

The column A/D conversion circuit 432 is a circuit that has the same configuration as the A/D conversion circuit 400 (see FIG. 20) described in the fifth embodiment, excluding the 4-phase clock generation circuit 401 thereof and performs the same process. That is, as illustrated in FIG. 21, the column A/D conversion circuit 432 includes comparison circuits 442, TDCs 443, and ripple counters 444.

The comparison circuit 442 is a circuit that has the same configuration as the comparison circuit 402 (see FIG. 20) described in the fifth embodiment and performs the same process. That is, the comparison circuit 442 compares a signal level of the pixel signal of the column corresponding to the comparison circuit 442 with a signal level of a reference voltage RAMP of a ramp wave supplied from the ramp generation circuit 425 and supplies the comparison result to the TDC 443.

The TDC 443 is a circuit that has the same configuration as the TDC 403 (see FIG. 20) described in the fifth embodiment and performs the same process. That is, the TDC 443 obtains and latches the 4-phase clock signal supplied from the 4-phase clock generation circuit 431 corresponding to the TDC 443 at a timing at which the comparison result of the comparison circuit 442 is changed, and performs decoding. The TDC 443 supplies the decoding result as a low-order bit of the digital value indicating the signal level of the pixel signal of the column corresponding to the TDC 443 to the ripple counter 444.

The ripple counter 444 is a circuit that has the same configuration as the ripple counter 404 (see FIG. 20) described in the fifth embodiment and performs the same process. That is, the ripple counter 444 is formed as, for example, an up-down counter, counts timings of falling of one of the 4-phase clock signals, and sets the count value as a high-order bit of the digital value indicating the signal level of the pixel signal. The ripple counter 444 sets the high-order bit and the low-order bit supplied from the TDC 443 as digital values indicating the signal level of the column corresponding to the ripple counter 444 and outputs the digital values.

That is, each column A/D conversion circuit 432 has the same configuration as the A/D conversion circuit 400 (see FIG. 20) described in the fifth embodiment and performs the same process by adding the 4-phase clock generation circuit 431 corresponding to the column A/D conversion circuit 432. That is, in the imaging element 420, the A/D conversion device to which the present technology is applied is applied as the column A/D conversion circuits 432 and the 4-phase clock generation circuits 431.

The horizontal scanning unit 423 sequentially outputs the digital data of the pixel signals of the respective columns of the unit pixels of the pixel array 421 supplied from the A/D conversion circuits 422 to the outside of the imaging element 420. As illustrated in FIG. 21, the horizontal scanning unit 423 includes a buffer 451-1 to a buffer 451-N, a horizontal transmission scanning circuit 452, a transmission bus 453, and a sense amplifier 454.

The buffer 451-1 to the buffer 451-N have the same configuration and perform the same process. Hereinafter, when it is not necessary to distinguish the buffer 451-1 to the buffer 451-N from each other, the buffer 451-1 to the buffer 451-N are simply referred to as the buffers 451.

The buffer 451 is basically the same element as the buffer 351 (see FIG. 17), is installed at each column of the unit pixels of the pixel array, and temporarily retains the digital data output from the column A/D conversion circuit 432 corresponding to the buffer 451. For example, the buffer 451-1 retains the digital data output from the column A/D conversion circuit 432-1. For example, the buffer 451-N retains the digital data output from the column A/D conversion circuit 432-N. The buffers 451 output the retained data to the transmission bus 453 under the control of the horizontal transmission scanning circuit 452.

The horizontal transmission scanning circuit 452 is basically the same element as the horizontal transmission scanning circuit 352 (see FIG. 17) and controls an output timing of the digital data retained in each buffer 451, i.e., a transmission timing of the digital data of each column. That is, each buffer 451 outputs the retained data to the transmission bus 453 at a timing designated by the horizontal transmission scanning circuit 452. The digital data of the respective columns are sequentially transmitted under the control of the horizontal transmission scanning circuit 452.

The transmission bus 453 is basically the same element as the transmission bus 353 (see FIG. 17) and sequentially transmits the digital data output from the respective buffers 451 to the sense amplifiers 454. The sense amplifier 454 is basically the same element as the sense amplifier 354 (see FIG. 17), amplifies the digital data of each column supplied via the transmission bus 453, and outputs the amplified digital data to the outside of the imaging element 420 (for example, a rear-stage processing unit performing signal processing or the like). The PLL 424 is basically the same element as the PLL 324 (see FIG. 19) and generates a reference clock with a frequency of f/8 [Hz]. The PLL 424 supplies the generated reference clock (f/8) to the A/D conversion circuit 422 (each 4-phase clock generation circuit 431) and the ramp generation circuit 425. The ramp generation circuit 425 is basically the same element as the ramp generation circuit 325 (see FIG. 17) and generates a reference voltage RAMP of a ramp waveform of which a voltage value is linearly changed over time, using the reference clock (f/8) supplied from the PLL 424. The ramp generation circuit 425 supplies the generated reference voltage RAMP to the A/D conversion circuit 422 (the comparison circuit 442 of each column A/D conversion circuit 432 of the A/D conversion circuit 422).

[Application of the Present Technology to Imaging Element-2]

The imaging element 420 having the above-described configuration uses the A/D conversion device to which the present technology is applied to perform the A/D conversion on the pixel signal of each column of the unit pixels of the pixel array 421. Accordingly, the imaging element 420 can raise the resolution of the A/D conversion further than when the A/D conversion is performed using the count value of the reference clock, without the raising of the frequency (f/8 [Hz]) of the reference clock and use of a PLL or the like for generating the clock signal with a higher frequency than the reference clock. That is, the imaging element 420 can realize the high resolution of the A/D conversion more easily. Accordingly, for example, the imaging element 420 can increase a bit depth of a captured image (image data) more easily. That is, the imaging element 420 can achieve the high resolution of a captured image more easily.

In other words, the imaging element 420 can operate at a higher speed with respect to the reference clock. That is, the imaging element 420 can achieve the high speed of the A/D conversion further than when the A/D conversion is performed using the count value of the reference clock, without the raising of the frequency (f/8 [Hz]) of the reference clock and use of a PLL or the like for generating the clock signal with a higher frequency than the reference clock. That is, the imaging element 420 can realize the high speed of the A/D conversion more easily. Accordingly, for example, the imaging element 420 can increase a frame rate of a captured image more easily. That is, the imaging element 420 can achieve high quality of a captured image more easily.

Further, the imaging element 420 can also realize both of the high resolution and the high speed of the A/D conversion more easily without the raising of the frequency (f/8 [Hz]) of the reference clock and use of a PLL or the like for generating the clock signal with a higher frequency than the reference clock. That is, the imaging element 420 can also achieve both of the increase in the bit depth of a captured image and an increase in the frame rate more easily without the raising of the frequency (f/8 [Hz]) of the reference clock and use of a PLL or the like for generating the clock signal with a higher frequency than the reference clock. That is, the imaging element 420 can realize the high speed or the high resolution of the A/D conversion or both of the high speed and the high resolution more easily. Accordingly, for example, the imaging element 420 can achieve the increase in the bit depth of a captured image, an increase in the frame rate, or both of the increase in the bit depth and the increase in the frame rate more easily.

Since the imaging element 420 uses the A/D conversion device to which the present technology is applied, the imaging element 420 can perform the A/D conversion using the phase-difference clock signals (multi-phase clock signals) without use of a PLL or the like by the phase interpolators and the logic circuits. Accordingly, the imaging element 420 can perform the A/D conversion with a simpler configuration than when the phase-difference clock signals are generated using the PLL, and thus the circuit size (area) can be further reduced. Accordingly, the imaging element 420 can improve the degree of freedom of circuit arrangement. Since the imaging element 420 does not use a PLL, it is possible to reduce power consumption further than when a PLL is used.

As illustrated in FIG. 21, the imaging element 420 includes the 4-phase clock generation circuit 431 for each predetermined number of columns. That is, in the imaging element 420, the phase-difference clock signals can be generated at positions close to the column A/D conversion circuits 432 which are supply sources of the phase-difference clock signals. Therefore, the transmission distance of the phase-difference clock signal can be set to be shorter and skew adjustment of the reference clock can be performed easily, and thus the degree of freedom of design is improved. That is, the imaging element 420 can achieve the high speed or the high resolution of the A/D conversion or both of the high speed and the high resolution more easily.

Since the column A/D conversion circuit 432 can operate at a higher speed with respect to the reference clock, the imaging element 420 can reduce the frequency of the reference clock signal by setting the resolution and the processing speed of the A/D conversion to be the same as the resolution and the processing speed of the case in which the A/D conversion is performed using the count value of the reference clock. By doing so, the imaging element 420 can reduce power consumption.

8. Seventh Embodiment

[A/D Conversion Circuit-3]

Any configuration of the imaging element to which the present technology is applicable can be used and the configuration of the imaging element is not limited to the examples described in the fourth and sixth embodiments. For example, the present technology can also be applied to other A/D conversion circuits as well as the column A/D conversion circuit installed at each column of the unit pixels of the pixel array.

Figure 22:
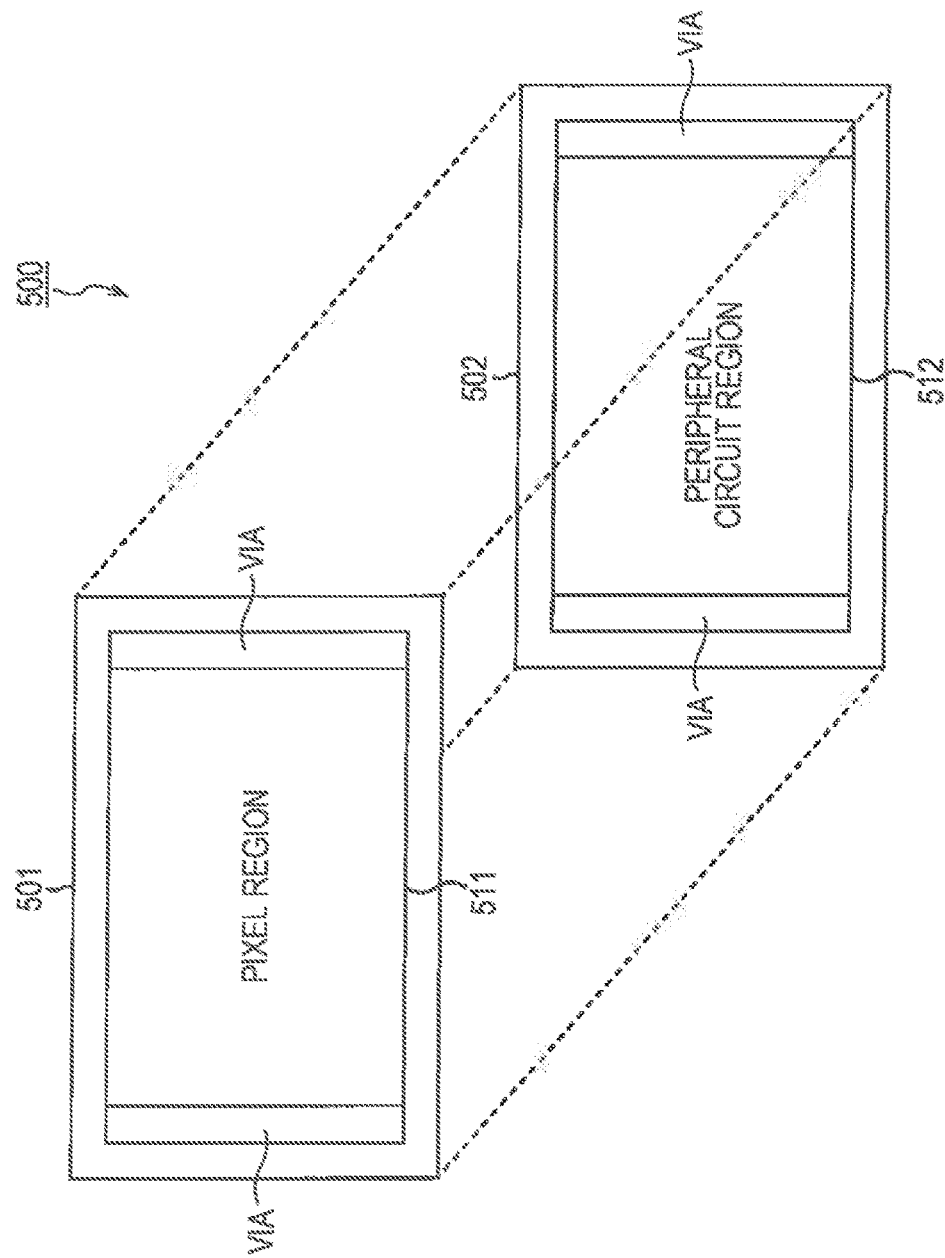
FIG. 22 is a diagram illustrating an example of a main configuration of an imaging element.

FIG. 22 is a diagram illustrating an example of a main configuration of an example of an imaging element to which the present technology is applied. An imaging element 500 illustrated in FIG. 22 is an element that images a subject and obtains digital data of a captured image. As illustrated in FIG. 22, the imaging element 500 includes a plurality of semiconductor substrates (semiconductor substrates 501 and 502) mutually superimposed. In the example of FIG. 22, the imaging element 500 is formed by the two semiconductor substrates (semiconductor substrates 501 and 502) mutually superimposed, but any number of semiconductor substrates may be superimposed.

In the semiconductor substrate 501, a pixel region 511 is formed in which a plurality of unit pixels that each include a photoelectric conversion element photoelectrically converting incident light are arranged. In the semiconductor substrate 502, a peripheral circuit region 512 is formed in which peripheral circuits processing a pixel signal read from the pixel region 511 are formed.

The semiconductor substrates 501 and 502 form a multi-layered structure (lamination structure). Each pixel of the pixel region 511 formed in the semiconductor substrate 501 and a circuit of the peripheral circuit region 512 formed in the semiconductor substrate 502 are electrically connected to each other via a through via or the like.

Figure 23:
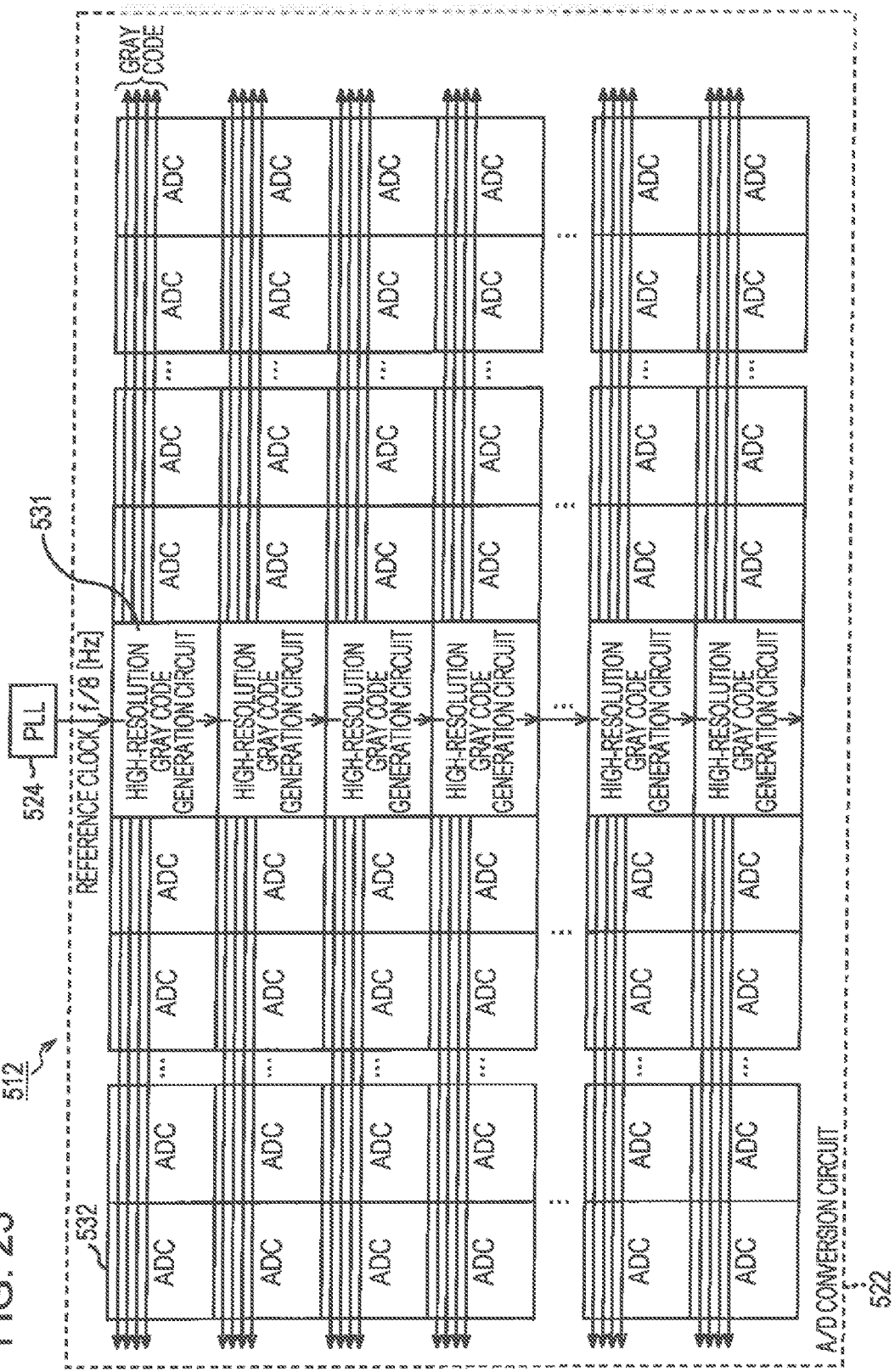
FIG. 23 is a diagram illustrating an example of a main configuration of a peripheral circuit region.

In the peripheral circuit region 512, for example, an A/D conversion circuit 522 and a PLL 524 illustrated in FIG. 23 are formed.

The A/D conversion circuit 522 performs A/D conversion on a pixel signal supplied for each partial region (also referred to as an area) of the pixel region 511. The A/D conversion circuit 522 includes high-resolution gray code generation circuits 531 and area A/D conversion circuits 532.

The area A/D conversion circuit 532 is installed in each area of the pixel region 511. Any number of areas and any size of the area can be used. That is, any number of area A/D conversion circuits 532 and any method of allocating the area A/D conversion circuits 532 (a way of allocating the area A/D conversion circuits 532 to the areas) can be used. In the case of the example of FIG. 23, the area A/D conversion circuits 532 are arranged in an array form (matrix form).

Each area A/D conversion circuit 532 performs the A/D conversion on a pixel signal (analog signal) supplied from the unit pixel in the area corresponding to the area A/D conversion circuit 532 and outputs digital data indicating a signal level of each pixel signal. That is, the area A/D conversion circuit 532 is basically the same circuit as the column A/D conversion circuit 332 (see FIG. 17) except that the method of allocating the unit pixels is different. That is, the area A/D conversion circuit 532 is a circuit that has the same configuration as the A/D conversion circuit 300 (see FIG. 16) described in the third embodiment excluding the high-resolution gray code generation circuit 301 thereof and performs the same process.

The high-resolution gray code generation circuit 531 is installed for each predetermined number of areas of the pixel region 511. In the case of the example of FIG. 23, the high-resolution gray code generation circuit 531 is installed at each row of the area A/D conversion circuits 532 arranged in an array form (matrix form). The number of high-resolution gray code generation circuits 531 or the method of allocating the high-resolution gray code generation circuits 531 (a way of allocating the high-resolution gray code generation circuits 531 to the areas) is not limited to the example of FIG. 23, and any number or any method can be used.

The high-resolution gray code generation circuits 531 each generate a gray code (that is, a high-resolution gray code) with a higher frequency component than the frequency of a reference clock (f/8) supplied from the PLL 524. The high-resolution gray code generation circuit 531 supplies the generated gray code to the area A/D conversion circuit 532 corresponding to the row corresponding to the high-resolution gray code generation circuit 531. That is, the high-resolution gray code generation circuit 531 is basically the same circuit as the high-resolution gray code generation circuit 331 (see FIG. 17) except that the method of allocating the unit pixels is different. That is, the high-resolution gray code generation circuit 531 is a circuit that has the same configuration as the high-resolution gray code generation circuit 200 (see FIG. 12) or the high-resolution gray code generation circuit 230 (see FIG. 14) described in the second embodiment and performs the same process.

That is, as in the case of the imaging element 320 (see FIG. 17) described in the fourth embodiment, the A/D conversion device to which the present technology is applied is applied as the area A/D conversion circuit 532 and the high-resolution gray code generation circuit 531 in the imaging element 500.

Accordingly, as in the imaging element 320, the imaging element 500 can achieve the high speed or the high resolution of the A/D conversion or both of the high speed and the high resignation more easily. Accordingly, for example, the imaging element •can achieve the increase in the bit depth of a captured image, an increase in the frame rate, or both of the increase in the bit depth and the increase in the frame rate more easily. Since the imaging element 500 does not use a PLL to generate the gray codes with a higher frequency component than the reference clock, as in the case of the imaging element 320, it is possible to reduce power consumption further than when a PLL is used.

As in the case of the imaging element 320, the imaging element 500 can generate the high-resolution gray codes at positions close to the area A/D conversion circuits 532 using the gray codes. Therefore, skew adjustment of the reference clock can be performed easily, and the degree of freedom, of design is improved. As in the case of the imaging element 320, the imaging element 500 can realize the A/D conversion at the same resolution and the same processing speed as the case in which the A/D conversion is performed using the count value of the reference clock, while reducing the frequency of the reference clock and reducing power consumption.

[A/D Conversion Circuit-4]

In FIG. 23, the case has been described in which the A/D conversion circuits performing the A/D conversion using the high resolution gray code generation circuits to which the present technology is applied are installed in the peripheral circuit region 512, as in the A/D conversion circuit 322 described in the fourth embodiment. However, the A/D conversion circuits performing the A/D conversion using the 4-phase clock generation circuits to which the present technology is applied may be installed in the peripheral circuit region 512, as in the A/D conversion circuits 422 described in the sixth embodiment.

Figure 24:
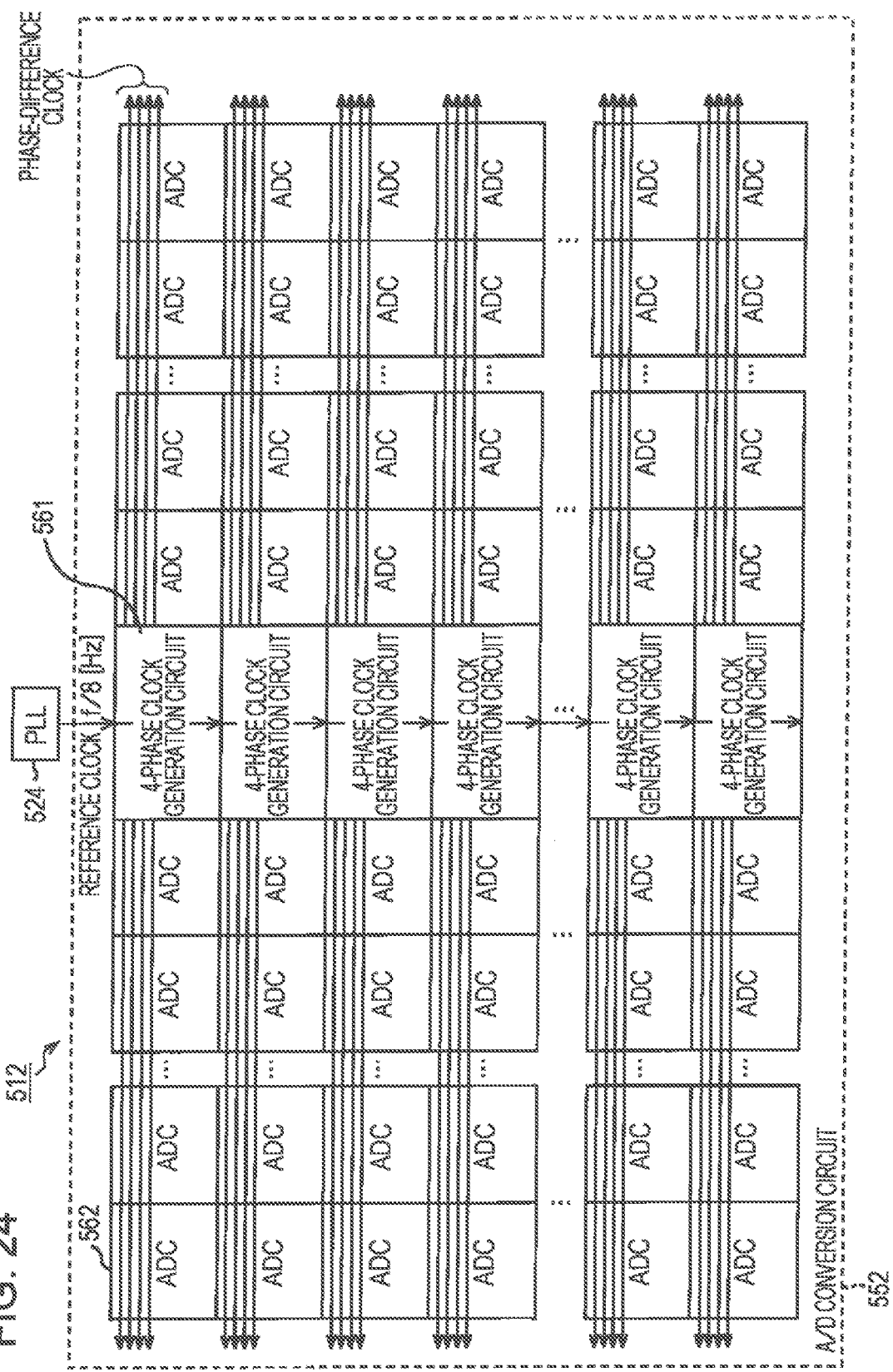
FIG. 24 is a diagram illustrating an example of a main configuration of a peripheral circuit region.

FIG. 24 is a diagram illustrating another example of an A/D conversion circuit formed in the peripheral circuit region 512. In the case of the example of FIG. 24, an A/D conversion circuit 522 formed in the peripheral circuit region 512 includes 4-phase clock generation circuits 561 and area A/D conversion circuits 562.

The area A/D conversion circuit 562 is installed in each area of the pixel region 511. Any number of areas and any size of the area can be used. That is, any number of area A/D conversion circuits 562 and any method of allocating the area A/D conversion circuits 562 (a way of allocating the area A/D conversion circuits 562 to the areas) can be used. In the case of the example of FIG. 24, the area A/D conversion circuits 562 are arranged in an array form (matrix form).

Each area A/D conversion circuit 562 performs the A/D conversion on a pixel signal (analog signal) supplied from the unit pixel in the area corresponding to the area A/D conversion circuit 562 and outputs digital data indicating a signal level of each pixel signal. That is, the area A/D conversion circuit 562 is basically the same circuit as the column A/D conversion circuit 432 (see FIG. 21) except that the method of allocating the unit pixels is different. That is, the area A/D conversion circuit 562 is a circuit that has the same configuration as the A/D conversion circuit 400 (see FIG. 20) described in the fifth embodiment excluding the 4-phase clock generation circuit 401 thereof and performs the same process.

The 4-phase clock generation circuit 561 is installed for each predetermined number of areas of the pixel region 511. In the case of the example of FIG. 24, the 4-phase clock generation circuit 561 is installed at each row of the area A/D conversion circuits 562 arranged in an array form (matrix form). The number of 4-phase clock generation circuits 561 or the method of allocating the 4-phase clock generation circuits 561 (a way of allocating the 4-phase clock generation circuits 561 to the areas) is not limited to the example of FIG. 24, and any number or any method can be used.

The 4-phase clock generation circuits 561 each generate a phase-difference clock signal (multi-phase clock signal) from the reference clock (f/8) supplied from the PLL 524. The 4-phase clock generation circuit 561 supplies the generated phase-difference cock signal (multi-phase clock signal) to the area A/D conversion circuit 562 corresponding to the column corresponding to the 4-phase clock generation circuit 561. That is, the 4-phase clock generation circuit 561 is basically the same circuit as the 4-phase clock generation circuit 431 (see FIG. 21) except that the method of allocating the unit pixels is different. That is, the 4-phase clock generation circuit 561 is a circuit that has the same configuration as the 4-phase clock generation circuit 100 (see FIG. 5) described in the first embodiment and performs the same process.

That is, as in the case of the imaging element 420 (see FIG. 21) described in the sixth embodiment, the A/D conversion device to which the present technology is applied is applied as the area A/D conversion circuit 562 and the 4-phase clock generation circuit 561 in the imaging element 500.

Accordingly, as in the case of FIG. 23, the imaging element 500 can achieve the high speed or the high resolution of the A/D conversion or both of the high speed and the high resolution more easily.

In FIG. 24, the example has been described in which the 4-phase clock generation circuit 561 is used as an example of the phase-difference clock generation circuit to which the present technology is applied. However, any number of phases of the generated phase-difference clock signals can, of course, be used.

9. Eighth Embodiment

[A/D Converter Using Multi-Clock Signals]

Japanese Unexamined Patent Application Publication No. 2008-92091 suggests an integral type A/D converter in which low-order bit information is acquired by a time quantizer (TDC (Time-to-Digital Converter)) latching and decoding clock signals with different phases by a normal high-order bit counter and a normal ring oscillator. By doing so, it is possible to improve the resolution, of the A/D converter without raising of a clock frequency.

Figure 25:
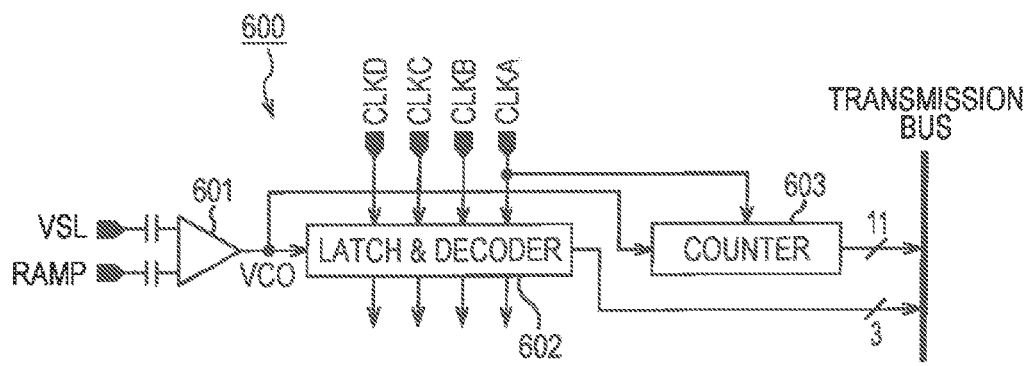
FIG. 25A is a diagram illustrating an example of a low-order bit time quantizer.
FIG. 25B is a diagram illustrating an example of a low-order bit time quantizer.

An example of a main configuration of the A/D converter is illustrated in FIG. 25A. As illustrated in FIG. 25A, an A/D converter 600 includes a comparator 601, a latch & decoder 602, and a counter 603. The comparator 601 compares a signal (VSL) read from a pixel and a ramp signal (RAMP) and supplies a comparison result (VCO) to the latch & decoder 602 and the counter 603. The counter 603 performs counting until the comparison result (VCO) is changed and obtains the count value as high-order bit information. The latch & decoder 602 is configured by a time quantizer, and latches and decodes clock signals (CLKA, CLKB, CLKC, and CLKD) with mutually different phases to obtain low-order bit information.

More specifically, for example, as in a timing chart illustrated in FIG. 25B, when the latch & decoder 602 latches values of the four clock signals CLKA, CLKB, CLKC, and CLKD of which phases are each different by 45 degrees during one period of a clock frequency at a timing at which the comparison result (VCO) is change, eight extension codes EB[3:0] are obtained. The latch & decoder 602 decodes the eight codes to obtain 3-bit low-order bit information.

In order to further improve the resolution of low-order bits in this scheme, it is necessary to double the number of clock signals transmitted per bit and half the phase difference. Due to the shapes of transistors (Tr) or wirings included in a circuit or a variation (individual difference) in characteristics, it is difficult to constantly maintain the phase difference between the clock signals normally. Moreover, when the variation may not be neglected for the phase difference, there is a concern that erroneous determination of the count value may occur.

For example, when the plurality of integral type A/D converters are arranged in parallel as in the column A/D converters of an imaging element, in regard to each clock signal, a driving circuit called a repeater or a buffer (clock buffer when a signal is limited to a clock signal) is generally used for each signal in order to prevent a signal, level, from attenuating due to a time constant of a wiring. Normally, as the number of A/D converters arranged in parallel increases, a transmission distance of the clock signal extends and more signal driving circuits are connected at multi-stages.

The signal driving circuits have a variation in a delay time. There is a concern that the variation in the delay time may be a cause of changing the phase difference between clock signals passing through the signal driving circuits. Accordingly, when the number of signal driving circuits connected at multi-stages increases, there is a concern that a variation in the delay time of each clock signal (in other words, a variation in the phase difference between the clock signals) may increase.

[Signal Processing Device]

Accordingly, by realizing a signal processing device that includes a phase correction unit using a plurality of phase interpolators to correct a phase difference between clock signals of multi-phase clock signals configured by a plurality of clock signals of which phases are mutually shifted, the variation in the phase difference between the clock signals of the multi-phase clock signals is configured to be reduced.

For example, a phase interpolator may be used which outputs an output signal at a timing delayed by a delay time of the phase interpolator from an intermediate timing of a phase difference of two input signals.

By using the signal processing device, it is possible to smooth the variation is each clock signal of the multi-phase clock signals and constantly maintain the phase difference between the multi-phase clock signals normally.

Figure 26:
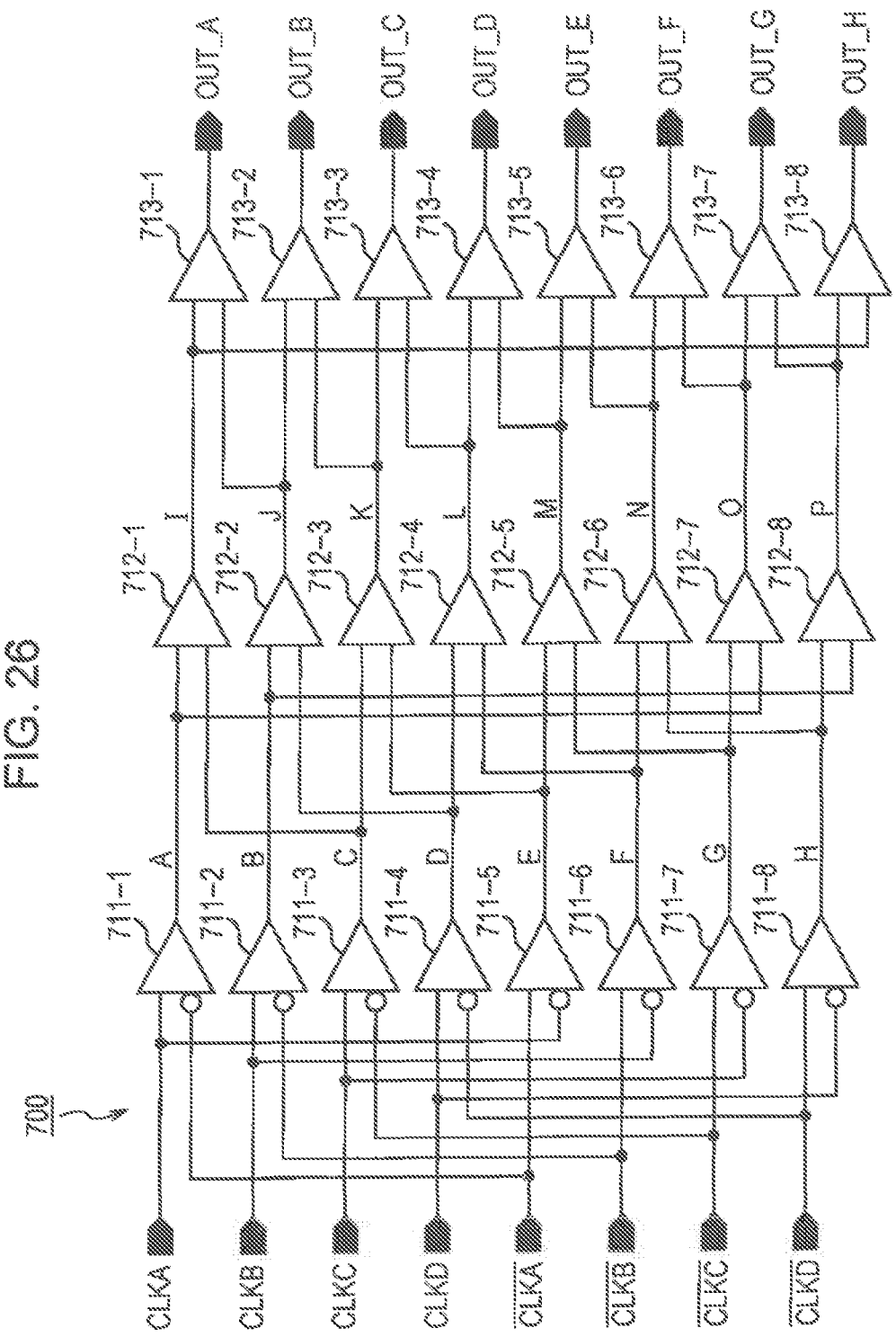
FIG. 26 is a diagram illustrating an example of a main configuration of a phase correction circuit.

FIG. 26 is a diagram illustrating an example of a main configuration of a phase correction circuit according to an embodiment of the signal processing device. A phase correction circuit 700 illustrated in FIG. 26 is a circuit that corrects a phase difference between clock signals of 4-phase clock signals configured by four clock signals of which a mutual phase difference is 90 degrees.

As illustrated in FIG. 26, the phase correction circuit 700 includes 24 phase interpolators configured at 3 stages. Each stage is configured by 8 phase interpolators in parallel. That is, when viewed from an input terminal side, a first stage is configured by a phase interpolator 711-1 to a phase interpolator 711-8, a second stage is configured by a phase interpolator 712-1 to a phase interpolator 712-8, and a third stage is configured by a phase interpolator 713-1 to a phase interpolator 713-8. When it is not necessary to distinguish the phase interpolator 711-1 to the phase interpolator 711-8 from each other for description, the phase interpolator 711-1 to the phase interpolator 711-8 are simply referred to as the phase interpolators 711. When it is not necessary to distinguish the phase interpolator 712-1 to the phase interpolator 712-8 from each other for description, the phase interpolator 712-1 to the phase interpolator 712-8 are simply referred to as the phase interpolators 712. When it is not necessary to distinguish the phase interpolator 713-1 to the phase interpolator 713-8 from each other for description, the phase interpolator 713-1 to the phase interpolator 713-8 are simply referred to as the phase interpolators 713.

Eight signals configured by four clock signals CLKA, CLKB, CLKC, and CLKD of which a mutual phase difference is 90 degrees and inverted signals of these clock signals are input to the phase correction circuit 700.

When viewed from the input terminal side, the phase interpolators 711 at the first stage generate intermediate phase signals of two input signals of which the phase difference is 0 degrees. More specifically, the phase interpolator 711-1 generates an intermediate-phase signal of the clock signal CLKA and NOT of the inverted signal of the clock signal CLKA. The phase interpolator 711-2 generates an intermediate-phase signal of the clock signal CLKB and NOT of the inverted signal of the clock signal CLKB. The phase interpolator 711-3 generates an intermediate-phase signal of the clock signal CLKC and NOT of the inverted signal of the clock signal CLKC. The phase interpolator 711-4 generates an intermediate-phase signal of the clock signal CLKD and NOT of the inverted signal of the clock signal CLKD. The phase interpolator 711-5 generates an intermediate-phase signal of NOT of the clock signal CLKA and the inverted signal of the clock signal CLKA. The phase interpolator 711-6 generates an intermediate-phase signal of NOT of the clock signal CLKB and the inverted signal of the clock signal CLKB. The phase interpolator 711-7 generates an intermediate-phase signal of NOT of the clock signal CLKC and the inverted signal of the clock signal CLKC. The phase interpolator 711-8 generates an intermediate-phase signal of NOT of the clock signal CLKD and the inverted signal of the clock signal CLKD.

When viewed from the input terminal side, the phase interpolators 712 at the second stage generate intermediate phase signals of two input signals of which the phase difference is 90 degrees. More specifically, the phase interpolator 712-1 generates an intermediate-phase signal of an output of the phase interpolator 711-1 and an output of the phase interpolator 711-3. The phase interpolator 712-2 generates an intermediate-phase signal of an output of the phase interpolator 711-2 and an output of the phase interpolator 711-4. The phase interpolator 712-3 generates an intermediate-phase signal of an output of the phase interpolator 711-3 and an output of the phase interpolator 711-5. The phase interpolator 712-4 generates an intermediate-phase signal of an output of the phase interpolator 711-4 and an output of the phase interpolator 711-6. The phase interpolator 712-5 generates an intermediate-phase signal of an output of the phase interpolator 711-5 and an output of the phase interpolator 711-7. The phase interpolator 712-6 generates an intermediate-phase signal of an output of the phase interpolator 711-6 and an output of the phase interpolator 711-8. The phase interpolator 712-7 generates an intermediate-phase signal of an output of the phase interpolator 711-7 and the output of the phase interpolator 711-1. The phase interpolator 712-8 generates an intermediate-phase signal of an output of the phase interpolator 711-8 and the output of the phase interpolator 711-2.

When viewed from the input terminal side, the phase interpolators 713 at the third stage generate intermediate-phase signals of two input signals of which the phase difference is 45 degrees. More specifically, the phase interpolator 713-1 generates an intermediate-phase signal of an output of the phase interpolator 712-1 and an output of the phase interpolator 712-2. The phase interpolator 713-2 generates an intermediate-phase signal of the output of the phase interpolator 712-2 and an output of the phase interpolator 712-3. The phase interpolator 713-3 generates an intermediate-phase signal of the output of the phase interpolator 712-3 and an output of the phase interpolator 712-4. The phase interpolator 713-4 generates an intermediate-phase signal of the output of the phase interpolator 712-4 and an output of the phase interpolator 712-5. The phase interpolator 713-5 generates an intermediate-phase signal of the output of the phase interpolator 712-5 and an output of the phase interpolator 712-6. The phase interpolator 713-6 generates an intermediate-phase signal of the output of the phase interpolator 712-6 and an output of the phase interpolator 712-7. The phase interpolator 713-7 generates an intermediate-phase signal of the output of the phase interpolator 712-7 and an output of the phase interpolator 712-8. The phase interpolator 713-8 generates an intermediate-phase signal of the output of the phase interpolator 712-8 and the output of the phase interpolator 712-1.

An output of the phase interpolator 713-1 is output, as a clock signal OUT_A. An output of the phase interpolator 713-2 is output as a clock signal OUT_B. An output of the phase interpolator 713-3 is output as a clock signal OUT_C. An output of the phase interpolator 713-4 is output as a clock signal OUT_D. An output of the phase interpolator 713-5 is output as a clock signal OUT_E. An output of the phase interpolator 713-6 is output as a clock signal OUT_F. An output of the phase interpolator 713-7 is output as a clock signal OUT_G. An output of the phase interpolator 713-8 is output as a clock signal OUT_H.

The phases of the input signals and the output signals of the phase correction circuit 700 are illustrated in FIG. 27.

That is, the phases of the output signals are delayed by 67.5 degrees with respect to the input signals and the phase difference between the output signals is 45 degrees as in the input signals.

That is, the delay of the output signals of the phase interpolators is an average of the delays of the input signals, excluding delays caused by the phase interpolators. Accordingly, when t1 to t8 are assumed to be delays of the input signals (the clock signals CLKA to CLKB and the inverted signals of these clock signals), delays of the outputs (signals of a node A to a node H) of the phase interpolators 711 at the first stage, the outputs (signals of a node I to a node P) of the phase interpolators 712 at the second stage, and the output signals (the clock signals OUT_A to OUT_H) are shown in tables illustrated in FIGS. 28A and 28B. That is, the delays of the output signals are averages of the delays of all of the input signals. Accordingly, even when there is a variation in the delay (phase difference) between the input signals, the variation in the delay (phase difference) is smoothed in the output signals.

Thus, the phase correction circuit 700 can correct the phases between the clock signals of the multi-phase clock signals and can also delay the phases. That is, the phase correction circuit 700 can delay the multi-phase clock signals while constantly maintaining the phase difference between the clock signals (suppressing the variation in the phase difference).

10. Ninth Embodiment

[Image Sensor-1]

By applying the foregoing phase correction circuit 700 to an A/D converter, it is possible to realize the A/D converter that obtains low-order bit information using the multi-phase clock signals in which the phase difference between the clock signals is more accurate. That is, erroneous determination in the low-order bits can be prevented from occurring, and thus it is possible to realize high resolution of the A/D converter more easily. Further, by applying the A/D converter to an imaging element, it is possible to realize high bit depth of captured image data more easily.

Figure 29:
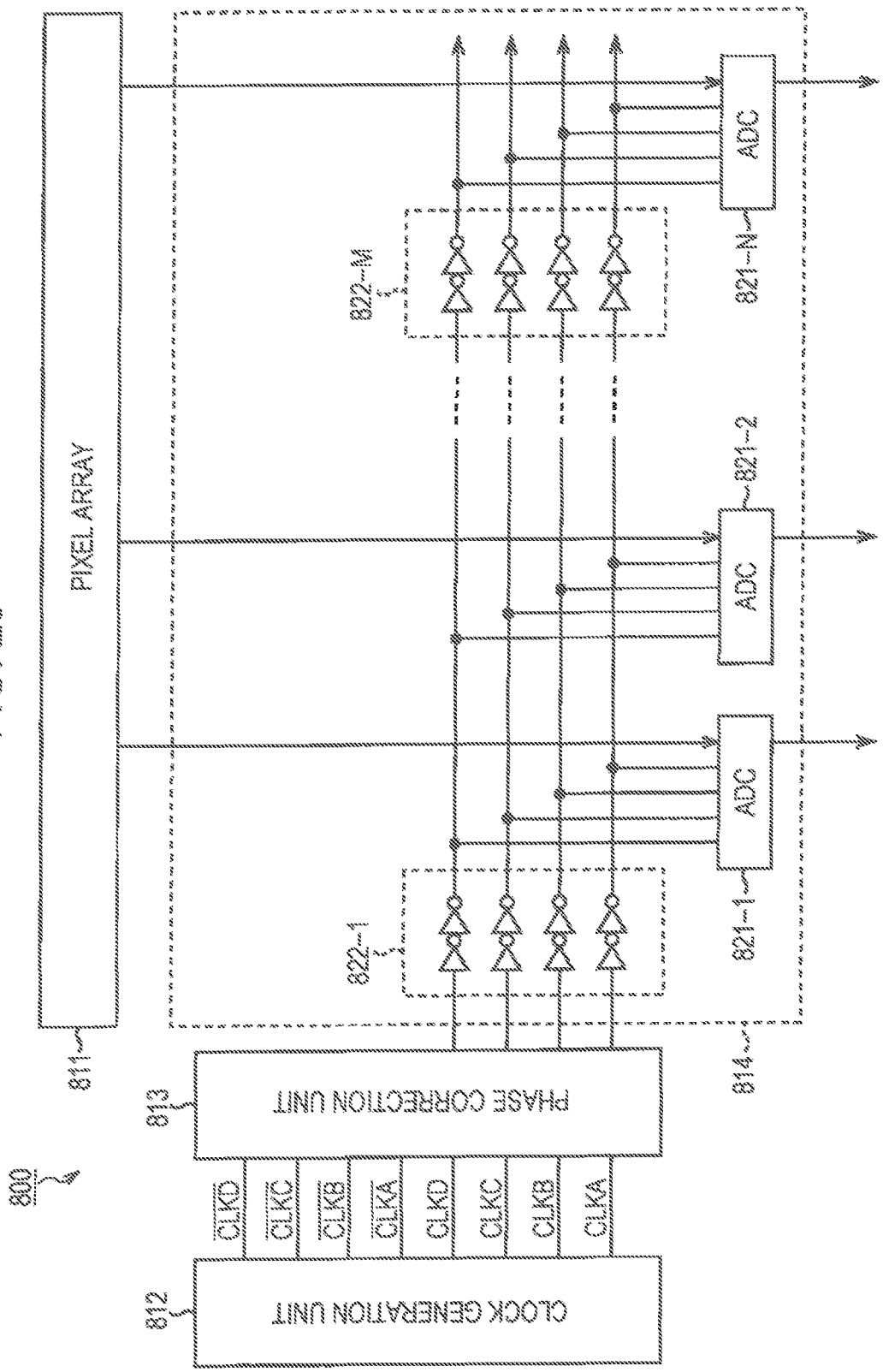
FIG. 29 is a diagram illustrating an example of a main configuration of an imaging element.

FIG. 29 is a block diagram illustrating an example of a main configuration of an image sensor according to an embodiment of the imaging element to which the present technology is applied.

In an image sensor 800 illustrated in FIG. 29, incident light is photoelectrically converted and a charge is accumulated in a light reception portion (for example, a photodiode) of a unit pixel, a signal voltage corresponding to the charge is read as a pixel signal and subjected to A/D conversion, and pixel data is obtained. Then, the image sensor 800 outputs the pixel data of each unit pixel as image data.

In FIG. 29, an example of a partial configuration of the image sensor 800 is illustrated. As illustrated in FIG. 29, the image sensor 800 includes a pixel array 811, a clock generation unit 812, a phase correction unit 813, and an AD conversion unit 814.

In the pixel array 811, a plurality of unit pixels that each include a photoelectric conversion element photoelectrically converting incident light are arranged. The unit pixel includes one photoelectric conversion element or a plurality of photoelectric conversion elements and a circuit reading the charge accumulated in the photoelectric conversion element. For example, the unit pixel has a configuration illustrated in FIG. 18. In a pixel array 811, the plurality of unit pixels are arranged on a flat surface or a curved surface. For example, the unit pixels are arranged in an array form (matrix form). In the pixel array 811, control lines transmitting control signals to control transistors of the unit pixels and signal lines transmitting signals (reset levels, pixel signals, or the like) read from the unit pixels are formed.

The photoelectric conversion element photoelectrically converts incident light and accumulates as obtained charge. The charge is read from the unit pixel and is supplied to the A/D conversion unit 814 via a signal line by driving each transistor included in the unit pixel according to various control signals transmitted from a scanning unit (not illustrated) via various control lines. For example, the signal line is formed at each column of the unit pixels in the pixel array 811. That is, when the number of columns of the unit pixels is N (where N is any natural number), N signal likes are formed. A signal read from each unit pixel is read for each row of the unit pixels. The read signal is transmitted via the signal line of each column and is supplied to each of the A/D conversion units (an A/D conversion unit 821-1 to an A/D conversion unit 821-N) corresponding to each column of the A/D conversion unit 814.

The clock generation unit 812 generates the 4-phase clock signals (CLKA, CLKB, CLKC, and CLKD) configured by four clock signals of which the mutual phase difference is 45 degrees and the inverted signals of these signals, and supplies the signals to the phase correction unit 813.

When the phase correction unit 813 acquires the 4-phase clock signals (CLKA, CLKB, CLKC, and CLKD) supplied from the clock generation unit 812 and the inverted signals with the inverted phases, the phase correction unit 813 corrects the phases of the signals using these signals so that a variation in the delay (phase difference) between the signals is suppressed. The phase correction unit 813 supplies the 4-phase clock signals of which phases are corrected to the A/D conversion unit 814.

The A/D conversion unit 814 performs A/D conversion on the signal supplied from the pixel array 811. For example, the A/D conversion unit 814 may include an A/D conversion unit for each signal line connected to the pixel array 811. In the case of the example of FIG. 29, the A/D conversion unit 814 includes an A/D conversion unit for each column of the unit pixels of the pixel array 811. More specifically, the A/D conversion unit 814 includes an A/D conversion unit 821-1 to an A/D conversion unit 821-N. When it is not necessary to distinguish the A/D conversion unit 821-1 to the A/D conversion unit 821-N from each other for description, the A/D conversion unit 821-1 to the A/D conversion unit 821-N are simply referred to as the A/D conversion units 821.

The A/D conversion unit 821 performs the A/D conversion on the signal supplied from the pixel array 811 via the signal line to which the A/D conversion unit 821 is assigned. For example, the A/D conversion unit 821-1 performs the A/D conversion on the signal read from the unit pixel of the leftmost column of the pixel array 811. For example, the A/D conversion unit 821-2 performs the A/D conversion on the signal read from the unit pixels of the second column from the left of the pixel array 811. Likewise, for example, the A/D conversion unit 821-N performs the A/D conversion on the signals read from the unit pixels of the rightmost column of the pixel array 811.

The A/D conversion unit 821 has any configuration. For example, the A/D conversion unit 821 may have the same configuration as the A/D converter 600 (see FIG. 25A) and may perform the same process. That is, the A/D conversion unit 821 may compare the signal supplied from the pixel array 811 to a ramp signal, perform counting until the comparison result is changed, and obtain the count value as the high-order bit information, and the time quantizer may be configured to obtain 3-bit low-order bit information with higher resolution than the clock signal based on the 4-phase clock signals which are generated by the clock generation unit 812 and of which the delay (phase difference) between the signals is corrected by the phase correction unit 813.

The A/D conversion unit 814 outputs the data output from each A/D conversion unit 814 as image data.

The 4-phase clock signals which are generated by the clock generation unit 812 and of which the delay (phase difference) between the signals is corrected by the phase correction unit 813 are supplied to the A/D conversion units 821. As illustrated in FIG. 29, the A/D conversion unit 814 may include a predetermined number of clock buffers (for example, a clock buffer 822-1 to a clock buffer 822-M (where M is any natural number)) in wirings transmitting the multi-phase clock signals between the phase correction unit 813 and the A/D conversion units 821 in order to prevent attenuation of the signal levels of the multi-phase clock signals. When it is not necessary to distinguish the clock buffer 822-1 to the clock buffer 822-M from each other for description, the clock buffer 822-1 to the clock buffer 822-M are simply referred to as the clock buffers 822. The clock buffers 822 can be installed at any positions as long as the positions are located between the phase correction unit 813 and the A/D conversion units 821. For example, the clock buffers 822 may be installed at intervals of a predetermined distance.

For example, the clock buffer 822 is configured by an amplification circuit or the like and amplifies and outputs an input signal.

In the image sensor 800 with such a configuration, the phase correction circuit 700 described with reference to, for example, FIGS. 26 to 28 may be applied as the phase correction unit 813. That is, the phase correction unit 813 may correct the phase difference between the clock signals of the input multi-phase clock signals using the plurality of phase interpolators.

That is, the image sensor 800 may include the pixel array 811 in which the unit pixels that each include the photoelectric conversion element photoelectrically converting incident light are arranged, the clock generation unit 812 (phase-difference clock generation unit) that generates the multi-phase clock signals configured by the plurality of clock signals of which the mutual phases are shifted, the phase correction unit 813 that uses the plurality of phase interpolators to correct the phase difference between the clock signals of the multi-phase clock signals generated by the clock generation unit 812, and the A/D conversion unit 814 (A/D conversion unit 821) that performs the A/D conversion on an analog signal output from the unit pixel of the pixel array based on the multi-phase clock signals corrected by the phase correction unit 813.

As described above, the A/D conversion unit 821 may be installed at each column of the unit pixels of the pixel array 811 and may perform the A/D conversion on the analog signal output from the unit pixels of the column corresponding to the A/D conversion unit 821 based on the multi-phase clock signal corrected by the phase correction unit 813.

By doing so, it is possible to prevent erroneous determination of the low-order bits from occurring in the A/D conversion and realize the high resolution of the A/D conversion unit 814 (A/D conversion units 821) more easily.

Accordingly, the image sensor 800 can realize the high bit depth of the captured image data more easily. In this case, as described above, since the phase correction circuit 700 may be applied as the phase correction unit 813, it is not necessary to considerably change an existing layout.

Accordingly, development can be easily achieved and it is possible to reduce a time necessary for the development. Further, it is possible to prevent the circuit size (area) from increasing. Accordingly, it is possible to suppress development or manufacturing cost from increasing.

[Clock Generation Unit]

Figure 30:
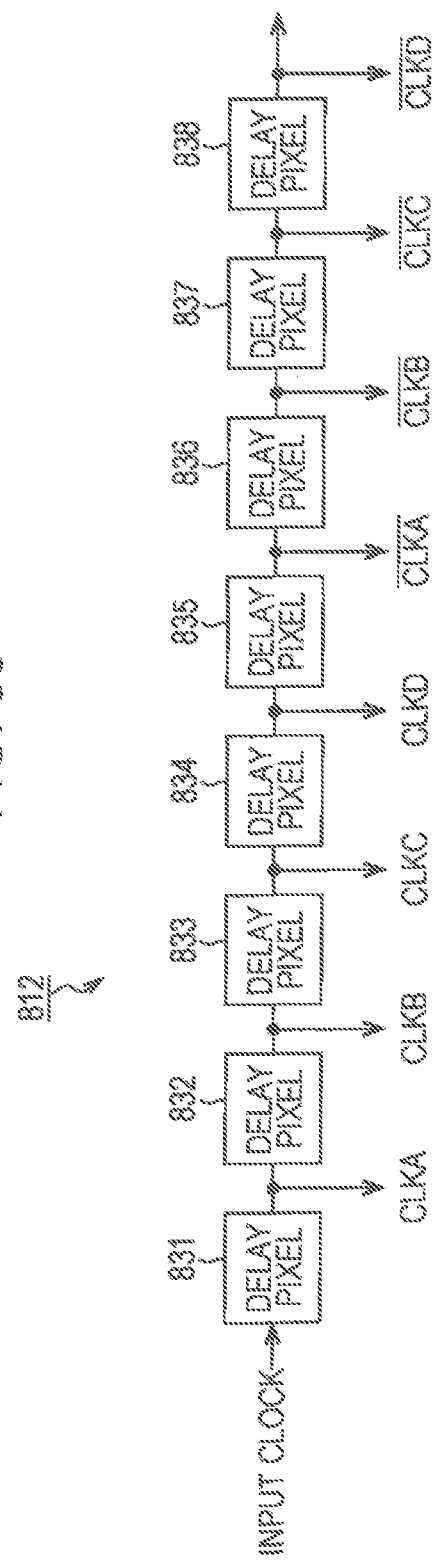
FIG. 30 is a diagram illustrating an example of a main configuration of a clock generation unit.

FIG. 30 is a block diagram illustrating an example of a main configuration of the clock generation unit 812. As illustrated in FIG. 30, the clock generation unit 812 includes a delay element 831 to a delay element 838. The delay element 831 to the delay element 838 are connected in series and outputs of the delay elements are output as clock signals or inverted signals of the clock signals.

The delay dement 831 to the delay element 838 each delay the phase of an input signal by 45 degrees. For example, the delay element 831 to the delay element 838 are each formed by, for example, a NAND circuit, a NOR circuit, a differential amplifier, or an inverter used in a ring oscillator.

A clock signal input by the clock generation unit 812 is supplied to the delay element 831, the phase of the clock signal is delayed by 45 degrees, and this clock signal is output as the clock signal CLKA to the outside of the clock generation unit 812. The clock signal CLKA is also supplied to the delay element 832, the phase of the clock signal is delayed by 45 degrees, and this clock signal is output as the clock signal CLKB to the outside of the clock generation unit 812. The clock signal CLKB is also supplied to the delay element 833, the phase of the clock signal is delayed by 45 degrees, and this clock signal is output as the clock signal CLKC to the outside of the clock generation unit 812. The clock signal CLKC is also supplied to the delay element 834, the phase of the clock signal is delayed by 45 degrees, and this clock signal is output as the clock signal CLKD to the outside of the clock generation unit 812.

The clock signal CLKD is also supplied to the delay element 835, the phase of the clock signal is delayed by 45 degrees, and this clock signal is output as the inverted signal of the clock signal CLKA to the outside of the clock generation unit 812. The inverted signal of the clock signal CLKA is also supplied to the delay element 836, the phase of the clock signal is delayed by 45 degrees, and this clock signal is output as the inverted signal of the clock signal CLKB to the outside of the clock generation unit 812. The inverted signal of the clock signal CLKB is also supplied to the delay element 837, the phase of the clock signal is delayed by 45 degrees, and this clock signal is output as the inverted signal of the clock signal CLKC to the outside of the clock generation unit 812. The inverted signal of the clock signal CLKC is also supplied to the delay element 838, the phase of the clock signal is delayed by 45 degrees, and this clock signal is output as the inverted signal of the clock signal CLKD to the outside of the clock generation unit 812.

For example, Japanese Unexamined Patent Application Publication No. 2008-92091 suggests a phase-locked loop circuit including a ring oscillator as a clock signal generation source. However, the configuration of the phase-locked loop circuits is complex and the circuit size thereof is large.

The circuit configuration of the clock generation unit 812 configured as in FIG. 30 is simpler than the phase-locked loop circuit and the circuit size thereof is smaller. However, in the clock generation unit 812 configured as in FIG. 30, there is a concern that a variation in the delay amount may occur due to an individual difference between the delay elements. Accordingly, there is a concern that a large variation unallowable in the phase difference (delay) between the clock signals of the multi-phase clock signals generated by the clock generation unit 812 occurs.

For example, when the multi-phase clock signals generated by the clock generation unit 812 are supplied to the A/D conversion units 821 without passing through the phase correction unit 813, there is a concern that erroneous determination of the count value in the A/D conversion units 821 occurs due to the variation in the phase difference (delay) between the clock signals of the multi-phase clock signals.

As described above, however, by applying the phase correction circuit 700 as the phase correction unit 813, the variation in the phase difference (delay) between the clock signals of the multi-phase clock signals is suppressed. Therefore, even when the clock generation unit 812 with the simple configuration illustrated in FIG. 30 is applied, it is possible to obtain the multi-phase clock signals with sufficient high precision (the variation in the phase difference (delay) between the clock signals is sufficiently small).

In other words, by applying the phase correction circuit 700 as the phase correction unit 813, the configuration of the clock generation unit 812 can be simplified, thereby preventing the circuit size or the cost from increasing.

[A/D Conversion Unit]

The phase correction unit 813 and the A/D conversion unit 814 illustrated in FIG. 29 may be integrated. That is, in FIG. 29, the A/D conversion unit 814 may include the phase correction unit 813. For example, the phase correction unit 813 and the A/D conversion unit 814 may be formed as a single independent device (for example, an A/D conversion device) (or as a single device in any unit such as a unit a module, a chip, or a block).

Likewise, the clock generation unit 812, the phase correction unit 813, and the A/D conversion unit 814 illustrated in FIG. 29 may be integrated. That is, in FIG. 29, the A/D conversion unit 814 may include the clock generation unit 812 and the phase correction unit 813. For example, the clock generation unit 812, the phase correction unit 813, and the A/D conversion unit 814 may be formed as a single independent device (for example, an A/D conversion device) (or as a single device in any unit such as a unit, a module, a chip, or a block).

By applying the phase correction circuit 700 as the phase correction unit 813 is the A/D conversion device with such a configuration, the high resolution of the A/D conversion can be realized easily.

That is, the A/D conversion device may include the clock generation unit 812 (phase-difference clock generation unit) that generates the multi-phase clock signals configured by the plurality of clock signals of which mutual phases are shifted, the phase correction unit 813 that uses the plurality of phase interpolators to correct the phase difference between the clock signals of the multi-phase clock signals generated by the clock generation unit 812, and the A/D conversion unit 814 (A/D conversion units 821) that performs the A/D conversion on an input analog signal based on the multi-phase clock signals corrected by the phase correction unit 813.

The phase interpolator may output an output signal at a timing delayed by a delay time of the phase interpolator from an intermediate timing of a phase difference of two input signals.

The clock generation unit 812 may generate 4-phase lock signals of which the phase difference is 45 degrees. The phase correction unit 813 may generate an intermediate-phase signal of two input signals of which the phase difference is 0 degrees by the phase interpolator at the first stage, generate an intermediate-phase signal of two input signals of which the phase difference is 90 degrees by the phase interpolator at the second stage, and generate an intermediate-phase signal of two input signals of which the phase difference is 45 degrees by the phase interpolator at the third stage.

The A/D conversion unit 821 may include the counter 603 that counts the number of periods of the clock signal and outputs the count value as a high-order bit, the comparator 601 that compares a reference voltage of a ramp waveform and an input voltage, and the latch & decoder 602 (time quantizer) that acquires phase information by simultaneously latching the multi-phase clock signals corrected by the phase correction unit using an inversion of the output of the comparison unit as a trigger, decodes the value of the phase information, and outputs the obtained digital value as a low-order bit with high resolution than the period of the clock signal.

[Image Sensor-2]

Figure 31:
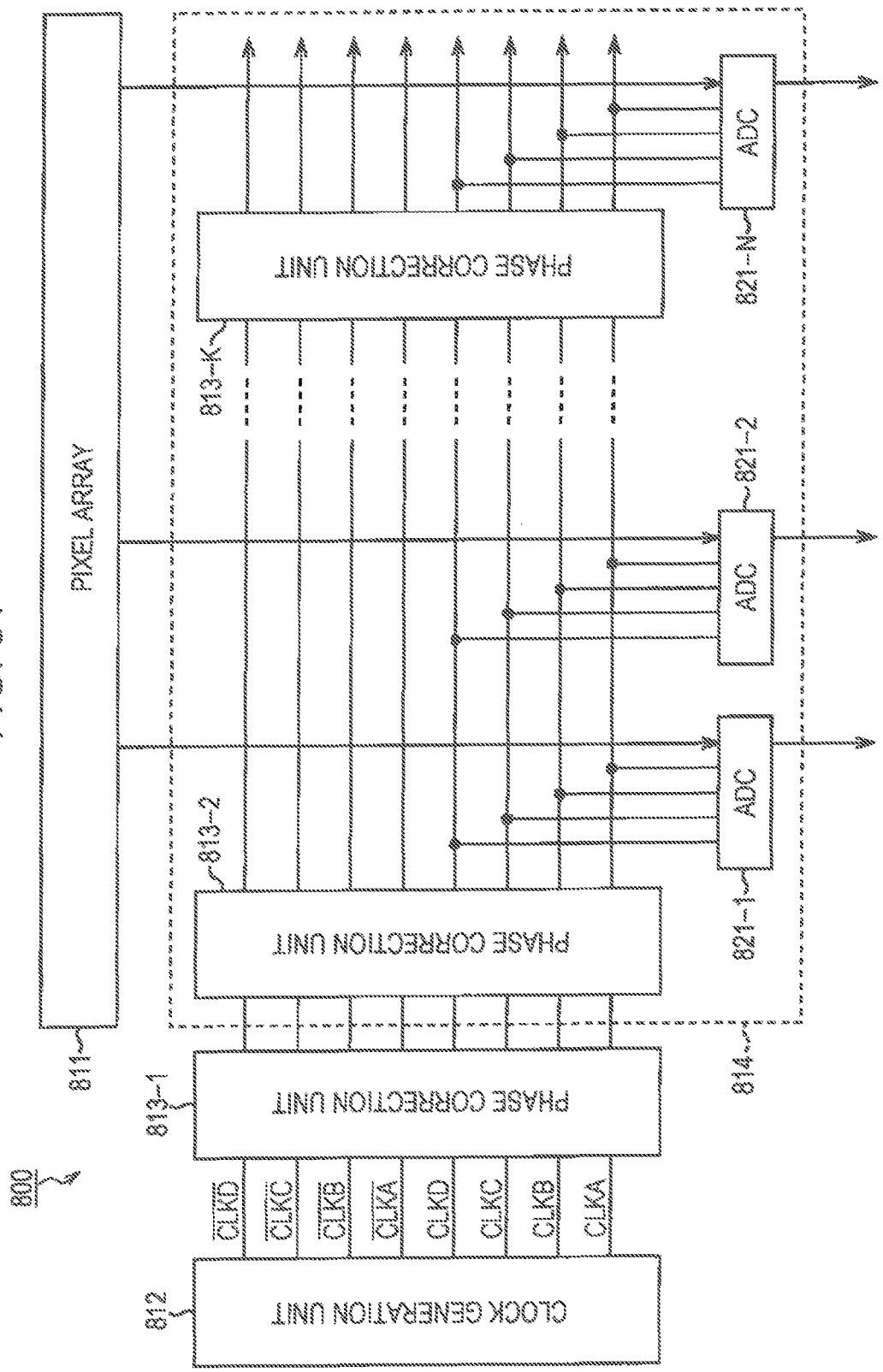
FIG. 31 is a diagram illustrating an example of a main configuration of an imaging element.

The phase correction circuit 700 may be applied as a clock buffer. FIG. 31 illustrates an example of a main configuration of an image sensor in this case. An image sensor 850 illustrated in FIG. 31 has basically the same configuration as the image sensor 800 (see FIG.

However, in the case of the image sensor 850, an A/D conversion unit 814 includes phase correction units 813 (a phase correction unit 813-2 to a phase correction unit 813-K (where K is an integer equal to or greater than 2)) instead of the clock buffers 822 (the clock buffer 822-1 to the clock buffer 822-M).

That is, for example, the phase correction unit 813 may be installed at intervals of a predetermined number of columns, and the A/D conversion unit 821 may perform A/D conversion using the multi-phase clock signal corrected by the phase correction unit 813 corresponding to the column corresponding to the A/D conversion unit 821.

Even in the case of this configuration, it is possible to obtain the same advantages as those in the case of FIG. 29.

The phase correction units 813 and the clock buffers 822 may be used together. That is, all of the clock buffers 822 (the clock buffer 822-1 to the clock buffer 822-M) of the A/D conversion unit 814 may not be substituted with the phase correction units 813 (the phase correction unit 813-2 to the phase correction unit 813-K), but some of the clock buffers 822 may be substituted with the phase correction units 813. For example, the multi-phase clock signals may be basically transmitted to the clock buffers 822 and the variation in the phase difference between the clock signals of the multi-phase clock signals may be configured to be reset by the phase correction unit 813 immediately before the variation in the phase difference increases and reaches an unallowable level.

[Other Configurations]

As in the above-described cases, the phase correction units 813 to which an embodiment of the present technology is applied can be applied to an imaging element including, for example, a plurality of semiconductor substrates (the semiconductor substrate 501 to the semiconductor substrate 502) superimposing each other, as illustrated in FIG. 22.

The phase correction units 813 to which an embodiment of the present technology is applied can be applied not only to an imaging element using the column A/D conversion units each installed at each column of the pixel array described above, similarly but also to an imaging element using an area A/D conversion unit that performs A/D conversion a pixel signal (analog signal) supplied from a unit pixel in an area (a partial region of a pixel region in which the pixel array 811 is formed) corresponding to the A/D conversion unit and outputs digital date indicating a signal level of each pixel signal, for example, as illustrated in FIG. 24.

When the phase correction units 813 are applied instead of the clock buffers 822 in the case of an imaging element using the area A/D conversion, the phase correction unit 813 may be installed at intervals of a predetermined number of partial regions and the A/D conversion unit 821 may perform A/D conversion using the multi-phase clock signal corrected by the phase correction unit 813 corresponding to the partial region corresponding to the A/D conversion unit 821.

11. Tenth Embodiment

[Imaging Device]

Figure 32:
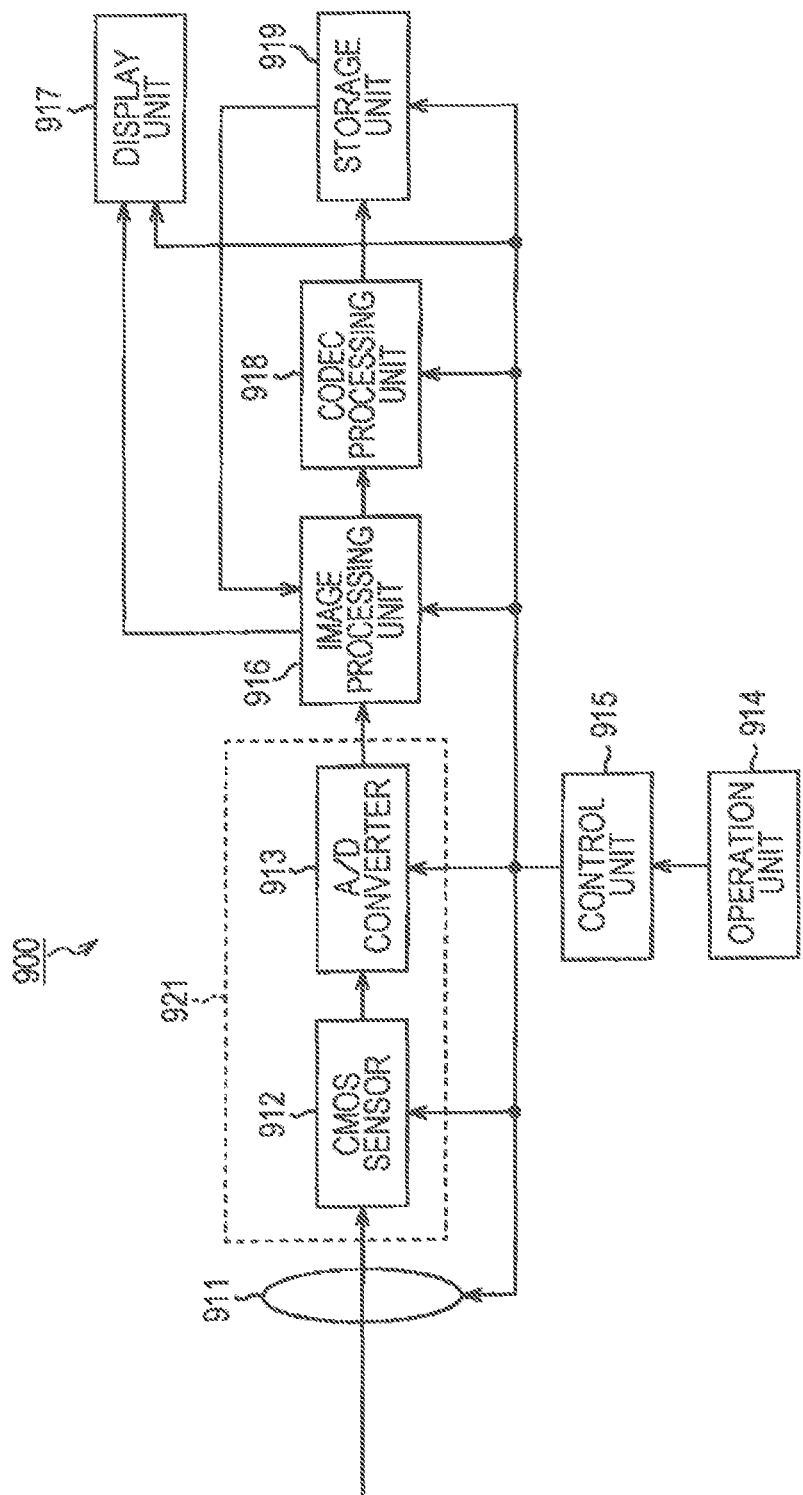
FIG. 32 is a diagram illustrating an example of a main configuration of an imaging device.

FIG. 32 is a block diagram illustrating an example of a main configuration of an imaging device which is an example of an electronic device to which the present technology is applied. An imaging device 900 illustrated in FIG. 32 is a device that images a subject and outputs an image of the subject as an electric signal.

As illustrated in FIG. 32, the imaging device 900 includes an optical unit 911, a CMOS sensor 912, an A/D converter 913, an operation unit 914, a control unit 915, an image processing unit 916, a display unit 917, a code processing unit 918 and a recording unit 919.

The optical unit 911 includes a lens that adjusts focusing of a subject and condenses light from a focused position, a diaphragm that adjusts exposure, and a shutter that controls a timing of imaging. The optical unit 911 allows light (incident light) from the subject to pass through and supplies the light to the CMOS sensor 912.

The CMOS sensor 912 photoelectrically converts the incident light and supplies a signal (pixel signal) of each pixel to the A/D converter 913.

The A/D converter 913 converts the pixel signal supplied from the CMOS sensor 912 at a predetermined timing into digital date (image data) and sequentially supplies the digital data to the image processing unit 916.

The CMOS sensor 912 and the A/D converter 913 may be integrated (formed as one module) and may be configured as an imaging element 921 (imaging unit).

The operation unit 914 includes, for example, a jog dial (trademark), a key, a button, or a touch panel, receives an operation input by a user, and supplies a signal corresponding to the operation input to the control unit 915.

The control unit 915 performs a process relevant to imaging of each unit by controlling driving of the optical unit 911, the CMOS sensor 912, the A/D converter 913, the image processing unit 916, the display unit 917, the code processing unit 918, and the recording unit 919 based on the signal corresponding to the operation input of the user input by the operation unit 914.

The image processing unit 916 performs image processing on the image data obtained by the imaging. More specifically, the image processing unit 916 performs various kinds of image processing, such as mixed color correction, black level correction, white balance adjustment, demosaic processing, matrix processing, gamma correction, and YC conversion, on the image data supplied from, the A/D converter 913 (imaging element 921). The image processing unit 916 supplies the image data subjected to the image processing to the display unit 917 and the code processing unit 918.

The display unit 917 is configured as, for example, a liquid crystal display and displays an image of a subject based on the image data supplied from the image processing unit 916.

The code processing unit 918 performs an encoding process of a predetermined scheme on the image data supplied from the image processing unit 916 and supplies obtained encoded data to the recording unit 919.

The recording unit 919 records the encoded data from the code processing unit 918. The encoded data recorded on the recording unit 919 is read and decoded by the image processing unit 916, as necessary. The image data obtained by the decoding process is supplied to the display unit 917 so that the corresponding image is displayed.

The above-described present technology is applied as the imaging element 921 including the CMOS sensor 912 and the A/D converter 913 of the foregoing imaging device 900. That is, the imaging element of the above-described embodiment is used as the imaging element 921. Thus, the imaging element 921 can achieve the high speed, the high resolution, or both thereof more easily. Accordingly, the imaging device 900 can obtain an image with higher quality by imaging a subject.

The imaging device to which the present technology is applied is not limited to the above-described configuration, but may have another configuration. For example, the imaging device may be an information processing device having an imaging function, such as a portable telephone, a smartphone, a tablet type device, or a personal computer, as well as a digital still camera or a video camera. The imaging device may also be a camera module mounted on another information processing device to be used (or mounted as an embedded device).

In the above description, the configuration described as one device (or processing unit) may be divided to be configured as a plurality of devices (or processing units). In contrast, the configurations described as the plurality of devices (or processing units) may be integrated to be configured as one device (or processing unit). Another configuration of the above-described configuration may, of course, be added to the configuration of each device (or each processing unit). Further, when the configurations or operations in the entire system are the same, a part of the configuration of a given device (or processing unit) may also be included in the configuration of another device (or another processing unit).

The preferred embodiments of the present technology have been described above with reference to the appended drawings, but the technical scope of the present technology is not limited to the example. It should be apparent by those skilled in the art of the present technology that various modifications and corrections may occur within the scope of the technical spirits and essences described in the claims and the modifications and the corrections are, of course, construed to pertain to the technical scope of the present technology.

The present technologies can be configured as follows.

(1) An A/D conversion device includes: a phase-difference clock generation unit configured to use a plurality of phase interpolators to generate multi-phase clock signals, of which phases are shifted with respect to an input clock signal, from the clock signal and a signal obtained by delaying the clock signal; and an A/D conversion unit configured to perform A/D conversion on an input analog signal using the multi-phase clock signals generated by the phase-difference clock generation unit.

(2) In the A/D conversion device described in any one of (1), (3), and (4), the phase-difference clock generation unit may include one delay circuit and four phase interpolators and generates 4-phase clock signals from the input clock signal.

(3) In the A/D conversion device described in any one of (1), (2), and (4), the phase interpolator may output an output signal at a timing delayed by a delay time of the phase interpolator from an intermediate timing of a phase difference of two input signals.

(4) In the A/D conversion device described in any one of (1) to (3), the A/D conversion unit may include a counter configured to count the number of periods of the clock signal and output a count value as a high-order bit, a comparison unit configured to compare a reference voltage of a ramp waveform and an input voltage, and a time quantization unit configured to acquire phase information by simultaneously latching the multi-phase clock signals generated by the phase-difference clock generation unit using an inversion of an output of the comparison unit as a trigger, decode values of the phase information, and output obtained digital values as low-order bits with higher resolution than a period of the clock signal.

(5) An imaging element includes: a pixel array configured such that unit pixels that each include a photoelectric conversion element photoelectrically converting incident light are arranged; a phase-difference clock generation unit configured to use a plurality of phase interpolators to generate multi-phase clock signals, of which phases are shifted with respect to an input clock signal, from the clock signal and a signal obtained by delaying the clock signal; and an A/D conversion unit configured to perform A/D conversion on an analog signal output from the unit pixel of the pixel array using the multi-phase clock signals generated by the phase-difference clock generation unit.

(6) In the imaging element described in any one of (5) and (7) to (9), the A/D conversion, unit may be installed at each column of the unit pixels of the pixel array and perform the A/D conversion on an analog signal output from the unit pixel of the column corresponding to the A/D conversion unit, using the multi-phase clock signal generated by the phase-difference clock generation unit.

(7) In the imaging element described in any one of (5), (6), (8), and (9), the phase-difference clock generation unit may be installed at intervals of a predetermined number of columns. The A/D conversion unit may perform the A/D conversion using the multi-phase clock signal generated by the phase-difference clock generation unit corresponding to the column corresponding to the A/D conversion unit.

(8) In the imaging element described in any one of (5) to (7) and (9), the A/D conversion unit may be installed at each partial region of the unit pixels of the pixel array and perform the A/D conversion on an analog signal output from the unit pixel of the partial region corresponding to the A/D conversion unit, using the multi-phase clock signal generated by the phase-difference clock generation unit.

(9) In the imaging element described in any one of (5) to (8), the phase-difference clock generation unit may be installed at intervals of a predetermined number of partial regions. The A/D conversion unit may perform the A/D conversion using the multi-phase clock signal generated by the phase-difference clock generation unit corresponding to the partial region corresponding to the A/D conversion unit.

(10) An electronic device includes: an imaging unit configured to image a subject; and an image processing unit configured to perform image processing on image data obtained through the imaging by the imaging unit. The imaging unit includes a pixel array in which unit pixels that each include a photoelectric conversion element photoelectrically converting incident light are arranged, a phase-difference clock generation unit configured to use a plurality of phase interpolators to generate multi-phase clock signals, of which phases are shifted with respect to an input clock signal, from the clock signal and a signal obtained by delaying the clock signal, and an A/D conversion unit configured to perform A/D conversion on an analog signal output from the unit pixel of the pixel array using the multi-phase clock signals generated by the phase-difference clock generation unit.

(11) A gray code generation device includes: a phase-difference clock generation unit configured to use a plurality of phase interpolators to generate multi-phase clock signals, of which phases are shifted with respect to an input clock signal, from the clock signal and a signal obtained by delaying the clock signal; and a gray code generation unit configured to use a plurality of phase interpolators and logic gates to generate gray codes from the multi-phase clock signals generated by the phase-difference clock generation unit.

(12) In the gray code generation device described in (11), the gray code generation unit may include a first gray code generation unit configured to generate a high-order gray code from one of the multi-phase clock signals generated by the phase-difference clock generation unit, and a second gray code generation unit configured to generate a low-order gray code from remainder of the multi-phase clock signals generated by the phase-difference clock generation unit.

(13) An A/D conversion device includes: a phase-difference clock generation unit configured to use a plurality of phase interpolators to generate multi-phase clock signals, of which phases are shifted with respect to an input clock signal, from the clock signal and a signal obtained by delaying the clock signal; a gray code generation, unit configured to use a plurality of phase interpolators and logic gates to generate gray codes from the multi-phase clock signals generated by the phase-difference clock generation unit: and an A/D conversion unit configured to perform A/D conversion on an input analog signal using the gray codes generated by the gray code generation unit.

(14) In the A/D conversion device described in (13), the A/D conversion unit may include a counter configured to count the number of periods of the clock signal and output a count value as a high-order bit, a comparison unit configured to compare a reference voltage of a ramp waveform and an input voltage, and a latch configured to simultaneously latch the gray codes generated by the gray code generation unit using an inversion of an output of the comparison unit as a trigger, convert the gray codes into binary values, and output obtained digital wines as low-order bits.

(15) An imaging element includes: a pixel array configured such that unit pixels that each include a photoelectric conversion element photoelectrically converting incident light are arranged; a phase-difference clock generation unit configured to use a plurality of phase interpolators to generate multi-phase clock signals, of which phases are shifted with respect to an input clock signal, from the clock signal and a signal obtained by delaying the clock signal; a gray code generation unit configured to use a plurality of phase interpolators and logic gates to generate gray codes from the multi-phase clock signals generated by the phase-difference clock generation unit; and an A/D conversion unit configured to perform A/D conversion on an analog signal output from the unit pixel of the pixel array using the gray codes generated by the gray code generation unit.

(16) In the imaging element described in any one of (15) and (17) to (19), the A/D conversion unit may be installed at each column of the unit pixels of the pixel array and perform the A/D conversion on an analog signal output from the unit pixel of the column corresponding to the A/D conversion unit, using the gray code generated by the gray code generation unit.

(17) In the imaging element described in any one of (15), (16), (18) and (19), the gray code generation unit may be installed at intervals of a predetermined number of columns. The A/D conversion unit may perform the A/D conversion using the gray code generated by the gray code generation unit corresponding to the column corresponding to the A/D conversion unit.

(18) In the imaging element described in any one of (15) to (17), and (19), the A/D conversion unit may be installed at each partial region of the unit pixels of the pixel array and perform the A/D conversion on an analog signal output from the unit pixel of the partial region corresponding to the A/D conversion unit, using the gray code generated by the gray code generation unit.

(19) In the imaging element described in any one of (15) to (18), the gray code generation unit may be installed at intervals of a predetermined number of partial regions. The A/D conversion unit may perform the A/D conversion using the gray code generated by the gray code generation unit corresponding to the partial region corresponding to the A/D conversion unit.

(20) An electronic device includes: an imaging unit configured to image a subject; and an image processing unit configured to perform image processing on image data obtained through the imaging by the imaging unit. The imaging unit includes a pixel array in which unit pixels that each include a photoelectric conversion element photoelectrically converting incident light are arranged, a phase-difference clock generation unit configured to use a plurality of phase interpolators to generate multi-phase clock signals, of which phases are shifted with respect to an input clock signal, from the clock signal and a signal obtained by delaying the clock signal, a gray code generation unit configured to use a plurality of phase interpolators and logic gates to generate gray codes from the multi-phase clock signals generated by the phase-difference clock generation unit, and an A/D conversion unit configured to perform A/D conversion on an analog signal output from the unit pixel of the pixel array using the gray code generated by the gray code generation unit.

(21) An A/D conversion device includes: a phase-difference clock generation unit configured to generate multi-phase clock signals formed from a plurality of clock signals of which phases are mutually shifted; a phase correction unit configured to use a plurality of phase interpolators to correct phase differences between clock signals of the multi-phase clock signals generated by the phase-difference clock generation unit and an A/D conversion unit configured to perform A/D conversion on an input analog signal using the multi-phase clock signals corrected by the phase correction unit.

(22) In the A/D conversion device described in (21), the phase interpolator may output an output signal at a timing delayed by a delay time of the phase interpolator from an intermediate timing of a phase difference of two input signals.

(23) In the A/D conversion device described in (21) or (22), the phase-difference clock generation unit may generate 4-phase clock signals of which a phase difference is 45 degrees. The phase correction unit may generate an intermediate-phase signal of two input signals of which the phase difference is 0 degrees by a first-stage phase interpolator, generate an intermediate-phase signal of two input signals of which the phase difference is 90 degrees by a second-stage phase interpolator, and generate an intermediate-phase signal of two input signals of which the phase difference is 45 degrees by a third-stage phase interpolator.

(24) In the A/D conversion device described in any one of (21) to (23), the A/D conversion unit may include a counter configured to count the number of periods of the clock signal and output a count value as a high-order bit, a comparison unit configured to compare a reference voltage of a ramp waveform and an input voltage, and a time quantization unit configured to acquire phase information by simultaneously latching the multi-phase clock signals corrected by the phase correction unit using an inversion of an output of the comparison unit as a trigger, decode values of the phase information, and output obtained digital values as low-order bits with higher resolution than a period of the clock signal.

(25) An imaging element includes: a pixel array configured such that unit pixels that each include a photoelectric conversion element photoelectrically converting incident light are arranged; a phase-difference clock generation unit configured to generate multi-phase clock signals formed from a plurality of clock signals of which phases are mutually shifted; a phase correction unit configured to use a plurality of phase interpolators to correct phase differences between clock signals of the multi-phase clock signals generated by the phase-difference clock generation unit; and an A/D conversion unit configured to perform A/D conversion on an analog signal output from the unit pixel of the pixel array using the multi-phase clock signals corrected by the phase correction unit.

(26) In the imaging element described in (25), the A/D conversion unit may be installed at each column of the unit pixels of the pixel array and perform the A/D conversion on an analog signal output from the unit pixel of the column corresponding to the A/D conversion unit, using the multi-phase clock signal corrected by the phase correction unit.

(27) In the imaging element described in (25) or (26), the phase correction unit may be installed at intervals of a predetermined number of columns. The A/D conversion unit may perform the A/D conversion using the multi-phase clock signal corrected by the phase correction unit corresponding to the column corresponding to the A/D conversion unit.

(28) In the imaging element described in any one of (25) to (27), the A/D conversion unit may be installed at each partial region of the unit pixels of the pixel array and perform the A/D conversion on an analog signal output from the unit pixel of the partial region corresponding to the A/D conversion unit, using the multi-phase clock signal corrected by the phase correction unit.

(29) In the imaging element described in (25) to (28), the phase correction unit may be installed at intervals of a predetermined number of partial regions. The A/D conversion unit may perform the A/D conversion using the multi-phase clock signal corrected by the phase correction unit corresponding to the partial region corresponding to the A/D conversion unit.

(30) An electronic device includes: an imaging unit configured to image a subject; and an image processing unit configured to perform image processing on image data obtained through the imaging by the imaging unit. The imaging unit includes a pixel array in which unit pixels that each include a photoelectric conversion element photoelectrically converting incident light are arranged, a phase-difference clock generation unit configured to generate multi-phase clock signals formed from a plurality of clock signals of which phases are mutually shifted, a phase correction unit configured to use a plurality of phase interpolators to correct phase differences between clock signals of the multi-phase clock signals generated by the phase-difference clock generation unit, and an A/D conversion unit configured to perform A/D conversion on an analog signal output from the unit pixel of the pixel array using the multi-phase clock signals corrected by the phase correction unit.

(31) A signal processing device includes a phase correction unit configured to use a plurality of phase interpolators to correct phase differences between clock signals of multi-phase clock signals formed from a plurality of clock signals of which phases are mutually shifted.

(32) In the signal processing device described in (31), the phase interpolator may output an output signal at a timing delayed by a delay time of the phase interpolator from an intermediate timing of a phase difference of two input signals.

(33) In the signal processing device described in (31) or (32), the multi-phase clock signals are 4-phase clock signals including a first clock signal to a fourth clock signal of which the mutual phase difference is 45 degrees.

(34) In the signal processing device described in any one of (31) to (33), the phase correction unit may generate an intermediate-phase signal of two input signals of which the phase difference is 0 degrees by a first-stage phase interpolator, generate an intermediate-phase signal of two input signals of which the phase difference is 90 degrees by a second-stage phase interpolator, and generate an intermediate-phase signal of two input signals of which the phase difference is 45 degrees by a third-stage phase interpolator.

(35) In the signal processing device described in any one of (31) to (34), the phase correction unit may include, as the first-stage phase interpolators, a 1st phase interpolator configured to generate an intermediate-phase signal of the first clock signal and NOT of an inverted signal of the first clock signal, a 2nd phase interpolator configured to generate an intermediate-phase signal of the second clock signal and NOT of an inverted signal of the second clock signal, a 3rd phase interpolator configured to generate an intermediate-phase signal of the third clock signal and NOT of an inverted signal of the third clock signal, a 4th phase interpolator configured to generate an intermediate-phase signal of the fourth clock signal and NOT of an inverted signal of the fourth clock signal, a 5th phase interpolator configured to generate an intermediate-phase signal of NOT of the first clock signal and the inverted signal of the first clock signal, a 6th phase interpolator configured to generate an intermediate-phase signal of NOT of the second clock signal and the inverted signal of the second clock signal, a 7th phase interpolator configured to generate an intermediate-phase signal of NOT of the third clock signal and the inverted signal of the third clock signal, and an 8th phase interpolator configured to generate NOT of the fourth clock signal and the inverted signal of the fourth clock signal. The phase correction unit may include, as the second-stage phase interpolators, a 9th phase interpolator configured to generate an intermediate-phase signal of an output of the 1st phase interpolator and an output of the 3rd phase interpolator, a 10th phase interpolator configured to generate an intermediate-phase signal of an output of the 2nd phase interpolator and an output of the 4th phase interpolator, an 11th phase interpolator configured to generate an intermediate-phase signal of the output of the 3rd phase interpolator and an output of the 5th phase interpolator, a 12th phase interpolator configured to generate an intermediate-phase signal of the output of the 4th phase interpolator and an output of the 6th phase interpolator, a 13th phase interpolator configured to generate an intermediate-phase signal of the output of the 5th phase interpolator and an output of the 7th phase interpolator, a 14th phase interpolator configured to generate an intermediate-phase signal of the output of the 6th phase interpolator and an output of the 8th phase interpolator, a 15th phase interpolator configured to generate an intermediate-phase signal of the output of the 7th phase interpolator and the output of the 1st phase interpolator, and a 16th phase interpolator configured to generate an intermediate-phase signal of the output of the 8th phase interpolator and the output of the 2nd phase interpolator. The phase correction unit may include, as the third-stage phase interpolators, a 17th phase interpolator configured to generate an intermediate-phase signal of an output of the 9th phase interpolator and an output of the 10th phase interpolator, an 18th phase interpolator configured to generate an intermediate-phase signal of the output of the 10th phase interpolator and an output of the 11th phase interpolator, a 19th phase interpolator configured to generate an intermediate-phase signal of the output of the 11th phase interpolator and an output of the 12th phase interpolator, a 20th phase interpolator configured to generate an intermediate-phase signal of the output of the 12th phase interpolator and an output of the 13th phase interpolator, a 21st phase interpolator configured to generate an intermediate-phase signal of the output of the 13th phase interpolator and an output of the 14th phase interpolator, a 22nd phase interpolator configured to generate an intermediate-phase signal of the output of the 14th phase interpolator and an output of the 15th phase interpolator, a 23rd phase interpolator configured to generate an intermediate-phase signal of the output of the 15th phase interpolator and an output of the 16th phase interpolator, and a 24th phase interpolator configured to generate an intermediate-phase signal of the output of the 16th phase interpolator and the output of the 1st phase interpolator.

(35) An analog to digital (A/D) conversion device which includes a phase-difference clock generation unit configured to use a plurality of phase interpolators to generate multi-phase clock signals, of which phases are shifted with respect to an input clock signal, from the input clock signal and a signal obtained by delaying the input clock signal; and an A/D conversion unit configured to convert an input analog signal using the multi-phase clock signals generated by the phase-difference clock generation unit.

(36) The A/D conversion device according to (35), wherein the phase-difference clock generation unit includes a delay circuit and a number of phase interpolators, and the phase-difference clock generation unit is configured to generate, based on the input clock signal, a number of phase clock signals corresponding to the number of phase interpolators.

(37) The A/D conversion device according to (36), wherein a phase interpolator of the number of phase interpolators is configured to output an output signal having a delay based on a phase difference between two input signals.

(38) The A/D conversion device according to any one of (35)-(36), wherein based on the input clock signal and a delayed input clock signal, the phase of each multi-phase clock signal is shifted with respect to the input clock signal.

(39) The A/D conversion device according to any one of (35)-(38), wherein the A/D conversion unit includes: a comparison unit configured to compare a reference voltage of a ramp waveform and an input voltage; and a time quantization unit configured to acquire phase information by latching the multi-phase clock signals generated by the phase-difference clock generation unit based on an inversion of an output of the comparison, unit, decode values of the phase information, and output obtained digital values at a resolution greater than a period of the input clock signal.

(40) The A/D conversion device according to (39), wherein the A/D conversion unit further includes a counter configured to count a number of periods of the input clock signal and output a count value as a high order bit, wherein the obtained digital values are output as lower order bits.

(41) An imaging element which includes a pixel array including a plurality of unit pixels, wherein each unit pixel of the plurality of unit pixels includes a photoelectric conversion element configured to photoelectrically convert incident light; a phase-difference clock generation unit configured to use a plurality of phase interpolators to generate multi-phase clock signals, of which phases are shifted with respect to an input clock signal, from the input clock signal and a signal obtained by delaying the input clock signal; and an analog to digital (A/D) conversion unit configured to convert an analog signal output from the unit pixel of the pixel array using the multi-phase clock signals generated by the phase-difference clock generation unit.

(42) The imaging element according to (41), wherein each column or partial region of the unit pixels of the pixel array includes an A/D conversion unit configured to convert an analog signal output from the unit pixel of the column or the partial region corresponding to the A/D conversion unit to a digital output signal using the multi-phase clock signals generated by the phase-difference clock generation unit.

(43) The imaging element according to (42), wherein a predetermined number of columns or partial regions includes a phase-difference clock generation unit, and wherein the A/D conversion unit performs the A/D conversion using the multi-phase clock signals generated by the phase-difference clock generation unit corresponding to the column or the partial region corresponding to the A/D conversion unit.

(44) The imaging element according to any one of (40)-(43), wherein based on the input clock signal and a delayed input clock signal, the phase of each multi-phase clock signal is shifted with respect to the input clock signal.

(45) An electronic device which includes: an imaging unit configured to image a subject; and an image processing unit configured to perform image processing on image data obtained by the imaging unit, wherein the imaging unit includes: a pixel array including a plurality of unit pixels, wherein each unit pixel of the plurality of unit pixels includes a photoelectric conversion element configured to photoelectrically convert incident light; a phase-difference clock generation unit configured to use a plurality of phase interpolators to generate multi-phase clock signals, of which phases are shifted with respect to an input clock signal, from the input clock signal and a signal obtained by delaying the input clock signal, and an analog to digital (A/D) conversion unit configured to convert an analog signal output from the unit pixel of the pixel array using the multi-phase clock signals generated by the phase-difference clock generation unit.

(46) A gray code generation device which includes: a phase-difference clock generation unit configured to use a plurality of phase interpolators to generate multi-phase clock signals, of which phases are shifted with respect to an input clock signal, from the input clock signal and a signal obtained by delaying the input clock signal; and a gray code generation unit configured to use a plurality of phase interpolators and logic gates to generate gray codes from the multi-phase clock signals generated by the phase-difference clock generation unit.

(47) The gray code generation device according to (46), wherein the gray code generation unit includes: a first gray code generation unit configured to generate a high-order gray code from one of the multi-phase clock signals generated by the phase-difference clock generation unit, and a second gray code generation unit configured to generate a low-order gray code from a remainder of the multi-phase clock signals generated by the phase-difference clock generation unit.

(48) An analog to digital (A/D) conversion device including:
a phase-difference clock generation unit configured to use a plurality of phase interpolators to generate multi-phase clock signals, of which phases are shifted with respect to an input clock signal, from the input clock signal and a signal obtained by delaying the input clock signal; a gray code generation unit configured to use a plurality of phase interpolators and logic gates to generate gray codes from the multi-phase clock signals generated by the phase-difference clock generation unit; and
an A/D conversion unit configured to convert an input analog signal using the gray codes generated by the gray code generation unit.

(49) The A/D conversion device according to (48), wherein the A/D conversion unit includes: a comparison unit configured to compare a reference voltage of a ramp waveform and an input voltage; and a latch configured to latch the gray codes generated by the gray code generation unit using an inversion of an output of the comparison unit, convert the gray codes into binary values, and output obtained digital values.

(50) The A/D conversion device according to (48), wherein the A/D conversion unit further includes a counter configured to count a number of periods of the input clock signal and output a count value as a high order bit, wherein the obtained digital values are output as lower order bits.

(51) An imaging element which includes: a pixel array including a pixel array including a plurality of unit pixels, wherein each unit pixel of the plurality of unit pixels includes a photoelectric conversion element configured to photoelectrically convert incident light; a phase-difference clock generation unit configured to use a plurality of phase interpolators to generate multi-phase clock signals, of which phases are shifted with respect to an input clock signal, from the input clock signal and a signal obtained by delaying the input clock signal; a gray code generation unit configured, to use a plurality of phase interpolators and logic gates to generate gray codes from the multi-phase clock signals generated by the phase-difference clock generation unit; and
an analog to digital (A/D) conversion unit configured to convert an analog signal output from the unit pixel of the pixel array using the gray codes generated by the gray code generation unit.

(52) The imaging element according to (51), wherein each column or each partial region of the unit pixels of the pixel array includes an A/D conversion unit configured to convert an analog signal output from the unit pixel of the column or the partial region corresponding to the A/D conversion unit using a gray code generated by the gray code generation unit.

(53) The imaging element according to any one of (51)-(52), wherein a predetermined number of columns or partial regions include the gray code generation unit, and wherein the A/D conversion unit performs an A/D conversion using the gray code generated by the gray code generation unit corresponding to the column or the partial region corresponding to the A/D conversion unit,

(54) An electronic device including: an imaging unit configured to image a subject; and an image processing unit configured to perform image processing on image date obtained through the imaging by the imaging unit, wherein the imaging unit includes: a pixel array including a plurality of unit pixels, wherein each unit pixel of the plurality of unit pixels includes a photoelectric conversion element configured to photoelectrically converting incident light; a phase-difference clock generation unit configured to use a plurality of phase interpolators to generate multi-phase clock signals, of which phases are shifted with respect to an input clock signal, from the input clock signal and a signal obtained by delaying the input clock signal, a gray code generation unit configured to use a plurality of phase interpolators and logic gates to generate gray codes from the multi-phase clock signals generated by the phase-difference clock generation unit; and an A/D conversion unit configured to convert an analog signal output from the unit pixel of the pixel array using the gray codes generated by the gray code generation unit.

(55) An analog to digital (A/D) conversion device which includes: a phase-difference clock generation unit configured to generate multi-phase clock signals formed from a plurality of clock signals of which phases are mutually shifted;
a phase correction unit configured to use a plurality of phase interpolators to correct phase differences between clock signals of the multi-phase clock signals generated by the phase-difference clock generation unit; and an A/D conversion unit configured to convert an input analog signal using the multi-phase clock signals corrected by the phase correction unit.

(56) An imaging element including; a pixel array including a plurality of unit pixels, wherein each unit pixel of the plurality of unit pixels includes a photoelectric conversion element configured to photoelectrically convert incident light; a phase-difference clock generation unit configured to generate multi-phase clock signals based on a plurality of clock signals of which phases are mutually shifted; a phase correction unit configured to use a plurality of phase interpolators to correct phase differences between clock signals of the multi-phase clock signals generated by the phase-difference clock generation unit; and an A/D conversion unit configured to convert an analog signal output from the unit pixel of the pixel array using the multi-phase clock signals corrected by the phase correction unit.

(57) An electronic device which includes: an imaging unit configured to image a subject; and an image processing unit configured to perform image processing on image data obtained through the imaging of the subject by the imaging unit,
wherein the imaging unit includes: a pixel array including a plurality of unit pixels,
wherein each unit pixel of the plurality of unit pixels includes a photoelectric conversion element configured to photoelectrically converting incident light; a phase-difference clock generation unit configured to generate multi-phase clock signals based on a plurality of clock signals of which phases are mutually shifted; a phase correction unit configured to use a plurality of phase interpolators to correct phase differences between clock signals of the multi-phase clock signals generated by the phase-difference clock generation unit; and an analog to digital (A/D) conversion unit configured to convert an analog signal output from the unit pixel of the pixel array using the multi-phase clock signals corrected by the phase correction unit.

(58) A signal processing device which includes a phase correction unit configured to use a plurality of phase interpolators to correct phase differences between clock signals of multi-phase clock signals formed from a plurality of clock signals, wherein the plurality of clock signals include clock signals having phases which are mutually shifted.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 100 4-phase clock generation circuit
101 Delay circuit
102 Phase interpolator
200 High-resolution gray code generation circuit
201 4-phase clock generation circuit
202 Gray code generation circuit
211, 212 Phase interpolator
221 8-phase clock generation circuit
222 16-phase clock generation circuit
223, 224 Gray code generation circuit
230 High-resolution gray code generation circuit
231 Phase-difference clock generation circuit
232 Gray code generation circuit
233 Additional gray code generation circuit
241 4-phase clock generation circuit
242 Phase interpolator
300 A/D conversion circuit
301 High-resolution gray code generation circuit
302 Comparison circuit
303 Latch
304 Ripple counter
320 Imaging element
321 Pixel array
322 A/D conversion circuit
323 Horizontal scanning unit
324 PLL
325 Ramp generation circuit
331 High-resolution gray code generation circuit
332 Column A/D conversion circuit
342 Comparison circuit
343 Latch
344 Ripple counter
351 Buffer
352 Horizontal transmission scanning circuit
353 Transmission bus
354 Sense amplifier
361 Unit pixel
371 Photodiode
376 Vertical signal line
400 A/D conversion circuit
401 4-phase clock generation circuit
402 Comparison circuit
403 TDC
404 Ripple counter
420 Imaging element
421 Pixel array
422 A/D conversion circuit
423 Horizontal scanning unit
424 PLL
425 Ramp generation circuit
431 4-phase clock generation circuit
432 Column A/D conversion circuit
442 Comparison circuit
443 TDC
444 Ripple counter
451 Buffer
452 Horizontal transmission scanning circuit
453 Transmission bus
454 Sense amplifier
500 Imaging element
501 Semiconductor substrate
502 Semiconductor substrate
511 Pixel region
512 Peripheral circuit region
522 A/D conversion circuit
524 PLL
531 High-resolution gray code generation circuit
532 Area A/D conversion circuit
561 4-phase clock generation circuit
562 Area A/D conversion circuit
600 A/D converter
601 Comparator
602 Latch & decoder
603 Counter
700 Phase correction circuit
711 to 713 Phase interpolator
800 Image sensor
811 Pixel array
812 Clock generator
813 Phase correction unit
814 A/D conversion unit
821 A/D conversion unit
822 Clock buffer
831 to 838 Delay element
850 Image sensor
900 Imaging device
912 CMOS sensor
913 A/D converter
921 Imaging element

The invention claimed is:

1. An analog to digital (A/D) conversion device, comprising:
first circuitry configured to generate a delayed input clock signal based on a first delay in an input clock signal;
a plurality of phase interpolators configured to generate a plurality of multi-phase clock signals with a second delay, based on the input clock signal and the delayed input clock signal, wherein
each of the generated plurality of multi-phase clock signals has a phase shift with respect to the input clock signal, and
the second delay is based on a phase difference between the input clock signal and the delayed input clock signal; and
second circuitry configured to convert an input analog signal based on the generated plurality of multi-phase clock signals.

2. The A/D conversion device according to claim 1, wherein the first circuitry is further configured to generate, based on the input clock signal, a plurality of phase clock signals corresponding to the plurality of phase interpolators.

3. The A/D conversion device according to claim 1, wherein the phase shift of each of the generated plurality of multi-phase clock signals is based on the input clock signal and the delayed input clock signal.

4. The A/D conversion device according to claim 1, wherein the second circuitry is further configured to:

compare a reference voltage of a ramp waveform and an input voltage;

acquire phase information based on a latch of the generated plurality of multi-phase clock signals and an inversion of an output of the comparison of the reference voltage and the input voltage;

decode values of the phase information to obtain digital values; and output the obtained digital values at a resolution greater than a period of the input clock signal.

5. The A/D conversion device according to claim 4, further comprising a counter configured to:

count a number of periods of the input clock signal; and output, based on the count of the number of periods, a count value as a high order bit, wherein the second circuitry is further configured to output the obtained digital values as lower order bits.

6. An imaging element, comprising:

a pixel array including a plurality of unit pixels, wherein each unit pixel of the plurality of unit pixels includes a photoelectric conversion element configured to photoelectrically convert incident light;

first circuitry configured to generate a delayed input clock signal based on a delay in an input clock signal;

a plurality of phase interpolators configured to generate a plurality of multi-phase clock signals with a second delay, based on the input clock signal and the delayed input clock signal, wherein each of the generated plurality of multi-phase clock signals has a phase shift with respect to the input clock signal, and the second delay is based on a phase difference between the input clock signal and the delayed input clock signal; and second circuitry configured to convert, based on the generated plurality of multi-phase clock signals, a first analog signal output from a first unit pixel of the plurality of unit pixels.

7. The imaging element according to claim 6, wherein one of each column of the plurality of unit pixels or a partial region of the plurality of unit pixels includes the second circuitry, the second circuitry is further configured to convert a second analog signal, output from a second unit pixel of one of a column of the plurality of unit pixels or the partial region, to a digital output signal, and the conversion of the second analog signal to the digital output signal is based on the generated plurality of multi-phase clock signals.

8. The imaging element according to claim 7, wherein one of a specific number of columns of the plurality of unit pixels or a specific number of partial regions of the plurality of unit pixels includes the first circuitry, and the second circuitry is further configured to convert the second analog signal based on the generated plurality of multi-phase clock signals generated by the first circuitry corresponding to one of the specific number of columns of the plurality of unit pixels or the specific number of partial regions of the plurality of unit pixels.

9. The imaging element according to claim 6, wherein the phase shift of each of the generated plurality of multi-phase clock signals is based on the input clock signal and the delayed input clock signal.

10. An electronic device, comprising:

an imaging sensor configured to image a subject to obtain image data; and an image processing unit configured to process the image data obtained by the imaging sensor, wherein the imaging sensor includes:

a pixel array including a plurality of unit pixels, wherein each unit pixel of the plurality of unit pixels includes a photoelectric conversion element configured to photoelectrically convert incident light;

first circuitry configured to generate a delayed input clock signal based on a delay in an input clock signal;

a plurality of phase interpolators configured to generate a plurality of multi-phase clock signals with a second delay, based on the input clock signal and the delayed input clock signal, wherein each of the generated multi-phase clock signals has a phase shift with respect to the input clock signal, and the second delay is based on a phase difference between the input clock signal and the delayed input clock signal; and second circuitry configured to convert, based on the generated plurality of multi-phase clock signals, an analog signal output from a unit pixel of the plurality of unit pixels.

* * * * *